US009673043B2

(12) United States Patent
Noda et al.

(10) Patent No.: US 9,673,043 B2
(45) Date of Patent: Jun. 6, 2017

(54) METHOD OF MANUFACTURING SEMICONDUCTOR DEVICE, SUBSTRATE PROCESSING APPARATUS, SUBSTRATE PROCESSING SYSTEM AND RECORDING MEDIUM

(71) Applicant: HITACHI KOKUSAI ELECTRIC INC., Tokyo (JP)

(72) Inventors: Takaaki Noda, Toyama (JP); Shingo Nohara, Toyama (JP); Satoshi Shimamoto, Toyama (JP); Hiroshi Ashihara, Toyama (JP); Takeo Hanashima, Toyama (JP); Yoshiro Hirose, Toyama (JP); Tsukasa Kamakura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/084,847

(22) Filed: Mar. 30, 2016

(65) Prior Publication Data
US 2016/0211135 A1    Jul. 21, 2016

Related U.S. Application Data

(63) Continuation of application No. PCT/JP2013/076571, filed on Sep. 30, 2013.

(51) Int. Cl.
*H01L 21/469* (2006.01)
*H01L 21/02* (2006.01)
(Continued)

(52) U.S. Cl.
CPC .......... *H01L 21/0228* (2013.01); *C23C 16/30* (2013.01); *C23C 16/401* (2013.01);
(Continued)

(58) Field of Classification Search
None
See application file for complete search history.

(56) References Cited

U.S. PATENT DOCUMENTS 8,329,599 B2    12/2012  Fukazawa et al.
2002/0018849 A1*  2/2002  George ................ C23C 16/402
                                            427/255.27
(Continued)

FOREIGN PATENT DOCUMENTS

JP    2004-040110 A    2/2004
JP    2007-158066 A    6/2007
(Continued)

OTHER PUBLICATIONS

Japanese Office Action Dated Sep. 30, 2015 for Japanese Application No. 2014-025790.

*Primary Examiner* — Benjamin Sandvik
*Assistant Examiner* — Herve Assouman
(74) *Attorney, Agent, or Firm* — Volpe and Koenig, P.C.

(57) ABSTRACT

There is provided a technique including: (a) forming a thin film containing a predetermined element, oxygen and carbon on a substrate by performing a cycle a predetermined number of times, the cycle including: (a-1) supplying a source gas containing the predetermined element, carbon and a halogen element having a chemical bond between the predetermined element and carbon to the substrate; (a-2) supplying an oxidizing gas to the substrate; and (a-3) supplying a catalytic gas to the substrate; (b) removing a first impurity from the thin film by thermally processing the thin film at a first temperature higher than a temperature of the substrate in (a); and (c) removing a second impurity different from the first impurity from the thin film by thermally processing the thin film at a second temperature equal to or higher than the first temperature after performing (b).

13 Claims, 33 Drawing Sheets

(51) Int. Cl.
    *C23C 16/30*         (2006.01)
    *C23C 16/40*         (2006.01)
    *C23C 16/455*       (2006.01)
    *C23C 16/52*         (2006.01)

(52) U.S. Cl.
    CPC .. C23C 16/45534 (2013.01); C23C 16/45536 (2013.01); C23C 16/45544 (2013.01); C23C 16/52 (2013.01); H01L 21/022 (2013.01); H01L 21/02126 (2013.01); H01L 21/02164 (2013.01); H01L 21/02208 (2013.01); H01L 21/02211 (2013.01); H01L 21/02318 (2013.01)

(56) References Cited

U.S. PATENT DOCUMENTS

| | | | |
|---|---|---|---|
| 2002/0160585 A1* | 10/2002 | Park | C23C 16/45531 438/507 |
| 2003/0170605 A1* | 9/2003 | Long | B43L 1/12 434/410 |
| 2004/0018694 A1 | 1/2004 | Lee et al. | |
| 2006/0166414 A1* | 7/2006 | Carlson | H01L 21/02381 438/149 |
| 2006/0199384 A1* | 9/2006 | Ando | C23C 16/401 438/680 |
| 2008/0241358 A1* | 10/2008 | Joe | C23C 16/345 427/96.8 |

FOREIGN PATENT DOCUMENTS

| | | |
|---|---|---|
| JP | 2008-071894 A | 3/2008 |
| JP | 2011-108737 A | 6/2011 |

\* cited by examiner

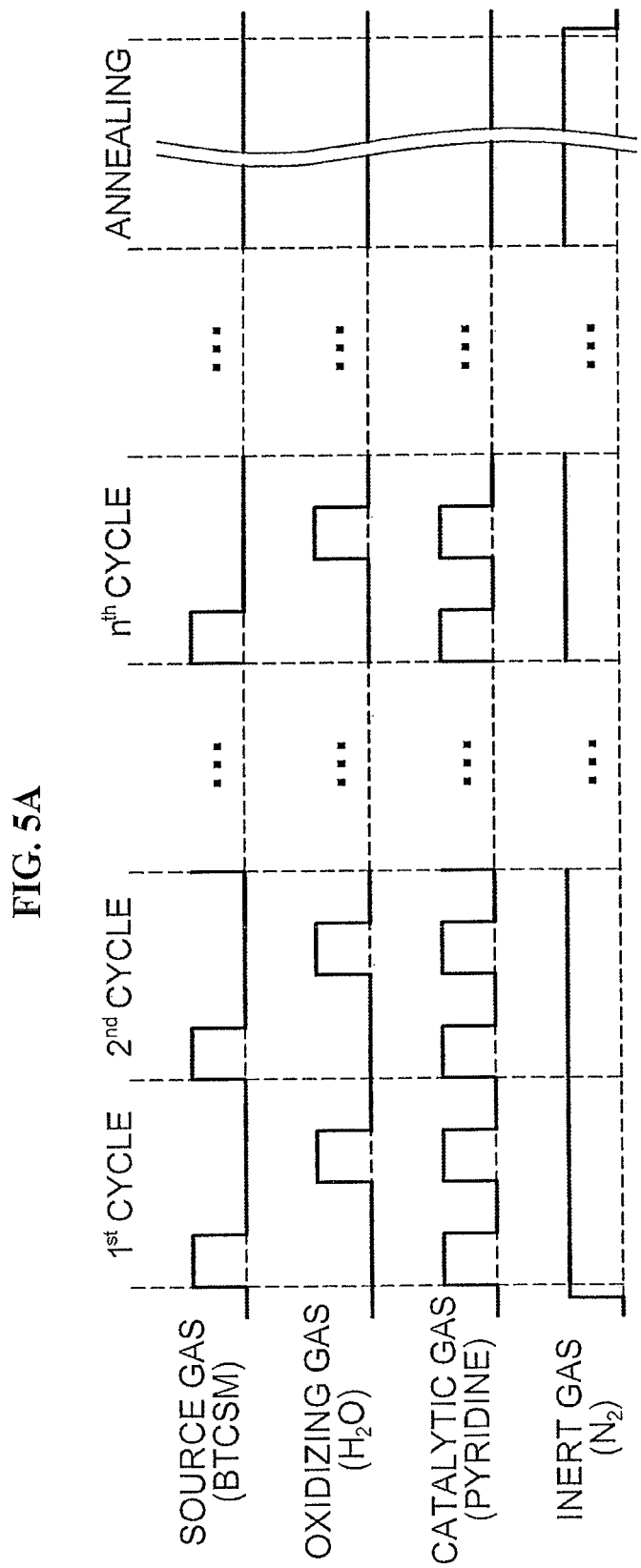

| NAME | PYRIDINE | AMINOPYRIDINE | PICOLINE | LUTIDINE | PIPERAZINE | PIPERIDINE |
|---|---|---|---|---|---|---|
| COMPOSITION FORMULA | $C_5H_5N$ | $C_5H_6N_2$ | $C_6H_7N$ | $C_7H_9N$ | $C_4H_{10}N_2$ | $C_5H_{11}N$ |
| STRUCTURAL FORMULA |  |  |  |  |  |  |
| ACID DISSOCIATION CONSTANT (pKa) | 5.67 | 6.89 | 6.07 | 6.96 | 9.80 | 11.12 |

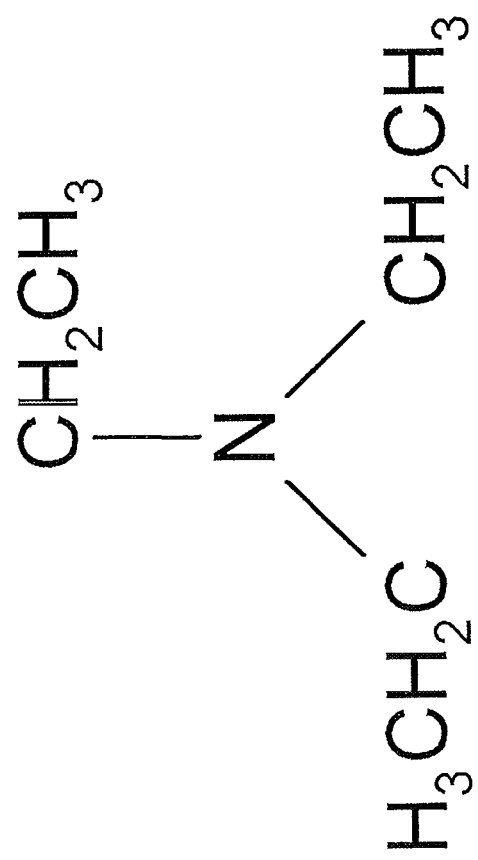

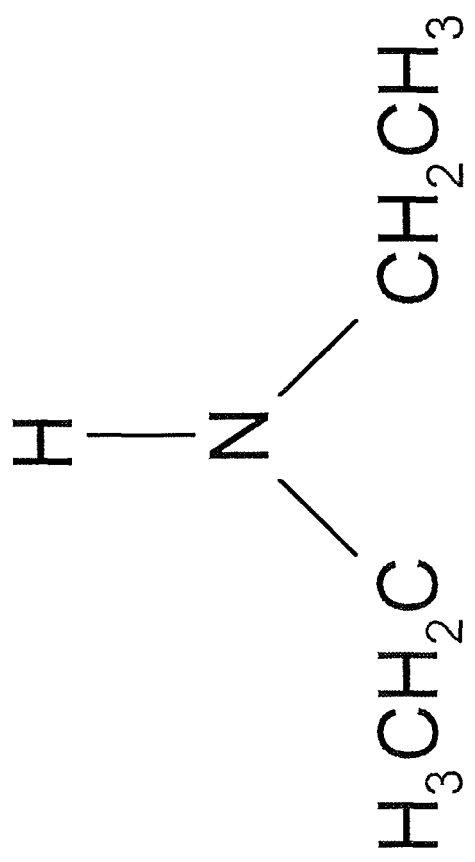

MONOMETHYLAMINE (MMA)
ACID DISSOCIATION CONSTANT (pKa) 10.6

FIG. 18

|  | FIRST SAMPLE | SECOND SAMPLE |
|---|---|---|
| WER[Å/min] @1%/DHF | 0.56 | 9.69 |
| SHRINK RATE [%] | 15.2 | 16.8 |
| K VALUE | 2.68 | 3.58 |

METHOD OF MANUFACTURING SEMICONDUCTOR DEVICE, SUBSTRATE PROCESSING APPARATUS, SUBSTRATE PROCESSING SYSTEM AND RECORDING MEDIUM

CROSS-REFERENCE TO RELATED PATENT APPLICATION

This non-provisional U.S. patent application claims priority under 35 U.S.C. §119 of PCT/JP2013/076571, filed on Sep. 30, 2013, the entire contents of which are hereby incorporated by reference.

BACKGROUND OF THE INVENTION

1. Field of the Invention

The present invention relates to a method of manufacturing a semiconductor device, a substrate processing apparatus, a substrate processing system and a recording medium.

2. Description of the Related Art

As one of processes of manufacturing a semiconductor device, a thin film such as a silicon oxide film and the like may be formed on a substrate by supplying a source gas containing a predetermined element such as silicon and the like and an oxidizing gas to the substrate. For example, when the thin film is formed using a catalytic gas, it is possible to form a film at a relatively low temperature, and thus thermal history and the like acting on the semiconductor device can be improved.

SUMMARY OF THE INVENTION

Also, when a thin film containing carbon and the like is formed on a substrate, it is possible to improve quality of the film, for example, improvement of resistance to wet etching, reduction of a dielectric constant of the film and the like.

However, at a relatively low temperature, it is difficult for a sufficient amount of carbon to be added to the film or an impurity such as moisture is possible to be mixed into the film. Therefore, there is a problem in that the thin film having sufficient etching resistance and a low dielectric constant may not be formed.

The present invention provides a method of manufacturing a semiconductor device in which a thin film having high etching resistance and a low dielectric constant is formed, a substrate processing apparatus, a substrate processing system and a non-transitory computer-readable recording medium.

According to an aspect of the present invention, there is provided a technique including: (a) forming a thin film containing a predetermined element, oxygen and carbon on a substrate by performing a cycle a predetermined number of times, the cycle including: (a-1) supplying a source gas containing the predetermined element, carbon and a halogen element having a chemical bond between the predetermined element and carbon to the substrate; (a-2) supplying an oxidizing gas to the substrate; and (a-3) supplying a catalytic gas to the substrate; (b) removing a first impurity from the thin film by thermally processing the thin film at a first temperature higher than a temperature of the substrate in (a); and (c) removing a second impurity different from the first impurity from the thin film by thermally processing the thin film at a second temperature equal to or higher than the first temperature after performing (b).

BRIEF DESCRIPTION OF THE DRAWINGS

FIGS. 5A and 5B are diagrams illustrating gas supply timing in film-forming sequences according to the first embodiment of the present invention and modification thereof, where FIG. 5A is a diagram illustrating an example of the sequence of the first embodiment, and FIG. 5B is a diagram illustrating an example of the sequence of the modification.

FIG. 6A is a diagram illustrating the catalysis reaction in step S1$a$, and FIG. 6B is a diagram illustrating the catalysis reaction in step S2$a$.

FIG. 7A is a flowchart illustrating an SiOC film forming process, and FIG. 7B is a flowchart illustrating an SiOC film modifying process.

FIG. 9A is a diagram illustrating an example of the sequence of the second embodiment, FIG. 9B is a diagram illustrating an example of a sequence of a first modification, and FIG. 9C is a diagram illustrating an example of a sequence of a second modification.

FIG. 11A is a diagram illustrating an example of a sequence in which a stacked film is formed, and FIG. 11B is a diagram illustrating an example of a sequence in which a laminated film is formed.

FIG. 13A is a diagram illustrating an example of the sequence in which a stacked film is formed, and FIG. 13B is a diagram illustrating an example of the sequence in which a laminated film is formed.

FIGS. 15A through 15F are diagrams illustrating names, chemical composition formulas, chemical structural formulas and acid dissociation constants of various kinds of amine used as a catalytic gas, and are diagrams illustrating names, chemical composition formulas, chemical structural formulas and acid dissociation constants of ring-shaped amine, TEA, DEA, MEA, TMA and MMA.

FIG. 16A is a graph illustrating a relative dielectric constant of an SiOC film before and after thermal processing, FIG. 16B is a graph illustrating a wet etching rate of the SiOC film before and after the thermal processing, and FIG. 16C is a graph illustrating a temperature dependence of the thermal processing process of the wet etching rate of the SiOC film.

FIG. 17A is a graph illustrating the desorption spectrum of $H_2O$, FIG. 17B is a graph illustrating the desorption spectrum of Cl, and FIG. 17C is a graph illustrating the desorption spectrum of $C_2H_2$.

FIG. 18 is a diagram illustrating evaluation results of the embodiments of the present invention, and is a summary table of various characteristics of an SiOC film of a first sample and an SiOC film of a second sample.

DETAILED DESCRIPTION OF THE PREFERRED EMBODIMENTS

First Embodiment

Hereinafter, a first embodiment of the present invention will be described with reference to the drawings.

(1) Overall Configuration of Substrate Processing Apparatus

Figure 1:
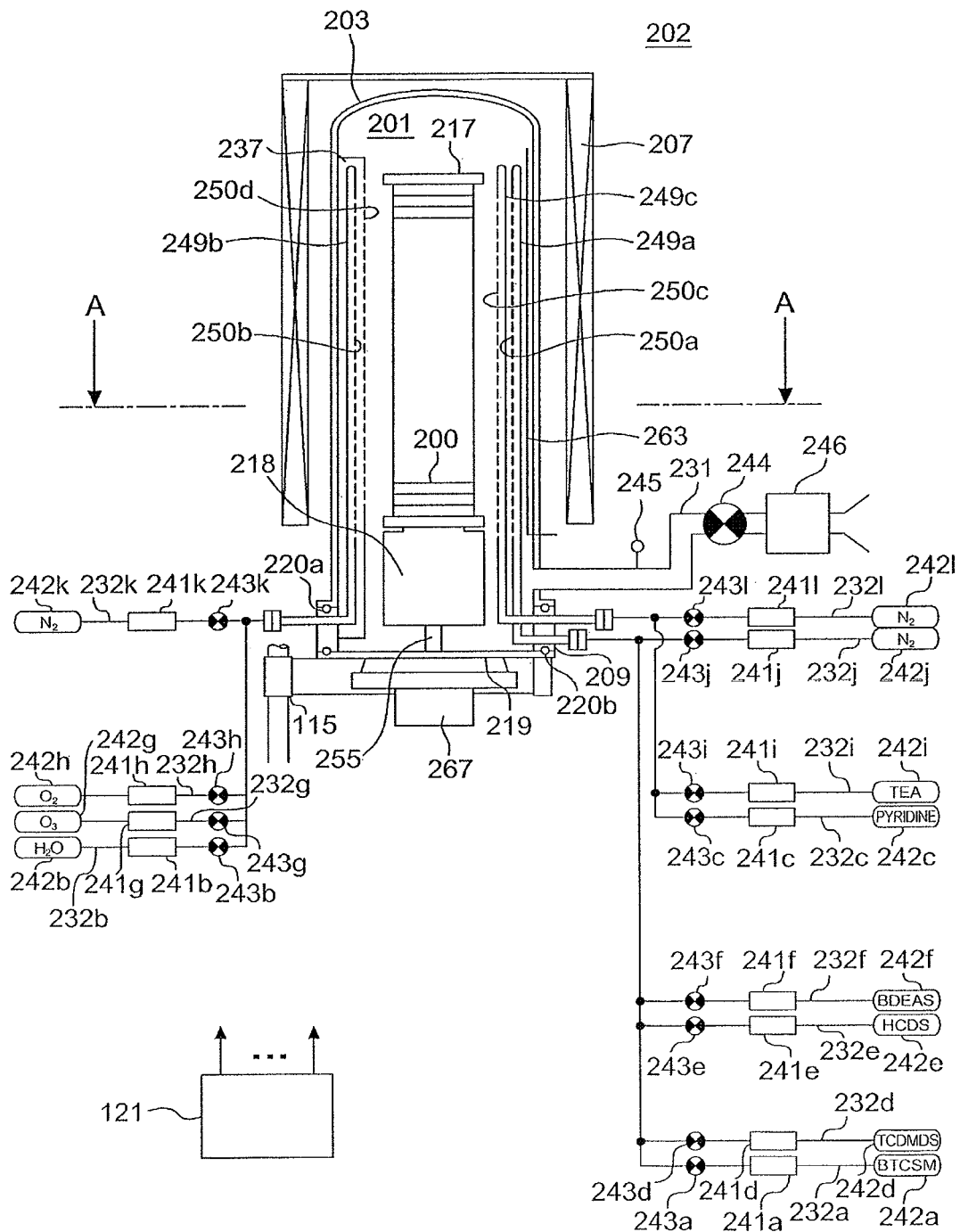
FIG. 1 is a diagram schematically illustrating a vertical processing furnace of a substrate processing apparatus that is preferably used in a first embodiment of the present invention and is a vertical cross-sectional view illustrating a processing furnace part.

As illustrated in FIG. 1, a processing furnace 202 includes a heater 207 serving as a heating unit (a heating mechanism). The heater 207 has a cylindrical shape and is vertically installed by being supported by a heat base (not illustrated) serving as a holding plate. Also, the heater 207 also serves as an activating mechanism (an exciting unit) for activating (exciting) a gas by heat as will be described later.

In the heater 207, a reaction tube 203 is concentrically provided with respect to the heater 207. The reaction tube 203 is made of a heat-resistant material such as quartz ($SiO_2$), carbide (SiC) or the like, and is formed to have a cylindrical shape whose upper end is closed and whose lower end is open. A manifold 209 (an inlet flange) is concentrically provided with respect to the reaction tube 203 below the reaction tube 203. The manifold 209 is made of a metal such as stainless steel, and is formed to have a cylindrical shape whose upper and lower ends are open. An upper end of the manifold 209 is engaged with a lower end of the reaction tube 203 to support the reaction tube 203. An O-ring 220a serving as a sealing member is installed between the manifold 209 and the reaction tube 203. The manifold 209 is supported by the heater base, and the reaction tube 203 is installed vertically. A process container (a reaction container) is constituted by the reaction tube 203 and the manifold 209. A process chamber 201 accommodates wafers 200 serving as substrates in a hollow portion of the process container by a boat 217 to be described later in a state of being vertically arranged in multiple stages in a horizontal posture.

Nozzles 249a through 249c are installed in the process chamber 201 to pass through sidewalls of the manifold 209. Gas supply pipes 232a through 232c are connected to the nozzles 249a through 249c, respectively. A plurality of gas supply pipes 232d through 232f are connected to the gas supply pipe 232a. A plurality of gas supply pipes 232g and 232h are connected to the gas supply pipe 232b. Also, a gas supply pipe 232i is connected to the gas supply pipe 232c. Thus, the three nozzles 249a through 249c and the plurality of gas supply pipes 232a through 232i are installed in the process container, and a plurality of types of gases may be supplied into the process chamber 201.

A $(SiCl_3)_2CH_2$ (BTCSM) gas supply source 242a serving as a source gas supply source may be connected to an upstream side of the gas supply pipe 232a. A $(CH_3)_2Si_2Cl_4$ (TCDMDS) gas supply source 242d serving as a source gas supply source may be connected to an upstream side of the gas supply pipe 232d. A $Si_2Cl_6$ (HCDS) gas supply source 242e serving as a source gas supply source may be connected to an upstream side of the gas supply pipe 232e. A $Si[N(C_2H_5)_2]_2H_2$ (BDEAS) gas supply source 242f serving as a source gas supply source may be connected to an upstream side of the gas supply pipe 232f. An $H_2O$ gas supply source 242b serving as an oxygen gas supply source may be connected to an upstream side of the gas supply pipe 232b. An $O_3$ gas supply source 242g serving as an oxygen gas supply source may be connected to an upstream side of the gas supply pipe 232g. An $O_2$ gas supply source 242h serving as an oxygen gas supply source may be connected to an upstream side of the gas supply pipe 232h. A $C_5H_5N$ (pyridine) gas supply source 242c serving as a catalytic gas supply source may be connected to an upstream side of the gas supply pipe 232c. A $(C_2H_5)_3N$ (TEA) gas supply source 242i serving as a catalytic gas supply source may be connected to an upstream side of the gas supply pipe 232i.

$N_2$ gas supply sources 242j through 242l serving as inert gas supply sources are connected to gas supply pipes 232j through 232l which are connected to the gas supply pipes 232a through 232c, respectively. Mass flow controllers (MFCs) 241a through 241l serving as flow rate controllers (flow rate control units) and valves 243a through 243l serving as opening and closing valves are sequentially provided from an upstream end in the gas supply pipes 232a through 232l, respectively, to which the gas supply sources 242a through 242l are connected, respectively. Downstream sides of the gas supply pipes 232j through 232l are connected to downstream sides of the valves 243a through 243c of the gas supply pipes 232a through 232c, respectively. Downstream sides of the gas supply pipes 232d through 232f are connected to the downstream side of the valve 243a of the gas supply pipe 232a. Downstream sides of the gas supply pipes 232g and 232h are connected to the downstream side of the valve 243b of the gas supply pipe 232b. A downstream side of the gas supply pipe 232i is connected to the downstream side of the valve 243c of the gas supply pipe 232c.

Figure 2:
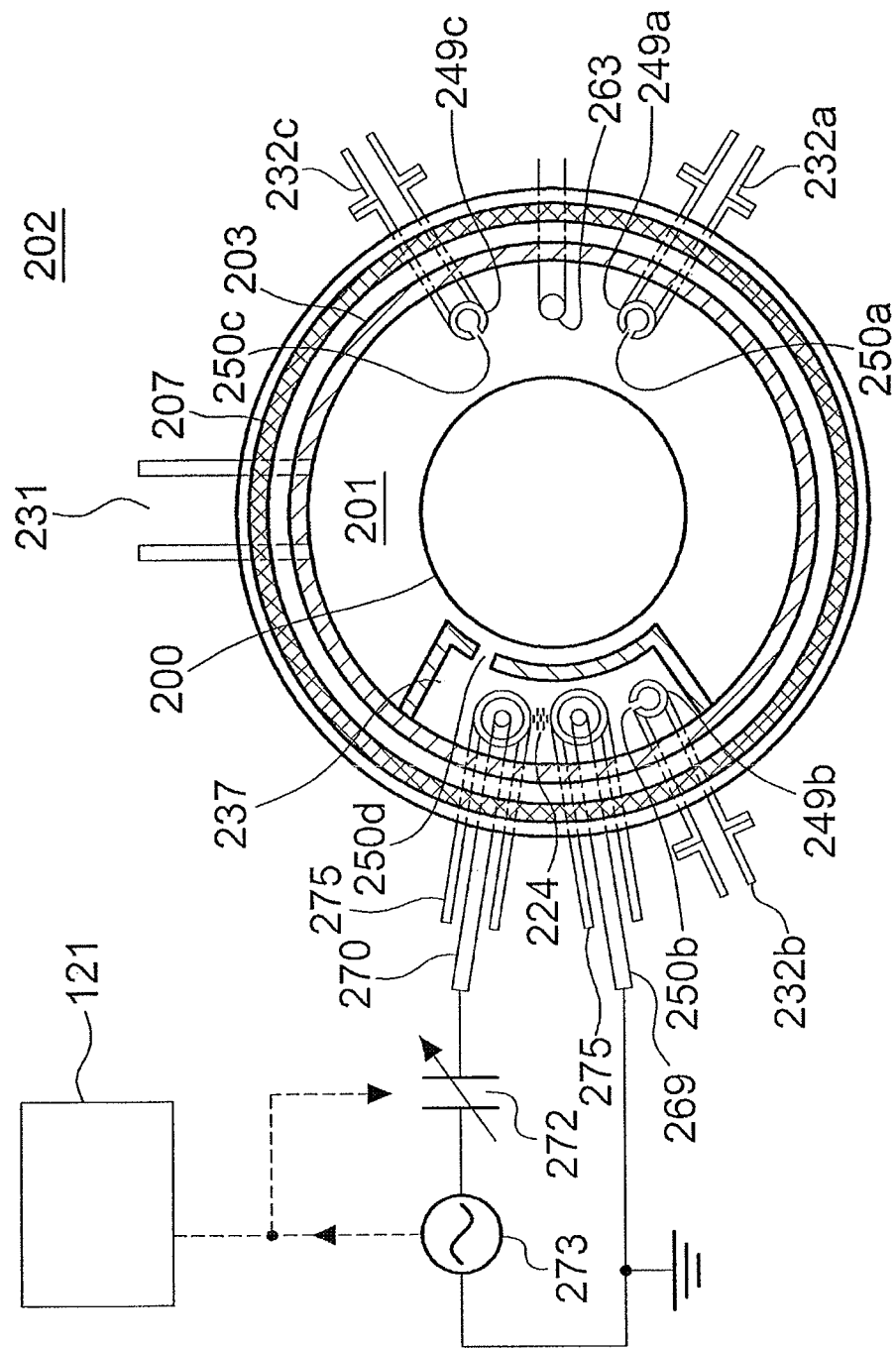
FIG. 2 is a diagram schematically illustrating the vertical processing furnace of the substrate processing apparatus that is preferably used in the first embodiment of the present invention and is a cross-sectional view part taken along line A-A in FIG. 1.

The above-described nozzles 249a and 249c are connected to front ends of the gas supply pipes 232a and 232c, respectively. As illustrated in FIG. 2, the nozzles 249a and 249c are installed in a ring-shaped space formed between an inner wall of the reaction tube 203 and wafers 200 in a direction in which the wafers 200 are stacked and from a lower wall to an upper inner wall inside of the reaction tube 203. That is, the nozzles 249a and 249c are respectively installed along a wafer arrangement region in which the wafers 200 are arranged in regions that horizontally surround the wafer arrangement region at sides of the wafer arrangement region. Each of the nozzles 249a and 249c includes an L-shaped long nozzle, and includes a horizontal portion installed to pass through a sidewall of the manifold 209 and a vertical portion installed to vertically extend at least from one end of the wafer arrangement region toward the other end thereof. A plurality of gas supply holes 250a and 250c configured to supply a gas are provided at side surfaces of the nozzles 249a and 249c, respectively. As illustrated in FIG. 2, the plurality of gas supply holes 250a and 250c may be open toward the center of the reaction tube 203 to supply the gases to the wafer 200. The plurality of gas supply holes 250a and 250c are provided from a lower portion of the reaction tube 203 to an upper portion thereof, and are each provided to have the same opening area and the same opening pitch.

The nozzle 249b is connected to a front end of the gas supply pipe 232b. The nozzle 249b is installed in a buffer chamber 237 serving as a gas distribution space. As illustrated in FIG. 2, the buffer chamber 237 is provided in the ring-shaped space formed between the inner wall of the reaction tube 203 and the wafers 200 in the direction in which the wafers 200 are stacked and from the lower inner wall to the upper inner wall of the reaction tube 203. That is, the buffer chamber 237 is installed along the wafer arrangement region in which the wafers 200 are arranged in regions that horizontally surround the wafer arrangement region at the sides of the wafer arrangement region. A plurality of gas supply holes 250d configured to supply gases are provided at a wall of the buffer chamber 237 adjacent to the wafer 200. The gas supply holes 250d may be open toward the center of the reaction tube 203 to supply the gases to the wafer 200. The plurality of gas supply holes 250d are provided from the lower portion of the reaction tube 203 to the upper portion thereof, and are each provided to have the same opening area and the same opening pitch.

As illustrated in FIG. 2, the nozzle 249b extends from the lower inner wall to the upper inner wall of the reaction tube 203 opposite to a wall of the buffer chamber 237 in which the plurality of gas supply holes 250d of the buffer chamber 237 are installed in the direction in which the wafers 200 are stacked. That is, the nozzle 249b is installed along the wafer arrangement region in which the wafers 200 are arranged in regions that horizontally surround the wafer arrangement region at the sides of the wafer arrangement region. The nozzle 249b includes an L-shaped long nozzle, and includes a horizontal portion installed to pass through the sidewall of the manifold 209 and a vertical portion installed to vertically extend at least from one end of the wafer arrangement region toward the other end thereof. A plurality of gas supply holes 250b configured to supply gases are installed at a wall of the nozzle 249b. As illustrated in FIG. 2, the plurality of gas supply holes 250b are open toward the center of the buffer chamber 237. The plurality of gas supply holes 250b are provided from the lower portion of the reaction tube 203 to the upper portion thereof in the same manner as the plurality of gas supply holes 250d of the buffer chamber 237. When a difference between an inner pressure of the buffer chamber 237 and an inner pressure of the process chamber 201 is small, the opening area and the opening pitch of each of the plurality of gas supply holes 250b are preferably the same from an upstream side (the lower portion) to a downstream side (the upper portion), but when the difference is large, the opening area is preferably increased or the opening pitch is preferably decreased from the upstream side to the downstream side.

According to the present embodiment, when the opening area and the opening pitch of each of the plurality of gas supply holes 250b are adjusted from the upstream side to the downstream side as described above, first, gases having different flow velocities and almost the same flow rate are sprayed through the plurality of gas supply holes 250b, respectively. Also, first, the gases sprayed through the plurality of gas supply holes 250b are introduced into the buffer chamber 237, and the difference of the flow velocities of the gases are uniformized in the buffer chamber 237. That is, the gases sprayed into the buffer chamber 237 through the plurality of gas supply holes 250b are sprayed into the process chamber 201 through the plurality of gas supply holes 250d after velocities of the respective gas particles are reduced. Thus, the gases sprayed into the buffer chamber 237 through the plurality of gas supply holes 250b have uniform flow rates and flow velocities when being sprayed into the process chamber 201 through the plurality of gas supply holes 250d.

Thus, in the method of supplying the gases using the long nozzle according to the present embodiment, the gases are supplied via the nozzles 249a through 249c, which are disposed in the ring-shaped space defined by the inner wall of the reaction tube 203 and end portions of the plurality of the wafers 200 and configured to extend vertically, that is, in a cylindrical space, and in the buffer chamber 237, the gas is initially sprayed into the reaction tube 203 in the vicinity of the wafer 200 through the respective gas supply holes 250a through 250d provided in the nozzles 249a through 249c and the buffer chamber 237, and a main flow of the gas in the reaction tube 203 is set as a direction parallel to a surface of the wafer 200, that is, a horizontal direction. With such a configuration, it is possible to uniformly supply the gases to each of the wafers 200, thereby improving a film thickness uniformity of a thin film formed on the surface of each of the wafers 200. The gas flowing along the surface of the wafer 200, that is, a residual gas after a reaction, flows toward an exhaust port, that is, toward an exhaust pipe 231 to be described later. However, a flow direction of the residual gas is not limited to a vertical direction, but is appropriately defined according to a position of the exhaust port.

A source gas containing silicon (Si) serving as a predetermined element, carbon (C) and a halogen element [fluorine (F), chlorine (Cl), bromine (Br) and the like] and having a chemical bond (a Si—C bond) between the predetermined element and carbon, for example, a chlorosilane-based source gas containing a methylene group serving as a source gas containing silicon, a methylene group serving as an alkylene group and a chloro group serving as a halogen group is supplied into the process chamber 201 through the MFC 241a, the valve 243a and the nozzle 249a which are provided in the gas supply pipe 232a. The chlorosilane-based source gas containing the methylene group is a silane-based source gas containing a methylene group and a chloro group, and is a source gas containing at least Si, a methylene group containing C and Cl serving as a halogen element. The chlorosilane-based source gas containing the methylene group supplied through the gas supply pipe 232a may include, for example, methylenebis(trichlorosilane), that is, bis(trichlorosilyl)methane [$(SiCl_3)_2CH_2$, abbreviated to BTCSM] gas.

Figure 14A:
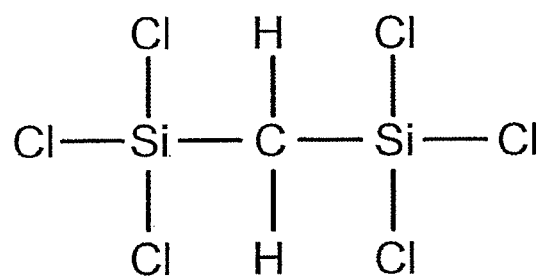
FIGS. 14A through 14F are diagrams illustrating chemical structural formulas of various kinds of silane used as a source gas, and are diagrams illustrating chemical structural formulas of BTCSM, BTCSE, TCDMDS, DCTMDS, HCDS and BDEAS.

As illustrated in FIG. 14A, the BTCSM includes a methylene group which is an alkylene group, in a chemical structural formula thereof (in a molecule). Each of two bonds with the methylene group included in the BTCSM combines with Si to form an Si—C—Si bond. The Si—C bond included in the source gas is, for example, a part of the Si—C—Si bond included in the BTCSM, and the methylene group included in the BTCSM includes C constituting the Si—C bond.

Also, the source gas containing silicon, carbon and the halogen element and having the Si—C bond includes, for example, a chlorosilane-based source gas containing an ethylene group serving as a source gas containing silicon, an ethylene group serving as an alkylene group and a chloro group serving as a halogen group. The chlorosilane-based source gas containing the ethylene group may include, for example, ethylenebis(trichlorosilane), that is, 1,2-bis(trichlorosilyl)ethane [$(SiCl_3)_2C_2H_4$, abbreviated to BTCSE] gas.

Figure 14B:
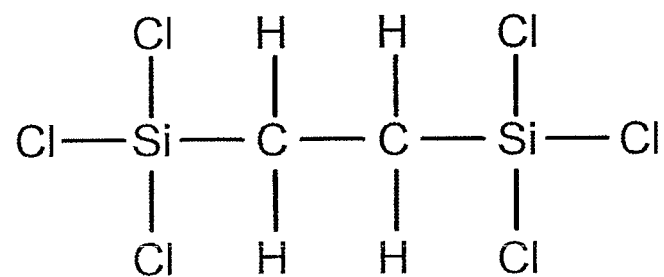

As illustrated in FIG. 14B, the BTCSE includes an ethylene group which is an alkylene group, in a chemical structural formula thereof (in a molecule). Each of two bonds with the ethylene group included in the BTCSE combines with Si to form an Si—C—C—Si bond. The Si—C bond included in the source gas is, for example, a part of the Si—C—C—Si bond included in the BTCSE, and the ethylene group included in the BTCSE includes C constituting the Si—C bond.

Also, the alkylene group is a functional group in which two hydrogen atoms (H) are removed from a saturated hydrocarbon (alkane) chain represented as a general formula $C_nH_{2n+2}$, and is an aggregate of atoms represented as a general formula $C_nH_{2n}$. The alkylene group includes a propylene group, a butylene group or the like as well as the above-described methylene or ethylene group. Thus, the source gas containing silicon, carbon and the halogen element and having the Si—C bond includes an alkylenehalosilane-based source gas containing silicon, an alkylene group and a halogen element. The alkylenehalosilane-based source gas may be a halosilane-based source gas containing an alkylene group, and may also be, for example, a gas having a structure in which the alkylene group is introduced between an Si—Si bond in a state in which a bond of the Si combines with a plurality of halogen elements in the halosilane-based source gas. The BTCSM gas, the BTCSE gas and the like are included in the alkylenehalosilane-based source gas.

A source gas containing silicon (Si) serving as a predetermined element, carbon (C) and the halogen element and having a chemical bond (a Si—C bond) between the predetermined element and carbon, for example, a chlorosilane-based source gas containing a methyl group serving as a source gas containing silicon, a methyl group serving as an alkyl group, and a chloro group serving as a halogen group is supplied into the process chamber 201 through the MFC 241d, the valve 243d and the nozzle 249a which are provided in the gas supply pipe 232d. Here, the chlorosilane-based source gas containing the methyl group is a silane-based source gas containing a methyl group and a chloro group, and is a source gas containing at least Si, a methyl group containing C and, Cl serving as a halogen element. The chlorosilane-based source gas containing the methyl group supplied through the gas supply pipe 232d includes, for example, 1,1,2,2-tetrachloro-1,2-dimethyldisilane [$(CH_3)_2Si_2Cl_4$, abbreviated to TCDMDS] gas.

Figure 14C:
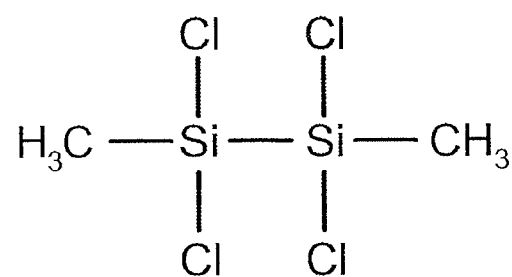

As illustrated in FIG. 14C, the TCDMDS includes two methyl groups serving as alkyl groups, in a chemical structural formula thereof (in a molecule). Each bond with the two methyl groups included in the TCDMDS combines with Si to form an Si—C bond. The Si—C bond included in the source gas is, for example, a part of the Si—C bond included in the TCDMDS, and each of the two methyl groups included in the TCDMDS includes the C constituting the Si—C bond.

Also, the chlorosilane-based source gas containing the methyl group includes a separate source gas different from the TCDMDS gas. The separate chlorosilane-based source gas containing the methyl group may include, for example, 1,2-dichloro-1,1,2,2-tetramethyldisilane [$(CH_3)_4Si_2Cl_2$, abbreviated to DCTMDS] gas and the like.

Figure 14D:
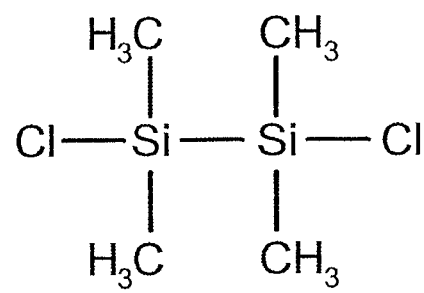

As illustrated in FIG. 14D, the DCTMDS includes four methyl groups serving as alkyl groups, in a chemical structural formula thereof (in a molecule). Each bond with the four methyl groups included in the DCTMDS combines with Si to form an Si—C bond. The Si—C bond included in the source gas is, for example, the Si—C bond included in the DCTMDS, and each of the four methyl groups included in the DCTMDS includes the C constituting the Si—C bond.

Also, the alkyl group is a functional group in which one hydrogen atom (H) is removed from a saturated hydrocarbon (alkane) chain represented as a general formula $C_nH_{2n+2}$, and is an aggregate of atoms represented as a general formula $C_nH_{2n+1}$. The alkyl group includes an ethyl group, a propyl group, a butyl group or the like as well as the above-described methyl group. Thus, the source gas containing silicon, carbon and the halogen element and having the Si—C bond includes an alkylhalosilane-based source gas containing silicon, an alkyl group and a halogen element. The alkylhalosilane-based source gas may be a halosilane-based source gas containing an alkyl group, and may also be, for example, a gas having a structure in which a halogen group of the halosilane-based source gas is replaced by an alkyl group. The TCDMDS gas, the DCTMDS gas and the like are included in the alkylhalosilane-based source gas.

A source gas containing silicon (Si) serving as a predetermined element and a halogen element, for example, a chlorosilane-based source gas serving as a source gas containing silicon and a chloro group serving as a halogen group is supplied into the process chamber 201 through the MFC 241e, the valve 243e and the nozzle 249a which are provided in the gas supply pipe 232e. Here, the chlorosilane-based source gas is a silane-based source gas containing a chloro group, and is a source gas containing at least Si and Cl serving as a halogen element. That is, the chlorosilane-based source described herein may be a type of a halide. The chlorosilane-based source gas supplied through the gas supply pipe 232e may include, for example, hexachlorodisilane ($Si_2Cl_6$, abbreviated to HCDS) gas.

Figure 14E:
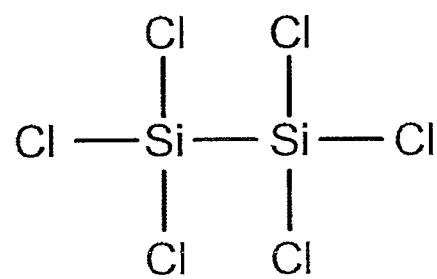

As illustrated in FIG. 14E, the HCDS includes Si and a chloro group, in a chemical structural formula thereof (in a molecule). Also, the source gas containing silicon and the halogen element may include an inorganic source gas such as tetrachlorosilane, that is, silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas and the like as well as the HCDS gas.

A source gas containing silicon (Si) serving as a predetermined element, carbon (C) and nitrogen (N) and having a chemical bond (an Si—N bond) between the predetermined element and nitrogen, for example, an aminosilane-based source gas serving as a source gas containing silicon and an amino group (an amine group) is supplied into the process chamber 201 through the MFC 241f, the valve 243f and the nozzle 249a which are provided in the gas supply pipe 232f. Here, the aminosilane-based source gas is a silane-based source gas containing an amino group, and is a source gas containing an amino group containing at least Si, C and N. The aminosilane-based source gas supplied through the gas supply pipe 232f may include, for example, bis(diethylamino)silane ($Si[N(C_2H_5)_2]_2H_2$, abbreviated to BDEAS) gas.

Figure 14F:
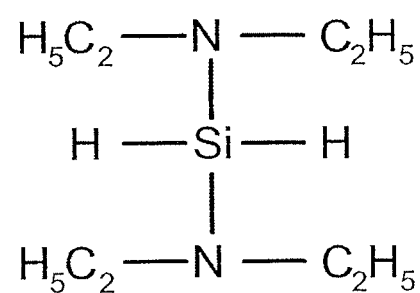

As illustrated in FIG. 14F, the BDEAS includes an amino group in its chemical structural formula (in a molecule). Also, the source gas containing silicon, carbon and N and having the Si—N bond may include an organic source gas such as tris(diethylamino)silane ($SiH[N(C_2H_5)_2]_3$, abbreviated to 3DEAS) gas, tetrakis(diethylamino)silane ($Si[N(C_2H_5)_2]_4$, abbreviated to 4DEAS) gas, tris(dimethylamino)silane ($Si[N(CH_3)_2]_3H$, abbreviated to 3DMAS) gas, tetrakis(dimethylamino)silane ($Si[N(CH_3)_2]_4$, abbreviated to 4DMAS) gas and the like as well as the BDEAS gas.

Here, the chlorosilane-based source gas supplied through the gas supply pipes 23a, 232d and 232e includes a chlorosilane-based source in a gaseous state, for example, a gas that is obtained by vaporizing a chlorosilane-based source in a liquid state under room temperature and normal pressure or a chlorosilane-based source in a gaseous state under room temperature and normal pressure. Also, the aminosilane-based source gas supplied through the gas supply pipe 232f includes an aminosilane-based source, for example, a gas that is obtained by vaporizing an aminosilane-based source under room temperature and normal pressure or an aminosilane-based source in a gaseous state under room temperature and normal pressure. Also, when the term "source" is used in this specification, it may refer to one or both of the term "a liquid source in a liquid state" and the term "a source gas in a gaseous state." Therefore, when the term "chlorosilane-based source" is used in this specification, it may refer to one or both of the term "a chlorosilane-based liquid source in a liquid state" and the term "a chlorosilane-based source gas in a gaseous state." Also, when the term "aminosilane-based source" is used in this specification, it may refer to one or both of the term "an aminosilane-based liquid source in a liquid state" and the term "an aminosilane-based source gas in a gaseous state." Also, when a liquid source in a liquid state under room temperature and normal pressure such as BTCSM, BTCSE, TCDMDS, DCTMDS, HCDS, BDEAS is used, the liquid source is vaporized by a vaporization system such as a vaporizer or a bubbler, and then is supplied as a source gas (such as BTCSM gas, BTCSE gas, TCDMDS gas, DCTMDS gas, HCDS gas, BDEAS gas).

A gas containing oxygen (O) (oxygen-containing gas) which is an oxidizing gas is supplied into the process chamber 201 through the MFC 241b, the valve 243b, the nozzle 249b and the buffer chamber 237 which are provided in the gas supply pipe 232b. The oxidizing gas supplied through the gas supply pipe 232b may include water vapor ($H_2O$ gas). Also, when the $H_2O$ gas is supplied, it may be configured that oxygen ($O_2$) gas and hydrogen ($H_2$) gas are supplied to and burned in an external combustion apparatus (not illustrated) to generate $H_2O$ gas.

A gas containing oxygen (O) (an oxygen-containing gas) which is an oxidizing gas is supplied into the process chamber 201 through the MFC 241g, the valve 243g, the nozzle 249b and the buffer chamber 237 which are provided in the gas supply pipe 232g. The oxidizing gas supplied through the gas supply pipe 232g includes, for example, ozone ($O_3$) gas.

A gas containing oxygen (O) (an oxygen-containing gas) which is an oxidizing gas is supplied into the process chamber 201 through the MFC 241h, the valve 243h, the nozzle 249b and the buffer chamber 237 which are provided in the gas supply pipe 232h. The oxidizing gas supplied through the gas supply pipe 232h includes, for example, oxygen ($O_2$) gas.

The bonding force of an O—H bond included in the surface of the wafer 200 or the $H_2O$ gas is weakened by a catalysis action, the decomposition of the source gas is promoted, and an amine-based gas containing carbon (C), nitrogen (N) and hydrogen (H) which is a catalytic gas for promoting an oxidizing reaction by an oxidizing gas such as $H_2O$ gas is supplied into the process chamber 201 through the MFC 241c and the valve 243c and the nozzle 249c which are provided in the gas supply pipe 232c. Here, the amine-based gas refers to a gas containing amine in which at least one hydrogen atom of ammonia ($NH_3$) is replaced by a hydrocarbon group such as an alkyl group. As illustrated in FIGS. 15A through 15F, various kinds of amines used as the catalytic gas include N having a lone pair and having an acid dissociation constant (hereinafter, referred to as pKa) of about 5 to 11. Here, the acid dissociation constant (pKa) refers to an indicator which quantitatively indicates the strength of the acid, and refers to a constant which indicates an equilibrium constant Ka in a dissociation reaction in which a hydrogen ion is released from the acid by a negative common logarithm. The amine-based gas includes a ring-shaped amine-based gas in which a hydrocarbon group is formed in a ring shape, or a chain-shaped amine-based gas in which the hydrocarbon group is formed in a chain shape. The amine-based gas supplied through the gas supply pipe 232c includes, for example, pyridine ($C_5H_5N$) gas which is a ring-shaped amine-based gas.

Figure 15A:
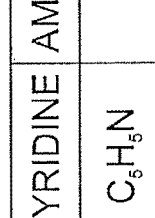
Figure 15A:
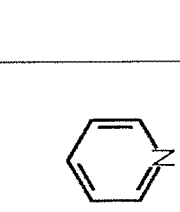
Figure 15A:
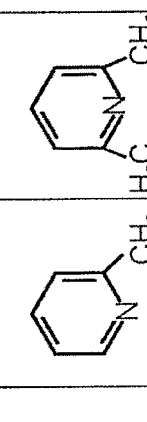
Figure 15A:
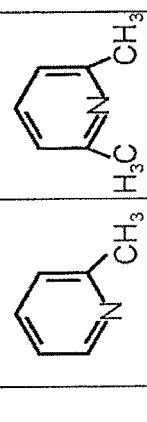
Figure 15A:
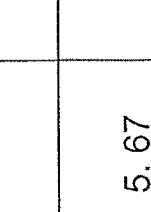
Figure 15A:
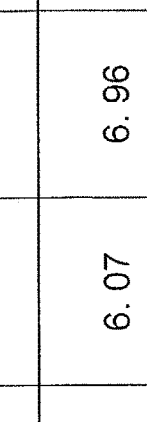
Figure 15D:
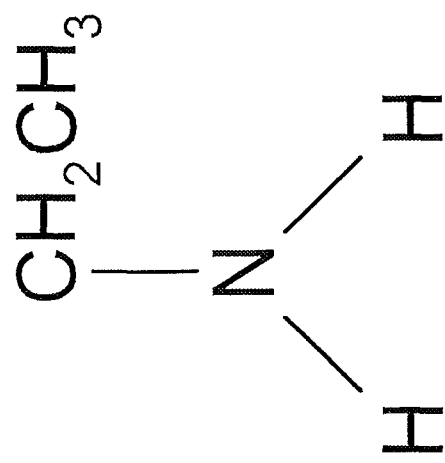
Figure 15E:
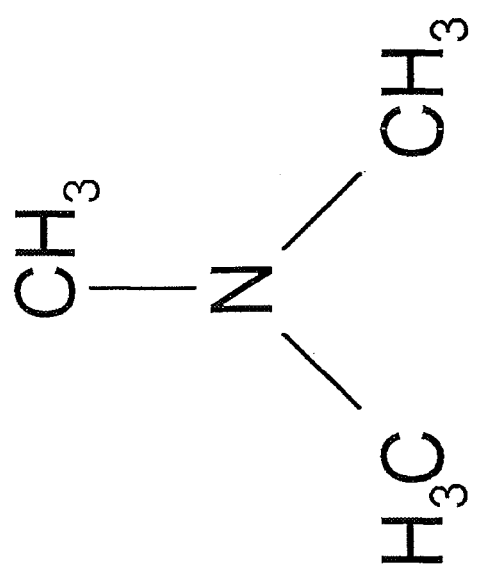
Figure 15F:
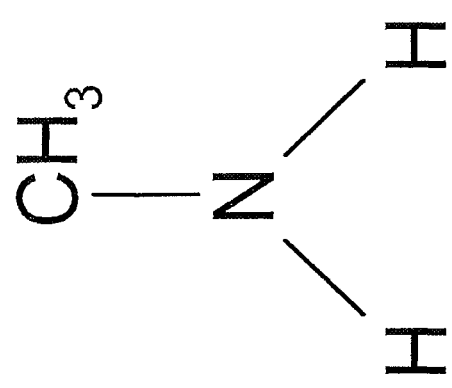

As illustrated in FIG. 15A, the ring-shaped amine used as a catalytic gas includes, for example, aminopyridine ($C_5H_6N_2$, pKa=6.89), picoline ($C_6H_7N$, pKa=6.07), lutidine ($C_7H_9N$, pKa=6.96), piperazine ($C_4H_{10}N_2$, pKa=9.80) and piperidine ($C_5H_{11}N$, pKa=11.12) as well as pyridine ($C_5H_5N$, pKa=5.67). These ring-shaped amines may be referred to as a heterocyclic compound in which the ring-shaped structure is formed from a plurality of elements such as C and N, that is, a heterocyclic compound containing nitrogen.

The amine-based gas containing C, N and H which is a catalytic gas having the same catalysis action as described above is supplied into the process chamber 201 through the MFC 241i, the valve 243i and the nozzle 249c which are provided in the gas supply pipe 232i. The amine-based gas supplied through the gas supply pipe 232i includes, for example, triethylamine [$(C_2H_5)_3N$, abbreviated to TEA] gas which is a chain-shaped amine-based gas.

As illustrated in FIGS. 15B through 15F, the chain-shaped amine used as a catalytic gas includes, for example, diethylamine [$(C_2H_5)_2NH$, abbreviated to DEA, pKa=10.9], monoethylamine [$(C_2H_5)NH_2$, abbreviated to MEA, pKa=10.6], trimethylamine [$(CH_3)_3N$, abbreviated to TMA, pKa=9.8], monomethylamine [$(CH_3)NH_2$, abbreviated to MMA, pKa=10.6] as well as trimethylamine [$(C_2H_5)_3N$, abbreviated to TEA, pKa=10.7].

The amine-based gas which is a catalytic gas may be referred to as an amine-based catalytic gas. Also, the catalytic gas includes a non-amine-based gas, that is, for example, ammonia ($NH_3$, pKa=9.2) gas as well as the above-described amine-based gas.

For example, nitrogen ($N_2$) gas which is an inert gas is supplied into the process chamber 201 through the MFCs 241j through 241l, the valves 243j through 243l, the nozzles 249a through 249c and the buffer chamber 237 which are provided in the gas supply pipes 232j through 232l, respectively.

The $N_2$ gas which is an inert gas also acts as a purge gas and an oxygen-free gas not containing oxygen (O) configured to generate oxygen-free atmosphere to be described later. Also, when the $N_2$ gas is used as the oxygen-free gas, the $N_2$ gas may act as a thermal processing gas or an annealing gas. Such an inert gas, purge gas and oxygen-free gas includes, for example, a rare gas such as argon (Ar) gas, helium (He) gas, neon (Ne) gas, xenon (Xe) gas and the like as well as the $N_2$ gas.

When supplying the gases through the gas supply pipes, respectively, as described above, a source gas supply system for supplying a source gas includes the gas supply pipes 232a, 232d, 232e and 232f, the MFCs 241a, 241d, 241e and 241f and the valves 243a, 243d, 243e and 243f. The source gas supply system may further include the nozzle 249a, the BTCSM gas supply source 242a, the TCDMDS gas supply source 242d, the HCDS gas supply source 242e and the BDEAS gas supply source 242f. The source gas supply system may be referred to as a source supply system. Also, the source gas supply system may be a set of a plurality of supply lines (supply systems) for respectively supplying a plurality of source gases which are element sources of the other elements or a plurality of source gases having different molecular structures. That is, the source gas supply system may be a set of a BTCSM gas supply line including the gas supply pipe 232a, the MFC 241a and the valve 243a, a TCDMDS gas supply line including the gas supply pipe 232d, the MFC 241d and the valve 243d, an HCDS gas supply line including the gas supply pipe 232e, the MFC 241e and the valve 243e, and a BDEAS gas supply line including the gas supply pipe 232f, the MFC 241f and the valve 243f. Each of the supply lines in the source gas supply system may further include the nozzle 249a or the corresponding source gas supply sources 242a, 242d, 242e and 242f.

Thus, the plurality of supply lines included in the source gas supply system are configured to respectively supply the plurality of source gases which are element sources of the other elements or the plurality of source gases having different molecular structures. Also, each of the source gases has a different molecular structure, that is, a different chemical formula. The composition or components of the source gases may be different from each other. The source gases having the different molecular structures also have different chemical characteristics, respectively. Therefore, as described later, by appropriately selecting a type of the source gas according to desired film forming process, a thin film having various composition ratios and film quality may be generally and repeatedly formed using a single substrate processing apparatus.

Also, an oxygen gas supply system includes the gas supply pipes 232b, 232g and 232h, the MFC 241b, 241g and 241h and the valves 243b, 243g and 243h. The oxygen gas supply system may further include the nozzle 249b, the buffer chamber 237, the $H_2O$ gas supply source 242b, the $O_3$ gas supply source 242g and the $O_2$ gas supply source 242h. The oxygen gas supply system may be referred to as an oxidizing agent supply system. Also, the oxygen gas supply system may be a set of a plurality of supply lines (supply systems) for respectively supplying a plurality of oxidizing gases having different molecular structures. That is, the oxygen gas supply system may be a set of an $H_2O$ gas supply line including the gas supply pipe 232b, the MFC 241b and the valve 243b, an $O_3$ gas supply line including the gas supply pipe 232g, the MFC 241g and the valve 243g, and an $O_2$ gas supply line including the gas supply pipe 232h, the MFC 241h and the valve 243h. Each of the supply lines in the oxygen gas supply system may further include the nozzle 249b or the buffer chamber 237, or the corresponding oxygen gas supply sources 242b, 242g and 242h.

Thus, the plurality of supply lines constituting the oxygen gas supply system are configured to respectively supply the plurality of oxidizing gases having different molecular structures. Also, each of the oxidizing gas has a different molecular structure, that is, a different chemical formula. The composition or components of the oxidizing gas may be different from each other. The oxidizing gases having the different molecular structures also have different chemical characteristics, respectively. Therefore, by appropriately selecting a type of the oxidizing gas according to a desired film forming process, a thin film having various composition ratios and film quality may be generally and repeatedly formed using single substrate processing apparatus.

A catalytic gas supply system includes the gas supply pipes 232c and 232i, the MFCs 241c and 241i and the valves 243c and 243i. The catalytic gas supply system may further include the nozzle 249c, the pyridine gas supply source 242c and the TEA gas supply source 242i. Also, the catalytic gas supply system may be a set of a plurality of supply lines (supply systems) for respectively supplying a plurality of catalytic gases having different molecular structures. That is, the catalytic gas supply system may be a set of a pyridine gas supply line including the gas supply pipe 232c, the MFC 241c and the valve 243c and a TEA gas supply line including the gas supply pipe 232i, the MFC 241i and the valve 243i. Each of the supply lines in the catalytic gas supply system may further include the nozzle 249c or the corresponding catalytic gas supply sources 242c and 242i. Also, the above-described pyridine gas or TEA gas may be referred to as an amine-based gas which is a catalyst as described later, that is, an amine-based catalytic gas. Hereinafter, the catalytic gas supply system for supplying various amine-based catalytic gases is referred to as an amine-based catalytic gas supply system.

Thus, the plurality of supply lines constituting a catalytic gas supply system are configured to respectively supply the plurality of catalytic gases having different molecular structures. Also, each of the catalytic gases has a different molecular structure, that is, a different chemical formula. The composition or components of the catalytic gases may be different from each other. The catalytic gases having the different molecular structures also have different chemical characteristics, respectively. Therefore, as described later, by appropriately selecting a type of the catalytic gas according to a desired film forming process, a thin film having various composition ratios and film quality may be generally and repeatedly formed using a single substrate processing apparatus.

Also, an inert gas supply system includes the gas supply pipes 232j through 232l, the MFCs 241j through 241l and the valves 243j through 243l. Also, the inert gas supply system may further include a downstream side of a portion connecting the gas supply pipes 232a through 232c to the gas supply pipes 232j through 232l, the nozzles 249a through 249c, the buffer chamber 237 and the $N_2$ gas supply sources 242j through 242l. The inert gas supply system may be a set of a plurality of supply lines. That is, the inert gas supply system may be a set of an inert gas supply line including the gas supply pipe 232j, the MFC 241j and the valve 243j, an inert gas supply line including the gas supply pipe 232k, the MFC 241k and the valve 243k, and an inert gas supply line including the gas supply pipe 232l, the MFC 241l and the valve 243l. The inert gas supply system also serves as a purge gas supply system and an oxygen-free gas supply system. Also, the oxygen-free gas supply system is a part of an atmosphere generating unit for generating oxygen-free atmosphere to be described later.

As illustrated in FIG. 2, in the buffer chamber 237, two rod-shaped electrodes 269 and 270 made of a conductor and having elongated thin and long structure are provided from the lower part to the upper part of the reaction tube 203 in the direction in which the wafers 200 are stacked. Each of the rod-shaped electrodes 269 and 270 is provided parallel to the nozzle 249d. Each of the rod-shaped electrodes 269 and 270 is protected by being covered with an electrode protecting pipe 275 from an upper part to a lower part. One of the rod-shaped electrodes 269 and 270 is connected to a high frequency power source 273 through a matching unit 272, and the other thereof is connected to a ground serving as a reference potential. Plasma is generated in a plasma generation region 224 between the rod-shaped electrodes 269 and 270 by applying high frequency power between the rod-shaped electrodes 269 and 270 from the high frequency power source 273 through the matching unit 272. A plasma source serving as a plasma generator (a plasma generating unit) includes the rod-shaped electrodes 269 and 270 and the electrode protecting pipe 275. The plasma source may further include the matching unit 272 and the high frequency power source 273. The plasma source serves as an activating mechanism (an exciting unit) for activating (exciting) a gas to plasma.

The electrode protecting pipe 275 has a structure in which each of the rod-shaped electrodes 269 and 270 can be inserted into the buffer chamber 237 while the electrodes are isolated from an atmosphere in the buffer chamber 237. Here, when a concentration of oxygen in the electrode protecting pipe 275 is substantially the same as a concentration of oxygen in the external air (atmosphere), the rod-shaped electrodes 269 and 270 inserted into the electrode protecting pipe 275 are oxidized by heat generated from the heater 207. Therefore, the concentration of the oxygen in the electrode protecting pipe 275 is decreased by purging an inside of the electrode protecting pipe 275 with the inert gas such as $N_2$ gas using an inert gas purge mechanism or by charging the inert gas such as $N_2$ gas into the electrode protecting pipe 275, and thus oxidization of the rod-shaped electrodes 269 and 270 may be suppressed.

The exhaust pipe 231 configured to exhaust an atmosphere in the process chamber 201 is installed in the reaction tube 203. A vacuum pump 246 serving as a vacuum exhaust device is connected to the exhaust pipe 231 through a pressure sensor 245 serving as a pressure detector (a pressure detecting unit) configured to detect the inner pressure of the process chamber 201 and an auto pressure controller (APC) valve 244 serving as a pressure regulator (a pressure regulating unit). Vacuum-exhausting and vacuum-exhaust stopping in the process chamber 201 may be performed by opening the APC valve 244 while the vacuum pump 246 operates, and the inner pressure of the process chamber 201 may be adjusted by adjusting a degree of the valve opening based on information on pressure detected by the pressure sensor 245 while the vacuum pump 246 operates. An exhaust system includes the exhaust pipe 231, the APC valve 244 and the pressure sensor 245. The exhaust system may further include the vacuum pump 246. The exhaust pipe 231 is not limited to be installed in the reaction tube 203, and may also be installed in the manifold 209 similarly to the nozzles 249a through 249c.

Also, in the process chamber 201, the atmosphere generating unit for generating the oxygen-free atmosphere includes the exhaust system and the above-described oxygen-free gas supply system. The exhaust system makes the inner atmosphere of the process chamber 201 into oxygen-free atmosphere as the exhaust system alone or with the oxygen-free gas supply system for supplying an oxygen-free gas to the wafer 200 placed in the process chamber 201 by vacuum-exhausting the inside of the process chamber 201.

A seal cap 219 serving as a furnace port cover capable of air-tightly sealing a lower opening of the manifold 209 is installed below the manifold 209. The seal cap 219 abuts a lower end of the manifold 209 from a lower side thereof. The seal cap 219 is made of a metal such as stainless steel or the like, and preferably has a disk shape. An O-ring 220b is installed on an upper surface of the seal cap 219 as a sealing member that abuts the lower end of the manifold 209. A rotating mechanism 267 configured to rotate the boat 217 to be described later is installed at a side of the seal cap 219 opposite to the process chamber 201. A rotary shaft 255 of the rotating mechanism 267 passes through the seal cap 219 to be connected to the boat 217. The rotating mechanism 267 rotates the wafer 200 by rotating the boat 217. The seal cap 219 is vertically moved upward and downward by a boat elevator 115 serving as a lifting mechanism that is installed vertically outside of the reaction tube 203. The boat 217 may be loaded into and unloaded from the process chamber 201 by moving the seal cap 219 upward and downward by the boat elevator 115. That is, the boat elevator 115 may operate as a transfer device (a transfer mechanism) that transfers the boat 217 and the wafer 200 supported by the boat 217 into or out of the process chamber 201.

The boat 217 which is a substrate support is made of a heat-resistant material such as quartz, carbide or the like, and supports the plurality of wafers 200 that are arranged in a horizontal orientation while the centers thereof are aligned in multiple stages. An insulating member 218 made of a heat-resistant material such as quartz, carbide or the like is installed below the boat 217, and thus heat is not easily transmitted from the heater 207 to the seal cap 219. Also, the insulating member 218 may include a plurality of insulating plates including the heat-resistant material such as quartz, carbide or the like and an insulating plate holder configured to horizontally support these insulating plates in multiple stages.

A temperature sensor 263 serving as a temperature detector is installed in the reaction tube 203, and a temperature in the process chamber 201 may be set to have a desired temperature distribution by adjusting power supply to the heater 207 based on information on a temperature detected by the temperature sensor 263. The temperature sensor 263 is configured in an L shape similarly to the nozzles 249a through 249c, and is installed along the inner wall of the reaction tube 203.

Figure 3:
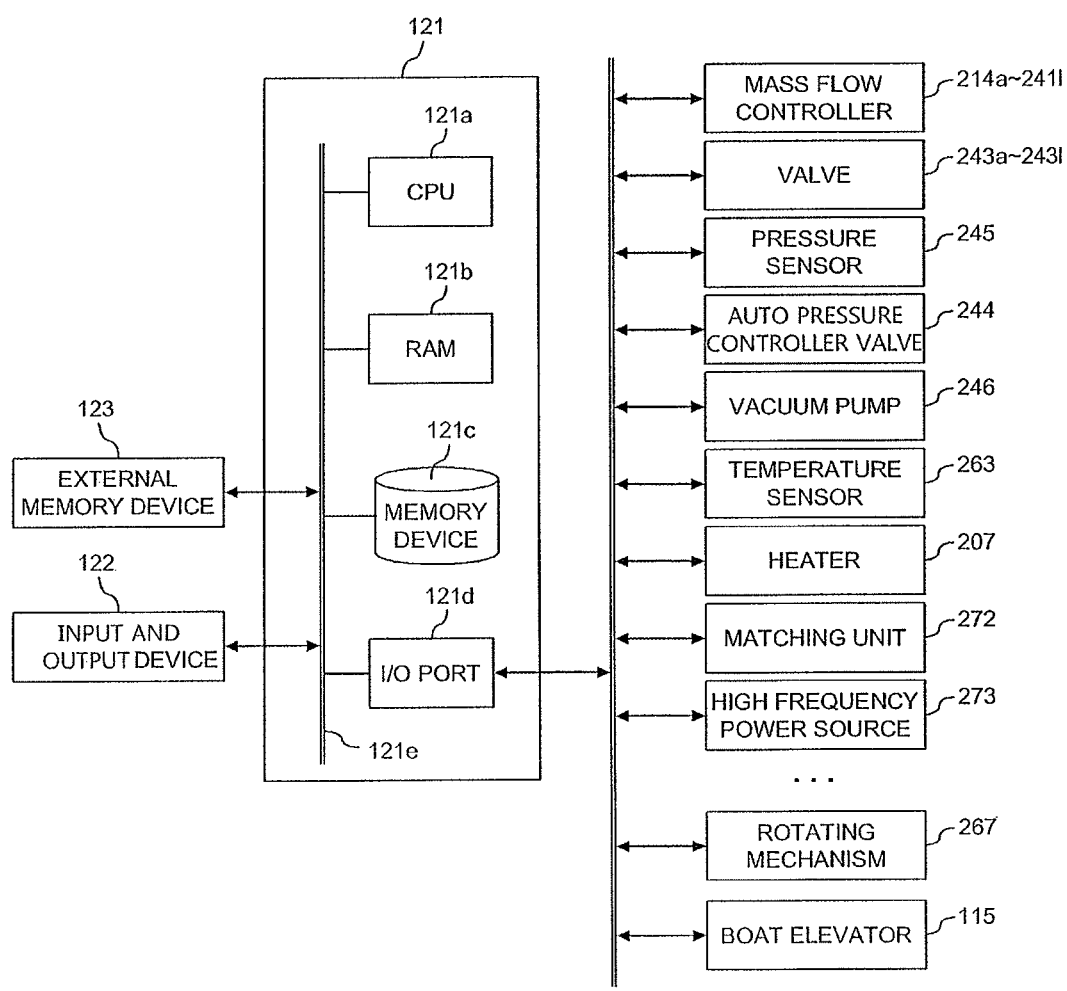
FIG. 3 is a diagram schematically illustrating a controller of the substrate processing apparatus that is preferably used in the first embodiment of the present invention and is a block diagram illustrating a control system of the controller.

As illustrated in FIG. 3, a controller 121 serving as a control unit (a control device) is embodied by a computer that includes a central processing unit (CPU) 121a, a random access memory (RAM) 121b, a memory device 121c and an input/output (I/O) port 121d. The RAM 121b, the memory device 121c and the I/O port 121d are able to exchange data with the CPU 121a through an internal bus 121e. An I/O device 122 configured as, for example, a touch panel, is connected to the controller 121.

The memory device 121c includes, for example, a flash memory, a hard disk drive (HDD) or the like. A control program for controlling operations of the substrate processing apparatus, a process recipe including sequences or conditions of substrate processing (such as a thin film forming process to be described later) and the like are readably stored in the memory device 121c. The process recipe serves as a program, which is a combination of sequences, that causes the controller 121 to execute each sequence in the thin film forming process to be described later in order to obtain a predetermined result. Hereinafter, such a process recipe, a control program and the like are collectively and simply referred to as a "program." When the term "program" is used in this specification, it may refer to one or both of the process recipe and the control program. The RAM 121b is a memory area (a work area) in which a program, data and the like read by the CPU 121a are stored temporarily.

The I/O port 121d is connected to the above-described MFCs 241a through 241l, valves 243a through 243l, pressure sensor 245, APC valve 244, vacuum pump 246, temperature sensor 263, heater 207, matching unit 272, high frequency power source 273, rotating mechanism 267, boat elevator 115 and the like.

The CPU 121a reads and executes the control program from the memory device 121c and reads the process recipe from the memory device 121c according to an input of a manipulating command from the I/O device 122. According to the read process recipe, the CPU 121a controls flow rate adjusting operations of various types of gases by the MFCs 241a through 241l, opening or closing operations of the valves 243a through 243l, an opening or closing operation of the APC valve 244, a pressure adjusting operation by the APC valve 244 based on the pressure sensor 245, starting or stopping operations of the vacuum pump 246, a temperature adjusting operation by the heater 207 based on the temperature sensor 263, a rotation and rotational speed adjusting operation of the boat 217 by the rotating mechanism 267, a lifting and lowering operation of the boat 217 by the boat elevator 115, an impedance adjustment operation by the matching unit 272, a power supply operation of the high frequency power source 273 and the like.

The controller 121 is not limited to being configured as a dedicated computer but may be configured as a general-purpose computer. For example, the controller 121 according to the present embodiment may be configured by preparing the external memory device 123 (e.g., a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card) recording the above program, and then installing the program in the general-purpose computer using the external memory device 123. However, the method of supplying the program to the computer is not limited to supply through the external memory device 123. For example, a communication line such as the Internet or a dedicated line may be used to supply the program regardless the external memory device 123. The memory device 121c or the external memory device 123 is configured as a non-transitory computer-readable recording medium. Hereinafter, these are also collectively and simply referred to as a recording medium. When the term "recording medium" is used in this specification, it may refer to one or both of the memory device 121c and the external memory device 123.

(2) Thin Film Forming Process

Next, as one of processes of a manufacturing a semiconductor device, an example of a sequence of forming a thin film on a substrate will be described using the processing furnace 202 of the above-described substrate processing apparatus. In the following description, operations of respective units constituting the substrate processing apparatus are controlled by the controller 121.

According to the present embodiment, a process of forming a thin film containing silicon (Si), oxygen (O) and carbon (C) on the wafer 200 is performed by performing a cycle a predetermined number of times. The cycle includes a process of supplying a source gas containing silicon (Si) serving as a predetermined element, carbon (C) and a halogen element and having a chemical bond between the predetermined element and carbon (an Si—C bond) to the wafer 200 serving as a substrate; a process of supplying an oxidizing gas to the wafer 200; and a process of supplying a catalytic gas to the wafer 200.

In this case, while performing the process of supplying the catalytic gas, the process of supplying the source gas is performed, and while performing the process of supplying the catalytic gas, the process of supplying the oxidizing gas is performed.

Also, according to the present embodiment, a process of removing a first impurity from the thin film by subjecting the thin film to thermal processing with a first temperature higher than a temperature of the wafer 200 in the process of forming the thin film; and a process of removing a second impurity different from the first impurity from the thin film after the thermal processing with the first temperature by subjecting the thin film to the thermal processing with a second temperature not less than the first temperature are further performed. The thermal processing is performed in oxygen-free atmosphere.

Also, according to the present embodiment, each process is performed in non-plasma atmosphere.

According to the present embodiment, the controller 121 controls a supply condition of a plurality of kinds of gases including a plurality of elements constituting the thin film that is formed such that a composition ratio of the thin film that is formed is to be a stoichiometric composition or a composition ratio different from the stoichiometric composition. For example, the controller 121 controls the supply condition such that at least one element of the plurality of elements constituting the thin film that is formed is in excess of the other element with respect to the stoichiometric composition. Hereinafter, while controlling a ratio of the plurality of elements constituting the thin film that is formed, that is, the composition ratio of the thin film, an example of a sequence in which a film forming process is performed will be described.

Figure 4:
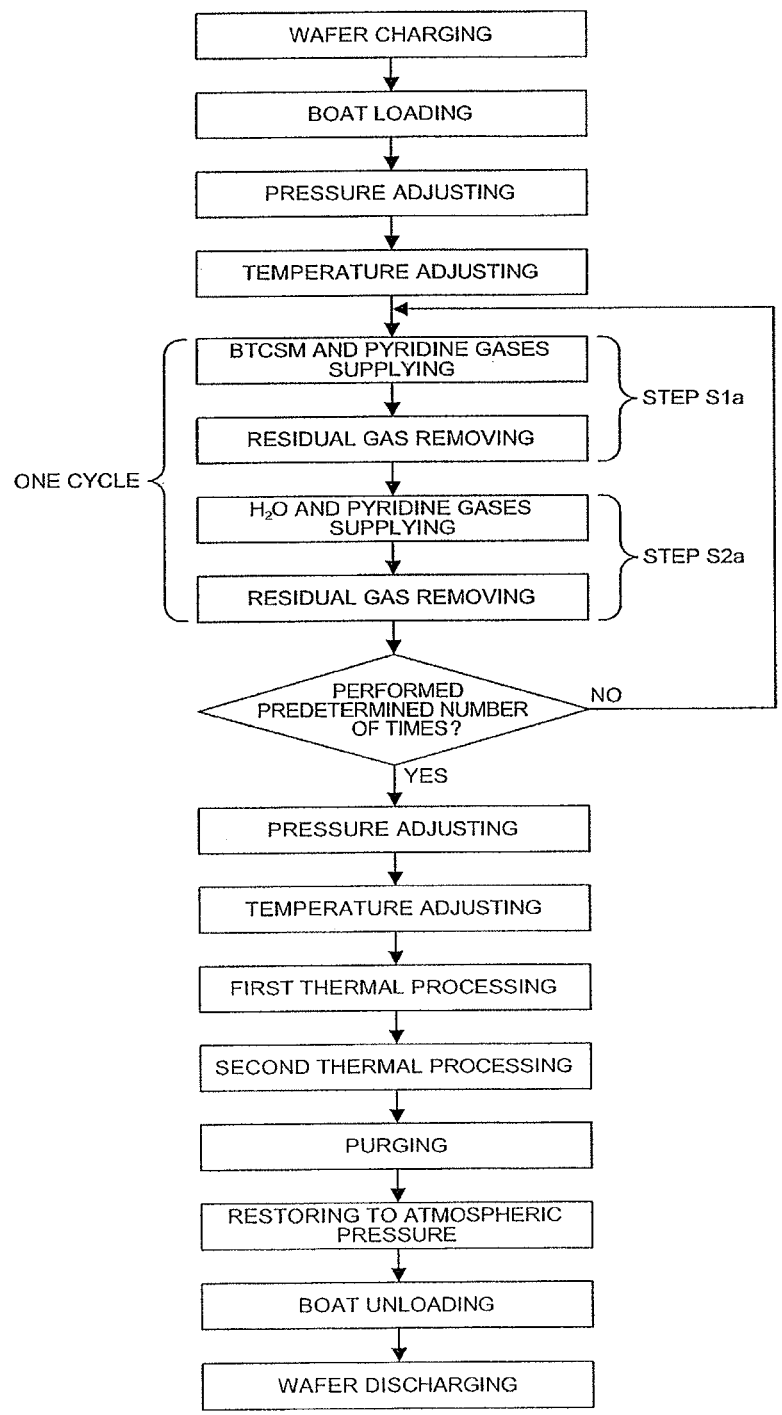
FIG. 4 is a flowchart illustrating a film-forming sequence according to the first embodiment of the present invention.

Hereinafter, a film-forming sequence according to the present embodiment will be described in detail with reference to FIGS. 4 and 5A.

Here, an example of (a) forming a silicon oxycarbide film (hereinafter, also referred to as a SiOC film) serving as a thin film containing Si, O and C on the wafer 200 by performing a cycle a predetermined number of times (n times), where the cycle includes a process of supplying BTCSM gas serving as a source gas to the wafer 200 while performing a process of supplying a pyridine gas serving as a catalytic gas to the wafer 200 and a process of supplying $H_2O$ gas serving as an oxidizing gas to the wafer 200 while performing a process of supplying the pyridine gas serving as a catalytic gas to the wafer 200, (b) removing a first impurity from the SiOC film by subjecting the SiOC film to thermal processing with a first temperature higher than the temperature of the wafer 200 in the process of forming the SiOC film in the oxygen-free atmosphere generated by supplying $N_2$ gas serving as an oxygen-free gas to the wafer 200, and (c) removing a second impurity different from the first impurity from the SiOC film after the thermal processing with the first temperature by subjecting the SiOC film to the thermal processing with a second temperature not less than the first temperature in the oxygen-free atmosphere generated by supplying N₂ gas serving as an oxygen-free gas to the wafer 200 will be described. Also, the SiOC film is referred to as an SiO film containing C or an SiO film doped with C.

When the term "wafer" is used in this specification, it may refer to the "wafer itself," or a "laminate (an aggregate) of a wafer and a predetermined layer, a film and the like formed on a surface thereof," that is, the wafer refers to a wafer including a predetermined layer, a film and the like formed on a surface thereof. In addition, when the term a "surface of the wafer" is used in this specification, it may refer to a "surface (an exposed surface) of the wafer itself" or a "surface of a predetermined layer, a film and the like forming on the wafer, that is, the outermost surface of the wafer laminate."

Therefore, when it is described in this specification that a "predetermined gas is supplied to the wafer," it may mean that a "predetermined gas is directly supplied to a surface (an exposed surface) of the wafer itself" or a "predetermined gas is supplied to a layer, a film and the like formed on the wafer, that is, to the outermost surface of the wafer laminate." In addition, when it is described in this specification that a "predetermined layer (or film) is formed on the wafer," it may mean that a "predetermined layer (or film) is directly formed on a surface (an exposed surface) of the wafer itself" or a "predetermined layer (or film) is formed on a layer, a film and the like formed on the wafer, that is, a predetermined layer (or film) is formed on the outermost surface of the wafer laminate."

The term "substrate" used in this specification is the same as the term "wafer" used in this specification, and thus, the term "wafer" in the above description may be replaced by the term "substrate."

(Wafer Charging and Boat Loading)

When the plurality of wafers 200 are loaded onto the boat 217 (wafer charging), as illustrated in FIG. 1, the boat 217 that supports the plurality of wafers 200 is lifted by the boat elevator 115 and loaded onto the process chamber 201. In this state, the seal cap 219 seals the lower end of the manifold 209 through the O-ring 220b.

(Pressure and Temperature Adjusting)

The process chamber 201 is vacuum-exhausted by the vacuum pump 246 such that the inner pressure of the process chamber 201 reaches a desired pressure (a degree of vacuum). In this case, the inner pressure of the process chamber 201 is measured by the pressure sensor 245, and the APC valve 244 is feedback controlled based on information on the measured pressure (pressure adjusting). The vacuum pump 246 is in operation at least until processing on the wafer 200 is completed. Also, the inside of the process chamber 201 is heated by the heater 207 such that the wafer 200 in the process chamber 201 reaches a desired temperature. In this case, power supplied to the heater 207 is feedback controlled based on information on the temperature detected by the temperature sensor 263 such that the inside of the process chamber 201 has a desired temperature distribution (temperature adjusting). The heating of the inside of the process chamber 201 by the heater 207 is continuously performed at least until the processing on the wafer 200 is completed. However, as described later, when the processing on the wafer 200 is performed at room temperature, the inside of the process chamber 201 may not be heated by the heater 207. Then, the rotating mechanism 267 begins to rotate the rotation of the boat 217 and the wafer 200. The rotation of the boat 217 and the wafer 200 by the rotating mechanism 267 is continuously performed at least until the processing on the wafer 200 is completed.

(SiOC Film Forming Process)

Then, the following two steps, that is, steps S1a and S2a are performed sequentially.

[Step S1a] (BTCSM and Pyridine Gases Supplying)

The BTCSM gas is supplied into the gas supply pipe 232a by opening the valve 243a. The BTCSM gas is supplied into the process chamber 201 through the gas supply holes 250a with a flow rate thereof being adjusted by the MFC 241a, and is exhausted through the exhaust pipe 231. In this case, the BTCSM gas is supplied to the wafer 200 (BTCSM gas supplying). At the same time, an inert gas such as N₂ gas and the like is supplied into the gas supply pipe 232j by opening the valve 243j. The N₂ gas is supplied into the process chamber 201 with the BTCSM gas with a flow rate thereof being adjusted by the MFC 241j, and is exhausted through the exhaust pipe 231.

Also, the pyridine gas is supplied into the gas supply pipe 232c by opening the valve 243c. The pyridine gas is supplied into the process chamber 201 through the gas supply holes 250c with a flow rate thereof being adjusted by the MFC 241c, and is exhausted through the exhaust pipe 231. In this case, the pyridine gas is supplied to the wafer 200 (pyridine gas supplying). At the same time, an inert gas such as N₂ gas and the like is supplied into the gas supply pipe 232l by opening the valve 243l. The N₂ gas is supplied into the process chamber 201 with the pyridine gas with a flow rate thereof being adjusted by the MFC 241l, and is exhausted through the exhaust pipe 231.

Also, in order to prevent the BTCSM gas and the pyridine gas from being introduced into the buffer chamber 237 or the nozzle 249b, the N₂ gas is supplied into the gas supply pipe 232k by opening the valve 243k. The N₂ gas is supplied into the process chamber 201 through the nozzle 249b and the buffer chamber 237, and is exhausted through the exhaust pipe 231.

At the same time, the APC valve 244 is appropriately adjusted such that the inner pressure of the process chamber 201 ranges from 1 Pa to 13,330 Pa, and preferably from 133 Pa to 2,666 Pa. The flow rate of the BTCSM gas controlled by the MFC 241a ranges from 1 sccm to 2,000 sccm, and preferably from 10 sccm to 1,000 sccm. The flow rate of the pyridine gas controlled by the MFC 241c ranges from 1 sccm to 2,000 sccm, and preferably from 10 sccm to 1,000 sccm. Each of the flow rates of the N₂ gas controlled by the MFCs 241j through 241l ranges from 100 sccm to 10,000 sccm. The time duration during which the BTCSM gas and the pyridine gas are supplied to the wafer 200, i.e., a gas supply time duration (supplying time) ranges from 1 second to 100 seconds, and preferably from 5 seconds to 60 seconds.

At the same time, a temperature of the heater 207 is set such that a temperature of the wafer 200 ranges from room temperature to 150° C., preferably from room temperature to 100° C., and more preferably from 50° C. to 100° C. In the case in which the BTCSM gas is supplied and the catalytic gas is not supplied, when the temperature of the wafer 200 is less than 250° C., BTCSM is difficult to be chemically adsorbed on the wafer 200, and thus a practical film-forming rate may not be obtained. As in the present embodiment, even when the temperature of the wafer 200 is less than 250° C., it is possible to address the problem by supplying the pyridine gas serving as a catalytic gas. When the temperature of the wafer 200 is 150° C. or less in the pyridine gas, and preferably 100° C. or less, an amount of heat applied to the wafer 200 may be reduced, and thus a control of the thermal history of the wafer 200 may be performed satisfactorily. When the temperature of the wafer 200 is room temperature or more in the pyridine gas, BTCSM is sufficiently adsorbed on the wafer 200, and thus a sufficient film-forming rate may be obtained. Therefore, the temperature of the wafer 200 ranges from room temperature to 150° C., preferably from room temperature to 100° C., and more preferably from 50° C. to 100° C.

A silicon-containing layer that contains C and Cl and has a thickness of, for example, about less than one atomic layer to several atomic layers, is formed on the wafer 200 [a base film of the surface] as a first layer by supplying the BTCSM gas to the wafer 200 under the above-described conditions. The silicon-containing layer containing C and Cl may include one or both of an Si layer containing C and Cl and an adsorption layer of BTCSM gas.

The Si layer containing C and Cl is collectively referred to as a continuous layer that is constituted by Si and contains C and Cl, a discontinuous layer containing C and Cl or an Si thin film formed by overlapping thereof. The continuous layer that is constituted by Si and contains C and Cl may also be referred to as an Si thin film containing C and Cl. The Si included in the Si layer containing C and Cl includes Si whose bond with Cl is not broken completely and Si whose bond with Cl is broken completely.

The adsorption layer of BTCSM gas includes an adsorption layer in which molecules of BTCSM gas are discontinuous as well as an adsorption layer in which the molecules of BTCSM gas are continuous. That is, the adsorption layer of BTCSM gas includes an adsorption layer that is formed of the BTCSM molecules and has a thickness of one molecular layer or less than one molecular layer. The BTCSM [$(SiCl_3)_2CH_2$] molecules forming the adsorption layer of BTCSM gas may have molecules in which a bond between Si and C is partially broken or a chemical formula in which a bond between Si and C is partially broken as well as the chemical formula illustrated in FIG. 14A. That is, the adsorption layer of BTCSM gas includes a chemical adsorption layer of BTCSM molecules or a physical adsorption layer of BTCSM molecules.

Here, "layer having a thickness of less than one atomic layer" refers to a discontinuously formed atomic layer. "Layer having a thickness of one atomic layer" refers to a continuously formed atomic layer. "Layer having a thickness of less than one molecular layer" refers to a discontinuously formed molecular layer. "Layer having a thickness of one molecular layer" refers to a continuously formed molecular layer. The silicon-containing layer containing C and Cl may include both of the Si layer containing C and Cl and the adsorption layer of BTCSM gas. However, as described above, the silicon-containing layer containing C and Cl is represented using an expression such as "one atomic layer" or "several atomic layers."

When a thickness of the silicon-containing layer containing C and Cl which is the first layer formed on the wafer 200 is greater than that of several atomic layers, an oxidation action in step S2a to be described later does not influence the entire first layer. Also, a minimum thickness of the first layer that may be formed on the wafer 200 is less than one atomic layer. Therefore, the thickness of the first layer is preferably set to about less than one atomic layer to several atomic layers. When the thickness of the first layer is set to one atomic layer or less, that is, one atomic layer or less than one atomic layer, an effect of an oxidation action in step S2a to be described later may relatively increase and a time required for the oxidation action in step S2a may be reduced. A time required for forming the first layer in step S1a may also be reduced. As a result, it is possible to reduce a processing time for one cycle and a total processing time may thus be reduced. That is, it is possible to increase the film-forming rate. Also, when the thickness of the first layer is set to one atomic layer or less, it is possible to increase the controllability of film thickness uniformity.

Under conditions in which BTCSM gas is self-decomposed (pyrolyzed), that is, conditions causing a pyrolysis reaction of BTCSM, when Si is deposited on the wafer 200, the Si layer containing C and Cl is formed. Under conditions in which BTCSM gas is not self-decomposed (pyrolyzed), that is, conditions do not cause a pyrolysis reaction of BTCSM, when BTCSM gas is adsorbed onto the wafer 200, the adsorption layer of BTCSM gas is formed. The formation of the Si layer containing C and Cl on the wafer 200 is preferable since a film formation rate is higher when the Si layer containing C and Cl is formed on the wafer 200 than when the adsorption layer of BTCSM gas is formed on the wafer 200. However, according to the present embodiment, since the temperature of the wafer 200 is set to, for example, 150° C. or less, forming the adsorption layer of BTCSM gas on the wafer 200 may be better than the formation of the Si layer containing C and Cl on the wafer 200. Also, when the catalytic gas is not supplied, binding the surface of the wafer 200 to a base or binding between the BTCSM molecules in the adsorption layer of BTCSM gas may be better in physical adsorption than in chemical adsorption. That is, when the catalytic gas is not supplied, most of the adsorption layer of BTCSM gas may be formed to a physical adsorption layer of BTCSM gas.

Figure 6A:
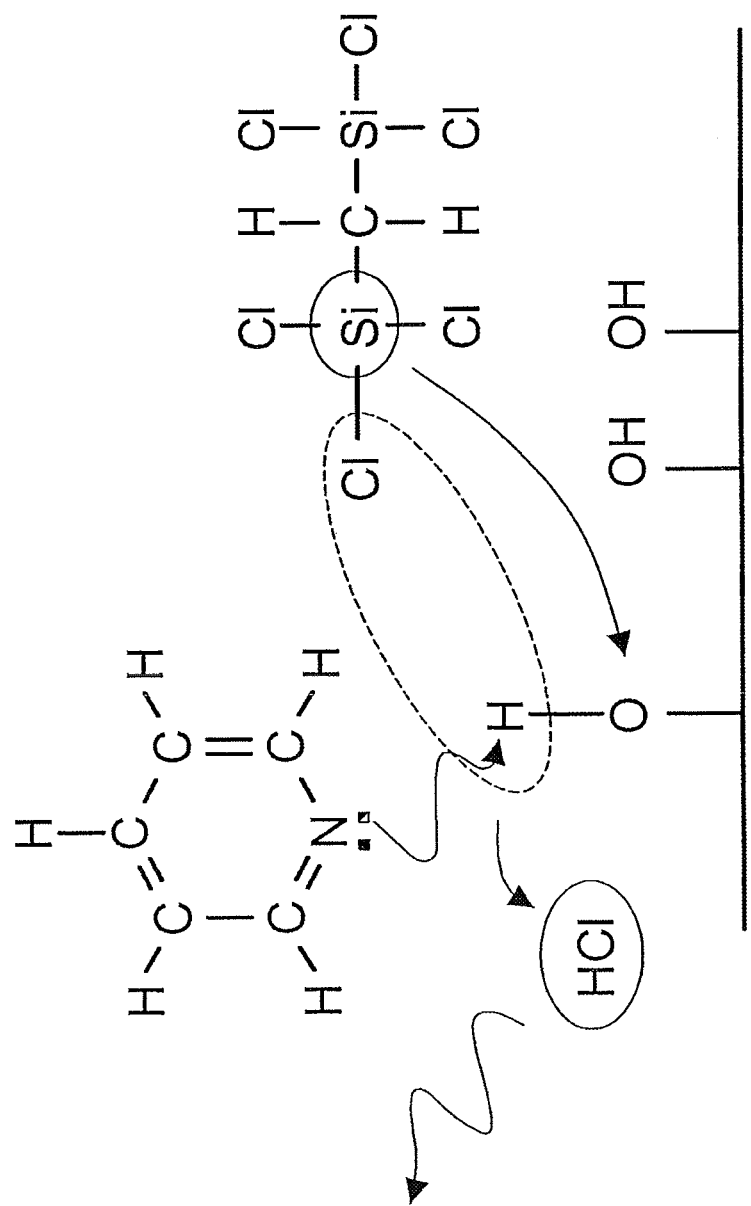
FIGS. 6A and 6B are explanatory diagrams of the catalysis reaction in a thin film forming process according to the first embodiment of the present invention, where

The pyridine gas serving as a catalytic gas weakens a bonding force of an O—H bond present on the surface of the wafer 200, and thus promotes the decomposition of the BTCSM gas and the formation of the first layer by the chemical adsorption of BTCSM molecules. That is, as illustrated in FIG. 6A, the bonding force between O—H is weakened by acting the pyridine gas serving as a catalytic gas to the O—H bond present on the surface of the wafer 200. Hydrogen chloride (HCl) gas is generated and desorbed by the reaction of H of which bonding force is weakened and Cl of the BTCSM gas, and BTCSM molecules (halide) from which Cl is desorbed are chemically adsorbed on the surface of the wafer 200 and the like. That is, a chemical adsorption layer of BTCSM gas is formed on the surface of the wafer 200. The weakening of the bonding force between O—H by the pyridine gas is because an N atom having a lone pair in the pyridine molecule acts to pull H. An indicator of the size of the action of a predetermined compound containing an N atom pulling H may be, for example, the above-described acid dissociation constant (pKa).

As described above, pKa is a constant which indicates an equilibrium constant Ka in the dissociation reaction in which a hydrogen ion is released into an acid by a negative common logarithm, and a compound having a large pKa has a strong pulling force for H. For example, the decomposition of the BTCSM gas may be promoted using a compound with a pKa of 5 or more, and the formation of the first layer may be promoted. Meanwhile, when the pKa of the catalytic gas is excessively large, Cl drawn from the BTCSM molecules and the catalytic gas are combined, salt (ion compound) such as ammonium chloride ($NH_4Cl$) and the like is generated, and particles may be caused. In order to suppress the generation of salt, the pKa of the catalytic gas is preferably set to 11 or less, and preferably, 7 or less. The pyridine gas has a relatively large pKa of about 5.67, and a strong pulling force for H. Also, since the pKa is 7 or less, the particles also do not also occur.

As described above, the decomposition of the BTCSM gas is promoted even at a temperature of 150° C. or less by supplying the pyridine gas serving as a catalytic gas with the BTCSM gas, and the first layer in which the formation of the chemical adsorption layer of the BTCSM gas is dominant than the formation of the physical adsorption layer thereof may be formed.

Also, as described above, C may be added into the first layer even at a relatively low temperature of 150° C. or less using a source gas containing silicon, carbon and a halogen element such as a BTCSM gas and the like and having a Si—C bond. The first layer containing C is oxidized in step S2a performed thereafter, and a silicon oxycarbide layer (a SiOC layer) containing C with a high concentration or a SiOC film containing C with a high concentration and which is formed by stacking the SiOC layer may be formed. Also, the C concentration in the SiOC layer or the SiOC film may be controlled accurately.

A wet etching rate (hereinafter, referred to as WER) with respect to hydrofluoric acid (1% HF aqueous solution) of a 1% concentration of the SiO film obtained using the catalytic gas at a low temperature is about 600 Å/min. The WER of the SiO film obtained using plasma at a low temperature is about 200 Å/min. The WER of the SiO film formed at the low temperature is equal to or more than three times the WER of a thermal oxidation film obtained by thermally oxidizing a silicon wafer in an oxidation furnace is about 60 Å/min. Such a high-valued WER indicates that the etching resistance of the SiO film is lower than that of the thermal oxidation film. In order to improve the etching resistance, for example, it is preferable that the SiO film containing C and the like, that is, the SiOC film, be formed.

At a relatively high temperature, for example, in a range from 600° C. to 800° C., the SiOC film may be formed in the following manner. For example, a silicon-containing layer or an SiOC layer in which C is added to the SiO layer is formed by performing a process of supplying a hydrocarbon-based gas such as propylene ($C_3H_6$) gas and the like by exciting, by heat or plasma, the wafer 200 with a process of forming a silicon-containing layer using HCDS gas, BDEAS gas or the like or a process of forming a silicon oxide layer (an SiO layer) by oxidizing the silicon-containing layer with an oxidizing gas, and as a result, an SiOC film may be formed.

However, as the present embodiment, when the film forming is performed at a relatively low temperature, for example, 150° C. or less, since C is difficult to add to the layer, it is difficult to form the SiOC film. That is, since a sufficient carbon concentration (a C concentration) is not obtained from the formed thin film, the SiO film almost not containing C may be formed. Because of this, it is difficult to sufficiently increase the etching resistance.

Therefore, according to the present embodiment, a source gas containing an alkylenehalosilane-based source gas such as BTCSM gas serving as a source gas, that is, Si, C and a halogen element and having an Si—C bond is used. Thus, C may be added to the first layer in an operation of forming the first layer serving as an initial layer on the wafer 200, and thus the SiOC layer or the SiOC film having the sufficient C concentration may be formed. Also, the C concentration in the SiOC layer or the SiOC film may be controlled accurately.

(Residual Gas Removing)

After the silicon-containing layer containing C and Cl which is the first layer is formed on the wafer 200, the supply of BTCSM gas is stopped by closing the valve 243a. The supply of the pyridine gas is also stopped by closing the valve 243c. In this case, the inside of the process chamber 201 is vacuum-exhausted by the vacuum pump 246 by opening the APC valve 244 of the exhaust pipe 231, and an unreacted gas remaining in the process chamber 201 or the BTCSM gas and the pyridine gas that have contributed to the formation of the first layer is removed from the inside of the process chamber 201 (residual gas removing). Also, $N_2$ gas which is an inert gas is supplied into the process chamber 201 by opening the valves 243j through 243l. The $N_2$ gas serves as a purge gas, and contributes to the effective removal of the unreacted gas remaining in the process chamber 201 or the BTCSM gas and the pyridine gas that have contributed to the formation of the first layer from the inside of the process chamber 201.

In this case, a gas remaining in the process chamber 201 may not be removed completely and the inside of the process chamber 201 may not be purged completely. When an amount of gas remaining in the process chamber 201 is small, there is no adverse effect on step S2a performed thereafter. There is no need to set a flow rate of $N_2$ gas supplied into the process chamber 201 to be high. For example, when the same amount of $N_2$ gas as a volume of the reaction tube 203 [the process chamber 201] is supplied, it is possible to purge to the extent that there is no adverse effect on step S2a. When the inside of the process chamber 201 is not purged completely, a purge time decreases, thereby improving throughput. It is possible to suppress an unnecessary consumption of $N_2$ gas to a minimum.

The source gas containing silicon, carbon and a halogen element and having an Si—C bond may include BTCSE gas, TCDMDS gas and DCTMDS gas as well as BTCSM gas. The source gas may include a ring-shaped amine-based gas such as aminopyridine gas, picoline gas, lutidine gas, piperazine gas, piperidine gas and the like and a non-amine-based gas such as TEA gas, DEA gas, MEA gas, TMA gas, MMA gas and the like as well as the pyridine gas which is the catalytic gas. The inert gas may include rare gases such as Ar gas, He gas, Ne gas, Xe gas and the like as well as $N_2$ gas.

[Step S2a] ($H_2O$ and Pyridine Gases Supplying)

After the step S1a is completed and the gas remaining in the process chamber 201 is removed, $H_2O$ gas is supplied into the gas supply pipe 232b by opening the valve 243b. The $H_2O$ gas is supplied into the buffer chamber 237 through the gas supply holes 250b and into the process chamber 201 through the plurality of gas supply holes 250d with a flow rate thereof being adjusted by the MFC 241b, and is exhausted through the exhaust pipe 231. In this case, the $H_2O$ gas is supplied to the wafer 200 in non-plasma atmosphere ($H_2O$ gas supplying). At the same time, $N_2$ gas which is an inert gas is supplied into the gas supply pipe 232k by opening the valve 243k. The $N_2$ gas is supplied into the process chamber 201 with the $H_2O$ gas with a flow rate thereof being adjusted by the MFC 241k, and is exhausted through the exhaust pipe 231.

Also, the pyridine gas is supplied to the wafer 200 similarly to when the pyridine gas is supplied in the step S1a (pyridine gas supplying).

In order to prevent the $H_2O$ gas and the pyridine gas from being introduced into the nozzle 249a, $N_2$ gas is supplied into the gas supply pipe 232j by opening the valve 243j. The $N_2$ gas is supplied into the process chamber 201 through the nozzle 249a, and is exhausted through the exhaust pipe 231.

The APC valve 244 is appropriately adjusted such that the inner pressure of the process chamber 201 ranges from 1 Pa to 13,330 Pa, and preferably from 133 Pa to 2,666 Pa. The flow rate of the $H_2O$ gas controlled by the MFC 241b ranges from 1,000 sccm to 10,000 sccm, and preferably from 10 sccm to 1,000 sccm. The flow rate of the pyridine gas controlled by the MFC 241c ranges from 1 sccm to 2,000 sccm, and preferably from 10 sccm to 1,000 sccm. Each of the flow rates of the $N_2$ gas controlled by the MFCs 241j through 241l ranges from 100 sccm to 10,000 sccm. The time duration during which the $H_2O$ gas and the pyridine gas are supplied to the wafer 200, i.e., a gas supply time duration (supplying time) ranges from 1 second to 100 seconds, and preferably from 5 seconds to 60 seconds. The temperature of the heater 207 is set such that the temperature of the wafer 200 is set to within the same temperature range as the temperature of the wafer 200 in the step S1a, i.e., from room temperature to 150° C., preferably from room temperature to 100° C., and more preferably from 50° C. to 100° C.

The $H_2O$ gas supplied into the process chamber 201 is activated by heat, and is exhausted through the exhaust pipe 231. In this case, the $H_2O$ gas activated by heat is supplied to the wafer 200. That is, the gas supplied into the process chamber 201 is the $H_2O$ gas activated by heat, and the BTCSM gas is not supplied into the process chamber 201. Therefore, the $H_2O$ gas does not cause a gas-phase reaction, is supplied to the wafer 200 in an activated state, and reacts with at least a part of the first layer (the silicon-containing layer containing C and Cl) formed on the wafer 200 in step S1a. Therefore, the first layer is thermally oxidized in non-plasma atmosphere, and is changed to the second layer containing Si, O and C, that is, an SiOC layer.

Figure 6B:
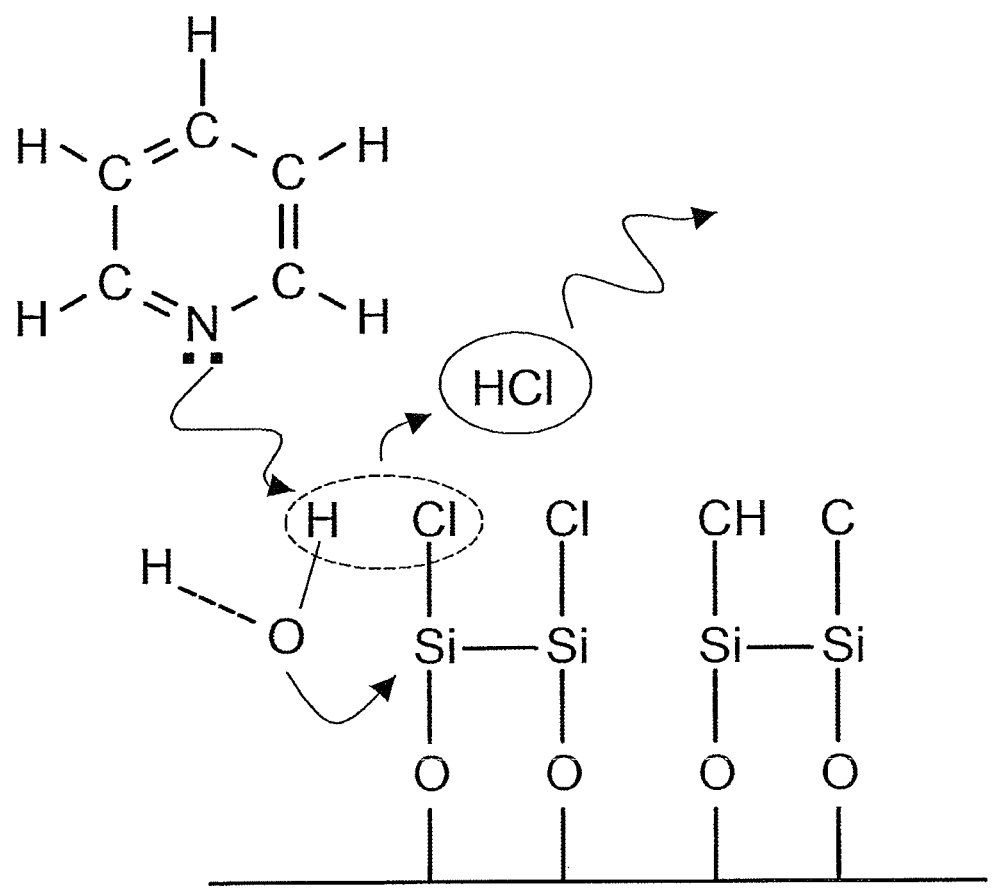

The pyridine gas which is a catalytic gas weakens the binding force of an O—H bond included in the $H_2O$ gas to promote the decomposition of the $H_2O$ gas and the reaction of the $H_2O$ gas and the first layer. That is, as illustrated in FIG. 6B, the pyridine gas which is the catalytic gas reacts with the O—H bond included in the $H_2O$ gas to weaken the binding force between O and H. When the H of which the binding force is weakened reacts with the Cl included in the first layer formed on the wafer 200, HCl gas is generated and desorbed, O of the $H_2O$ gas from which H is desorbed, and Cl is desorbed, and at least a part of the C is combined with the Si of the first layer.

Also, in a process of supplying $H_2O$ gas (a process of supplying $H_2O$ gas and pyridine gas) which supplies the pyridine gas, a supply amount of the pyridine gas may be appropriately adjusted according to a desired film composition. When the supply amount of the pyridine gas is increased, the oxidizing power of the $H_2O$ gas is increased by increasing the action of the pyridine gas, the Si—C bond is cut and C desorption is facilitated, and as a result, the C concentration of the SiOC layer is decreased. When the supply amount of the pyridine gas is decreased, the oxidizing power of the $H_2O$ gas is decreased by decreasing the action of the pyridine gas, the Si—C bond is maintained easily, and as a result, the C concentration of the SiOC layer is increased. Therefore, the C concentration, a silicon concentration (a Si concentration), an oxygen concentration (an O concentration) or the like in the SiOC layer, and further in the SiOC film formed by stacking the SiOC layer is relatively changed by appropriately adjusting the supply amount of the pyridine gas.

Also, the adjusting of the supply amount of the catalytic gas in a process of supplying an oxidizing gas (a process of supplying an oxidizing gas and a catalytic gas) while supplying the catalytic gas and the adjusting of the supply amount of the catalytic gas in a process of supplying a source gas (a process of supplying a source gas and a catalytic gas) while supplying the above-described catalytic gas may be individually and separately performed. That is, the supply amounts of the catalytic gases in both processes may be adjusted to be the same or to be different.

Also, it is easy to adjust the supply amount of the catalytic gas by preparing a plurality of process recipes (a program in which processing sequences or processing conditions are described) in which the supply amount of the catalytic gas or the flow rate thereof is changed. An operator may perform the film forming process by selecting the process recipe according to the desired film composition.

An impurity (a first impurity) such as water ($H_2O$) and chlorine (Cl) or a hydrocarbon-based ($C_xH_y$) impurity (a second impurity) such as a hydrocarbon compound is easily added to the SiOC layer formed at a temperature of 150° C. or less. Therefore, a large amount of the impurities such as moisture ($H_2O$) or Cl or the hydrocarbon-based impurities may be included in the SiOC film formed by stacking the SiOC layer. The impurity such as moisture may be derived from the $H_2O$ gas serving as the oxidizing gas or moisture introduced from outside when the wafer 200 is loaded into the process chamber 201. The impurity such as Cl may be derived from Cl in the BTCSM molecule. The hydrocarbon-based impurity may be derived from C and H in the BTCSM molecule or C and H in the pyridine molecule. That is, a part of the pyridine may also be decomposed. When the part of the pyridine is decomposed, the pyridine changes a reaction velocity. However, since the part thereof is changed before and after the chemical reaction, in the proper sense of the word, the pyridine is not a catalyst. However, even in this case, most of the pyridine is not decomposed. That is, even in this case, since the pyridine changes the reaction velocity and most of the pyridine is not decomposed, the pyridine substantially acts as a catalyst. In this specification, as the pyridine in the reaction system according to the present embodiment, a material substantially acts as a catalyst, in which the part thereof is decomposed and most thereof, is not decomposed is referred to as a catalyst.

(Residual Gas Removing)

Then, the supply of the $H_2O$ gas is stopped by closing the valve 243b. The supply of the pyridine gas is also stopped by closing the valve 243c. In this case, the inside of the process chamber 201 is exhausted by the vacuum pump 246 by opening the APC valve 244 of the exhaust pipe 231, and an unreacted gas remaining in the process chamber 201 or the $H_2O$ gas, the pyridine gas or reaction by-products that have contributed to reaction is removed from the inside of the process chamber 201 (residual gas removing). Also, $N_2$ gas which is an inert gas is supplied into the process chamber 201 by opening the valves 243j through 243l. The $N_2$ gas serves as a purge gas, and contributes to the effective removal of an unreacted gas remaining in the process chamber 201 or the $H_2O$ gas, the pyridine gas or the reaction by-products that have contributed to the formation of the second layer from the process chamber 201.

In this case, a gas remaining in the process chamber 201 may not be removed completely and the inside of the process chamber 201 may not be purged completely. When an amount of the gas remaining in the process chamber 201 is small, there is no adverse effect on step S1a performed thereafter. There is no need to set a flow rate of $N_2$ gas supplied into the process chamber 201 to be high. For example, when the same amount of $N_2$ gas as a volume of the reaction tube 203 [the process chamber 201] is supplied, it is possible to purge to the extent that there is no adverse effect on step S1a. When the inside of the process chamber 201 is not purged completely, a purge time decreases, thereby improving throughput. It is possible to suppress an unnecessary consumption of $N_2$ gas to a minimum.

The oxidizing gas may include a mixture gas of hydrogen peroxide ($H_2O_2$) gas, hydrogen ($H_2$) gas and oxygen ($O_2$)

gas and a mixture gas of hydrogen ($H_2$) gas and ozone ($O_3$) gas as well as $H_2O$ gas. Also, the oxidizing gas may include a gas not containing hydrogen (H), that is, $O_2$ gas or the like. The catalytic gas may include the above-described various types of amine-based gases or non-amine-based gases as well as the pyridine gas. The inert gas may include the above-described various types of rare gases as well as $N_2$ gas.

Also, comprehensively considering the gas system and conditions of the present embodiment, the inventors have considered that pyridine gas is preferably used as the catalytic gas in each process. Next, TEA gas is preferable, and next piperidine gas is preferable.

(Performing a Predetermined Number of Times)

When a cycle in which the above-described step S1a and step S2a are performed once or more, that is, are performed a predetermined number of times (n times), a SiOC film having a predetermined composition and a predetermined film thickness is formed on the wafer 200. The above-described cycle is preferably repeated multiple times. That is, the thickness of the SiOC layer formed when the cycle is performed once is set to be smaller than a desired film thickness, and the above-described cycle is preferably repeated multiple times to obtain the desired film thickness.

In this case, it is possible to finely adjust each element component in the SiOC layer, that is, ratios of an Si component, an O component and a C component, that is, the Si concentration, the O concentration and the C concentration by controlling process conditions such as the inner pressure of the process chamber 201, the gas supply time duration and the like in each step. Therefore, it is possible to control a composition ratio of the SiOC film more precisely.

Also, in the case in which the cycle is performed multiple times, when it is described that a "predetermined gas is supplied to the wafer 200" in each step at least after a second cycle, it means that a "predetermined gas is supplied to the layer formed on the wafer 200, that is, to the outermost surface of the wafer 200 as the laminate." When it is described that a "predetermined layer is formed on the wafer 200," it means that a "predetermined layer is formed on the layer formed on the wafer 200, that is, on the outermost surface of the wafer 200 as the laminate." Also, these are the same as in the above descriptions and will be the same as in other embodiments to be described later.

(Modification Process of SiOC Film)

The SiOC film formed as described above is a film formed at a temperature of 150° C. or less, and as described above, for example, an impurity such as moisture or Cl or a hydrocarbon-based impurity may be mixed into the SiOC film. When the impurity is mixed into the SiOC film, the etching resistance of the SiOC film may be degraded, the dielectric constant thereof may be increased, and thus an effect in which C is added into the film may not be obtained.

Therefore, in the present embodiment, a process of removing a first impurity (an impurity such as moisture and Cl) from the SiOC film by subjecting the SiOC film to thermal processing with a first temperature higher than a temperature of the wafer 200 in the process of forming the SiOC film (a first thermal processing process); and a process of removing a second impurity (a hydrocarbon-based impurity) different from the first impurity from the SiOC film after the thermal processing with the first temperature by subjecting the SiOC film to the thermal processing with a second temperature not less than the first temperature (a second thermal processing process) are performed, and at least two steps of a modification process in which a plurality of impurities in the SiOC film are removed are performed.

Hereinafter, an example of a sequence of the modification process of the SiOC film will be described.

(Pressure and Temperature Adjusting)

The process chamber 201 is vacuum-exhausted by the vacuum pump 246 while the APC valve 244 is feedback controlled such that the inner pressure of the process chamber 201 becomes a desired pressure (a degree of vacuum) (pressure adjusting). Also, the inside of the process chamber 201 is heated by the heater 207 such that the wafer 200 in the process chamber 201 reaches a desired temperature, that is, the first temperature. In this case, power supplied to the heater 207 is feedback controlled based on information on the temperature detected by the temperature sensor 263 such that the inside of the process chamber 201 has a desired temperature distribution (temperature adjusting). The boat 217 and the wafer 200 are also continuously rotated by the rotating mechanism 267 in this process.

Also, in this case, $N_2$ gas which is an oxygen-free gas is supplied into the process chamber 201, and the inside of the process chamber 201 becomes oxygen-free atmosphere. In this case, $N_2$ gas may be supplied using at least one or all of the inert gas supply pipes 232j through 232l. Here, for example, the $N_2$ gas is supplied using all of the inert gas supply pipes 232j through 232l. That is, the $N_2$ gas is supplied into the inert gas supply pipes 232j through 232l by opening the valves 243j through 243l. The $N_2$ gas supplied into the inert gas supply pipes 232j through 232l is supplied into the process chamber 201 with a flow rate thereof being adjusted by the MFCs 241j through 241l, and is exhausted through the exhaust pipe 231. Therefore, the inside of the process chamber 201 becomes in $N_2$ gas atmosphere, that is, oxygen-free atmosphere. The $N_2$ gas which is an oxygen-free gas acts as a thermal processing gas.

(First Thermal Processing)

When the inside of the process chamber 201 becomes the $N_2$ gas atmosphere having the desired pressure and the temperature of the wafer 200 becomes the desired temperature, that is, the first temperature, the first thermal processing is performed on the SiOC film formed on the wafer 200 while this state is held for a predetermined time.

At the same time, the APC valve 244 is appropriately adjusted such that the inner pressure of the process chamber 201 ranges from Pa to 101,325 Pa (from 1 Torr to 760 Torr), and preferably from 10,132 Pa to 101,325 Pa (from 76 Torr to 760 Torr). Each of the flow rates of the $N_2$ gas controlled by the MFCs 241j through 241l ranges, for example, from 100 sccm to 10,000 sccm. The thermal processing time duration of the SiOC film on the wafer 200 ranges, for example, from 1 minute to 60 minutes, preferably from 1 minute to 30 minutes, and more preferably from 1 minute to 10 minutes.

In this case, the temperature of the heater 207 is set to the first temperature higher than the temperature of the wafer 200, for example, the temperature of the wafer 200 in the above-described process of forming the SiOC film. Specifically, the temperature of the heater 207 is set such that the temperature of the wafer 200 becomes a temperature higher than 150° C., for example, a range from 300° C. to 450° C., preferably from 300° C. to 400° C., and more preferably from 300° C. to 350° C. This temperature range is determined in consideration of not causing unwanted reactions (such as oxidation of the SiOC film) and efficient and sufficient desorption and removal the first impurity such as moisture or Cl from the SiOC film.

Figure 17A:
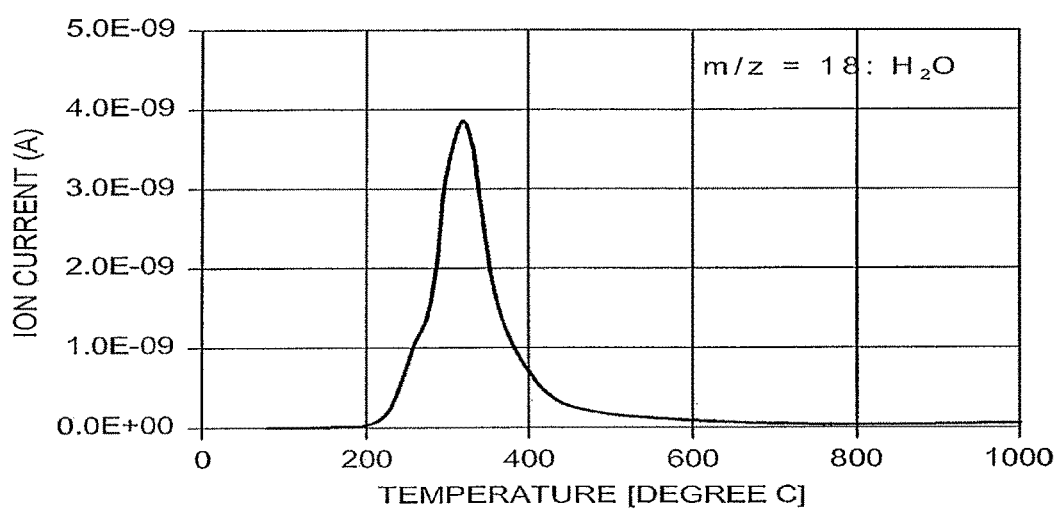
FIGS. 17A through 17C are graphs illustrating desorption spectra of $H_2O$, Cl and $C_2H_2$ by TDS of the SiOC film before the thermal processing formed by the film-forming sequence according to the first embodiment of the present invention, where
Figure 17B:
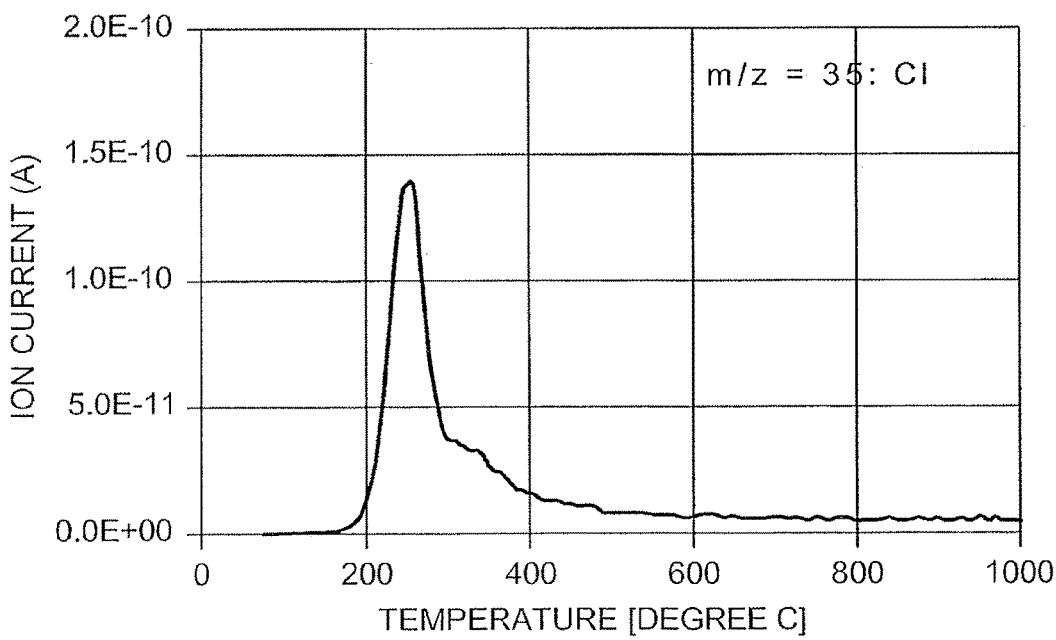

That is, as illustrated in FIGS. 17A and 17B, when the temperature of the wafer 200 is lower than 300° C., it is difficult to desorb and remove the impurity such as moisture ($H_2O$) or Cl, specifically, moisture, from the SiOC film, and thus a modification effect on the SiOC film is degraded. For example, when the temperature of the wafer 200 is 150° C. or less, it may be seen that the impurity such as moisture ($H_2O$) or Cl is hardly desorbed from the SiOC film with reference to FIGS. 17A and 17B. When the temperature of the wafer 200 is 300° C. or more, it is possible to sufficiently desorb the impurity such as moisture ($H_2O$) or Cl from the SiOC film.

However, when the temperature of the wafer 200 is higher than 450° C., the SiOC film may be oxidized by the reaction of moisture ($H_2O$) and Cl when moisture ($H_2O$) or Cl is desorbed from the SiOC film. Shrinkage of the SiOC film is increased by the oxidization of the SiOC film. Also, HCl may be generated when reacting moisture ($H_2O$) and Cl, and a Si—Cl bond, a Si—H bond and the like included in the SiOC film may be separated by the HCl. When these bonds are separated from each other, an unnecessary adsorption site is generated in the SiOC film, and is re-adsorbed to am adsorption site of the material (a desorption material) desorbed from the SiOC film. That is, the material desorbed from the SiOC film is adsorbed to Si having a dangling bond in which these bonds are separated from each other. The bonding of the Si formed in this manner and the desorption material is unstable and weak, and the desorption material remains in the SiOC film as an impurity. As the desorption material, for example, moisture ($H_2O$), Cl, a hydrocarbon-based impurity, a decomposed material thereof or the like may be used.

Figure 17C:
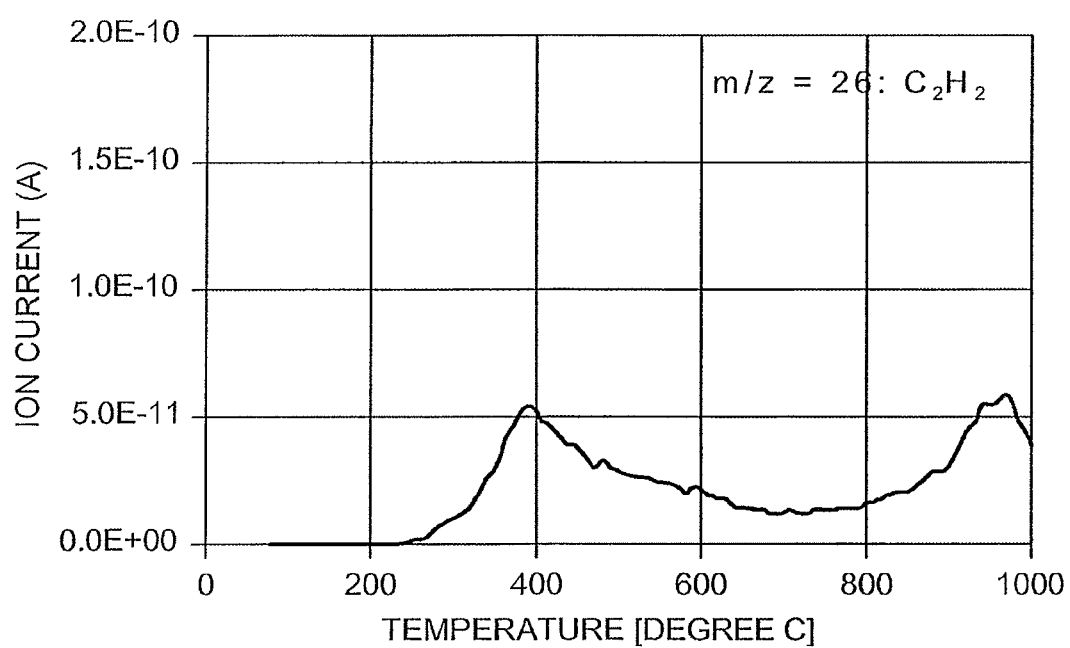

Also, in this temperature range, that is, at a temperature higher than 450° C., as illustrated in FIG. 17C, the hydrocarbon-based impurity is desorbed from the SiOC film, however C is re-adsorbed to the adsorption site in the SiOC film by the reaction of the desorbed hydrocarbon-based impurity and Cl when passing through the SiOC film. That is, by the reaction of the hydrocarbon-based impurity and Cl, C derived from the hydrocarbon-based impurity is adsorbed to any one element (atom) constituting the SiOC film, for example, the dangling bond of Si. The bond of C and Si formed in this manner is unstable and weak, and thus the C derived from the hydrocarbon-based impurity is not a component constituting the SiOC film and remains in the SiOC film as an impurity. Also, when the C is re-adsorbed to the adsorption site in the SiOC film, the C may be re-adsorbed to the adsorption site alone or may be re-adsorbed to the adsorption site in a form of $C_xH_y$.

Therefore, in this temperature range, that is, at the temperature higher than 450° C., the shrinkage of the SiOC film may be increased by the undesired reaction, and the impurity may not be sufficiently desorbed and removed from the SiOC film. As a result, a k value of the SiOC may be reduced sufficiently.

By setting the temperature of the wafer 200 to a temperature of 300° C. or more and 450° C. or less it is possible to desorb and remove the impurity such as moisture ($H_2O$) or Cl from the SiOC film while suppressing an undesired reaction. That is, it is possible to suppress the oxidation of the SiOC film by the reaction of moisture ($H_2O$) and Cl that occurs when moisture ($H_2O$) and Cl are desorbed from the SiOC film and the increase of the shrinkage of the SiOC film. Also, it is possible to suppress the separation of the Si—Cl bond or the Si—H bond in the SiOC film by HCl generated by the reaction of moisture ($H_2O$) and Cl, and to suppress the generation of an unnecessary adsorption site and the re-adsorption of the desorption material to the adsorption site. Also, it is possible to suppress the re-adsorption of C by the reaction of the hydrocarbon-based impurity and Cl desorbed from the SiOC film. Also, as illustrated in FIG. 17C, specifically, an amount of the hydrocarbon-based impurity desorbed when the temperature of the wafer 200 is about 400° C. becomes a peak. Therefore, when the temperature of the wafer 200 is set to 400° C. or less, and preferably 350° C. or less, desorption of the hydrocarbon-based impurity may be suppressed. That is, the amount of the desorbed hydrocarbon-based impurity may be reduced. Therefore, an absolute amount of the hydrocarbon-based impurity desorbed from the SiOC film may be reduced, and thus the re-adsorption of C by the reaction of the hydrocarbon-based impurity and Cl may be further suppressed.

That is, when the temperature of the wafer 200 is set to a temperature in this temperature range, that is, a range from 300° C. to 450° C., the shrinkage of the SiOC film may be reduced, and thus it is possible to suppress the re-adsorption of the desorption material containing C or $C_xH_y$ desorbed from the SiOC film to the adsorption site in the SiOC film, and to sufficiently desorb and remove the impurity, specifically, the impurity such as moisture ($H_2O$) or Cl from the SiOC film.

Also, as described above, when the temperature of the wafer 200 is set to a temperature in this temperature range, that is, a range from 300° C. to 450° C., at least a part of the hydrocarbon-based impurity as well as the impurity such as moisture ($H_2O$) or Cl is desorbed and removed from the SiOC film. Also, when in this temperature range, the re-adsorption of C to the adsorption site in the SiOC film may be suppressed by the reaction of the hydrocarbon-based impurity and Cl desorbed from the SiOC film. That is, when in this temperature range, the re-adsorption of C in the hydrocarbon-based impurity desorbed from the SiOC film to the adsorption site in the SiOC film is suppressed.

Therefore, the temperature of the wafer 200 may preferably range from 300° C. to 450° C. or less, preferably from 300° C. to 400° C., and more preferably from 300° C. to 350° C.

By subjecting the SiOC film to the first thermal processing under the above-described conditions, the impurity such as moisture ($H_2O$) or Cl in the SiOC film may be sufficiently desorbed and removed from the SiOC film while suppressing the above-described undesired reaction. Also, at least a part of the hydrocarbon-based impurity in the SiOC film may be desorbed and removed from the SiOC film while suppressing the above-described undesired reaction. By removing the impurity from the SiOC film, the SiOC film is modified to further increase the etching resistance thereof than that of the SiOC film before being subjected to the first thermal processing, the dielectric constant thereof is reduced, and thus the film quality (film characteristic) of the SiOC film is improved.

However, even after the first thermal processing process is completed, that is, the impurity such as moisture ($H_2O$) or Cl is sufficiently removed from the SiOC film, the hydrocarbon-based impurity may remain in the SiOC film. That is, the impurity such as moisture ($H_2O$) or Cl or the hydrocarbon-based impurity is desorbed and removed from the SiOC film in this temperature range. However, the impurity such as moisture ($H_2O$) or Cl is first removed compared to the hydrocarbon-based impurity and the hydrocarbon-based impurity may still remain in the SiOC film even after the impurity such as moisture ($H_2O$) or Cl is almost removed. In this step, the value of k of the SiOC film may not be sufficiently decreased due to the remaining hydrocarbon-based impurity. Therefore, in a second thermal processing process to be described later, the hydrocarbon-based impurity remaining in the SiOC film is removed from the SiOC film thermal processed with the first temperature by subjecting the SiOC film to the thermal processing with the second temperature greater than or equal to the first temperature. As a result, the value of k of the SiOC film may be sufficiently decreased.

(Second Thermal Processing)

After the first thermal processing is completed, that is, the impurity such as moisture ($H_2O$) or Cl is sufficiently desorbed and removed from the SiOC film, the temperature of the wafer 200 is changed from the first temperature to the second temperature. The second temperature is not less than the first temperature. That is, the second temperature is higher than or equal to the first temperature. The atmosphere in the process chamber 201 is maintained in the $N_2$ gas atmosphere having the desired pressure as the same as in the first thermal processing process.

When the temperature of the wafer 200 reaches the desired temperature, that is, the second temperature, the second thermal processing is performed on the SiOC film on which the first thermal processing is performed while this state is maintained for a predetermined time. That is, the second thermal processing is performed with the second temperature on the SiOC film after the first thermal processing with the first temperature.

At the same time, the APC valve 244 is appropriately adjusted such that the inner pressure of the process chamber 201 ranges from 133 Pa to 101,325 Pa (1 Torr to 760 Torr), and preferably from 10,132 Pa to 101,325 Pa (76 Torr to 760 Torr). Each of the flow rates of the $N_2$ gas controlled by the MFCs 241j through 241l ranges from 100 sccm to 10,000 sccm. The thermal processing time duration of the SiOC film on the wafer 200 ranges from 1 minute to 120 minutes, preferably, from 1 minute to 60 minutes, and more preferably from 1 minute to 30 minutes.

In this case, the temperature of the heater 207 is set such that the temperature of the wafer 200, for example, reaches the second temperature equal to or higher than the first temperature in the above-described first thermal processing process. Specifically, the temperature of the heater 207 is set such that the temperature of the wafer 200 ranges from 300° C. to 900° C., preferably from 350° C. to 700° C., more preferably from 400° C. to 700° C., and preferably from 450° C. to 600° C. This temperature range is determined by considering the sufficient desorption and removal of the hydrocarbon-based impurity which is the second impurity from the SiOC film or the thermal load or thermal history of the wafer 200.

That is, as illustrated in FIG. 17C, when the temperature of the wafer 200 is lower than 300° C., it is difficult to desorb and remove the hydrocarbon-based impurity such as $C_2H_2$ and the like from the SiOC film, and thus the modification effect on the SiOC film is degraded. For example, when the temperature of the wafer 200 is 200° C. or less, it may be seen that the hydrocarbon-based impurity is hardly desorbed from the SiOC film with reference to FIG. 17C. When the temperature of the wafer 200 is 300° C. or more, it is possible to sufficiently desorb and remove the hydrocarbon-based impurity from the SiOC film. However, when the temperature of the wafer 200 is about 300° C., the time taken until the hydrocarbon-based impurity is sufficiently desorbed from the SiOC film may be increased. When the temperature of the wafer 200 is 350° C. or more, it is possible to decrease the time taken until the hydrocarbon-based impurity is sufficiently desorbed from the SiOC film. Also, as illustrated in FIG. 17C, specifically, the amount of the hydrocarbon-based impurity desorbed when the temperature of the wafer 200 is about 400° C. becomes a peak. Therefore, when the temperature of the wafer 200 is set to 400° C. or more, it is possible to promote the desorption of the hydrocarbon-based impurity. That is, the hydrocarbon-based impurity may be efficiently desorbed from the SiOC film. Also, it is possible to further decrease the time taken until the hydrocarbon-based impurity is sufficiently desorbed from the SiOC film.

Also, the impurity such as moisture ($H_2O$) or Cl in the SiOC film is already removed in the second thermal processing process, and thus the above-described undesired reaction does not occur. That is, the undesired reaction such as the oxidation of the SiOC film by the reaction of moisture ($H_2O$) and Cl, the increase in the shrinkage of the SiOC film due to the oxidation, the generation of HCl by the reaction of moisture ($H_2O$) and Cl, the separation of the Si—Cl bond or the Si—H bond in the SiOC film by the HCl, the generation of an unnecessary adsorption site according to the separation, the re-adsorption of the desorption material to the adsorption site, the re-adsorption of C to the adsorption site by the reaction of the hydrocarbon-based impurity and Cl and the like does not occur. This is because the second temperature is within the temperature range in which the undesired reaction may occur (a temperature higher than 450° C.), but the material that generates the undesired reaction (moisture ($H_2O$), Cl and the like) is not generated in the second thermal processing process. Also, even when the temperature of the wafer 200 is 450° C. or more, it is preferable to promote the desorption of the hydrocarbon-based impurity from the SiOC film. When the temperature of the wafer 200 is 450° C. or more, the desorption of the hydrocarbon-based impurity from the SiOC film may be promoted more than when the temperature of the wafer 200 ranges from 300° C. to 350° C.

Also, when the temperature of the wafer 200 is more than 900° C., the thermal load is excessively increased, and thus the characteristic of the semiconductor device formed on the wafer 200 may be influenced. When the temperature of the wafer 200 is at least 900° C. or less, it is possible to suppress the influence on the characteristic due to the thermal load. Also, when the wafer 200 in which the SiOC film which is a thermal processing target is formed is suitable for a memory device, the wafer 200 may withstand heat of about 900° C. Also, when such a wafer 200 is suitable for a logic device, the wafer 200 may withstand heat of about 700° C. When the temperature of the wafer 200 is 600° C. or less, it is easy to more reliably avoid the thermal damage of the device.

Thus, the temperature of the wafer 200 ranges from 300° C. to 900° C., preferably from 350° C. 700° C., more preferably from 400° C. to 700° C., and preferably from 450° C. to 600° C. Also, the second temperature may be the first temperature or more. That is, the second temperature may be higher than or equal to the first temperature. For example, the first temperature may range from 300° C. to 400° C., and the second temperature may range from 450° C. to 600° C. In this case, it is possible to more reliably prevent the above-described undesired reaction. For example, the first temperature and the second temperature may be the same as each other within a range from 400° C. to 450° C. When each of the first temperature and the second temperature ranges from 400° C. to 450° C., it is possible to continuously perform the first thermal processing and the second thermal processing with the same temperature, that is, without a change in the temperature of the wafer 200 while suppressing the above-described undesired reaction.

By subjecting the SiOC film to the second thermal processing under the above-described conditions, the hydrocarbon-based impurity in the SiOC film may be sufficiently desorbed and removed from the SiOC film while suppressing the above-described undesired reaction. By removing the impurity in the SiOC film from the SiOC film, the SiOC film is further modified to further increase the etching resistance thereof than that of the SiOC film after being subjected to the first thermal processing and before being subject to the second thermal processing, the dielectric constant thereof is reduced, and thus the film quality (the film characteristic) of the SiOC film may be further improved. According to the method of the present embodiment, it is confirmed that the dielectric constant (the value of k) of the SiOC film may be reduced to about 2.7.

Therefore, in the present embodiment, first, by subjecting the SiOC film to the thermal processing with the first temperature in which the undesired reaction does not occur, the impurity such as moisture ($H_2O$) or Cl which is the first impurity is removed from the SiOC film without the undesired reaction. After the impurity such as moisture ($H_2O$) or Cl which is the first impurity is removed from the SiOC film, the hydrocarbon-based impurity which is the second impurity is removed from the SiOC film after the thermal processing with the first temperature without the undesired reaction by subjecting the SiOC film to the thermal processing with the second temperature within the temperature range in which the undesired reaction may occur in an atmosphere in which the material that causes the undesired reaction to occur is not present (not generated).

That is, in the present embodiment, first, the impurity such as moisture ($H_2O$) or Cl (the first impurity) which is the material that causes the undesired reaction to occur is removed from the SiOC film without the undesired reaction by subjecting the SiOC film to the thermal processing within the temperature range (with the first temperature) in which the undesired reaction does not occur. Then, after the impurity such as moisture ($H_2O$) or Cl (the first impurity) which is the material that causes the undesired reaction to occur is removed from the SiOC, the thermal processing is performed on the SiOC film within the temperature range (with the second temperature) in which the undesired reaction may occur in atmosphere in which the impurity such as moisture ($H_2O$) or Cl (the first impurity) which is the material that causes the undesired reaction to occur is not present (not generated). The hydrocarbon-based impurity (the second impurity) is removed from the SiOC film after the thermal processing within the temperature range (the first temperature) in which the undesired reaction does not occur, without the undesired reaction.

The thermal processing according to the present embodiment may be referred to as two-stage thermal processing (multi-stage thermal processing). Also, the thermal processing may be referred to as two-stage annealing processing (multi-stage annealing processing), two-stage modification processing (multi-stage modification processing), two-stage impurity removing processing (multi-stage impurity removing processing) or the like.

Also, since the inside of the process chamber 201 is in the oxygen-free atmosphere by the $N_2$ gas which is the oxygen-free gas in the first thermal processing process and the second thermal processing process, even when the thermal processing is performed at a temperature higher than the above-described film-forming temperature, the O concentration in the SiOC film increasing more than a desired concentration, that is, the oxidation of the SiOC film excessively proceeding, may be suppressed. Also, since the inside of the process chamber 201 is in the oxygen-free atmosphere, the C concentration in the SiOC film decreasing less than a desired concentration, that is, C desorbing from the SiOC film by the oxidation proceeding, may be suppressed. In this case, the oxygen-free gas such as $N_2$ gas and the like acts as a thermal processing gas. The $N_2$ gas may also be referred to as a carrier gas for transferring the impurity desorbed from the SiOC film. That is, the oxygen-free gas may promote the discharge of these impurities from the SiOC film or the inside of the process chamber 201, and thus may also serve as an annealing gas for promoting the modification of the SiOC film.

Also, in order to make the inside of the process chamber 201 to the oxygen-free atmosphere, the oxygen-free gas such as $N_2$ gas and the like is not supplied to the wafer 200, the inside of the process chamber 201 may be vacuum-exhausted by the exhaust system, which is an atmosphere generating unit, for generating the oxygen-free atmosphere. Therefore, most of the components including an oxygen (O) component are exhausted and removed from the atmosphere in the process chamber 201. However, as described above, the exhaust of the O component remaining in the process chamber 201 is further promoted by supplying the oxygen-free gas such as $N_2$ gas and the like to the wafer 200 while the inside of the process chamber 201 is exhausted, and thus it is easier to make the inside of the process chamber 201 to the oxygen-free atmosphere. Also, even when an out gas, which is introduced from an inner wall or outside of the process container constituting the process chamber 201 and including the O component from the wafer 200, is generated, it is easy to maintain the oxygen-free atmosphere in the process chamber 201 due to a dilution effect of the $N_2$ gas. Therefore, the oxygen-free atmosphere includes a state in which the O concentration in the atmosphere in the process chamber 201 is low enough not to affect the SiOC film or the processing target.

Also, the modification processing (the annealing processing) of the SiOC film for removing the impurity from the inside of the SiOC film is performed for the thermal processing duration for which the temperature of the wafer 200 is stably maintained at a desired temperature. However, when the temperature of the wafer 200 is increased in the above-described process of adjusting the temperature of the wafer 200 (the process of changing from a film-forming temperature to the first temperature, process of changing from the first temperature to the second temperature and the like), or the temperature of the wafer 200 is decreased in a process of purging the inside of the process chamber 201 to be described later, the modification processing of the SiOC film may proceed while the temperature of the wafer 200 is maintained at a temperature at which the impurity in the SiOC film is removed. Therefore, the process of modifying the SiOC film mainly includes a process of thermal processing the SiOC film, but may refer to at least some duration of the process of adjusting the temperature of the wafer 200 and the process of purging the inside of the process chamber 201. In other words, the process of modifying the SiOC film refers to the duration in which a desired temperature is maintained for a predetermined time after the temperature of the wafer 200 reaches the temperature necessary for the modification processing and right before the reaching a temperature less than required for the modification processing.

Rare gases such as Ar gas, He gas, Ne gas, Xe gas and the like as well as $N_2$ gas which is an oxygen-free gas may be used.

(Purging and Restoring to Atmospheric Pressure)

When the impurity such as moisture ($H_2O$) or Cl or the hydrocarbon-based impurity in the SiOC film is removed from the SiOC film and the process of modifying the SiOC film is performed, $N_2$ gas which is an inert gas is supplied into the process chamber 201 through each of the inert gas supply pipes 232j through 232l by opening the valves 243j through 243l, and is exhausted through the exhaust pipe 231. The $N_2$ gas acts as a purge gas, the inside of the process chamber 201 is purged with the inert gas, the gas remaining in the process chamber 201 or the gas including the material such as the impurity desorbed from the SiOC film is removed from the inside of the process chamber 201 (purging). Then, the atmosphere in the process chamber 201 is replaced by the inert gas (inert gas replication), the inner pressure of the process chamber 201 is restored to atmospheric pressure (restoring to atmospheric pressure).

Also, the temperature of the wafer 200 is decreased such that the temperature of the wafer 200 is set to a temperature of less than 200° C., and preferably about room temperature. That is, the temperature of the wafer 200 is decreased by adjusting power supplied to the heater 207 or by stopping the power supplied to the heater 207. By simultaneously performing the decreasing of the temperature of the wafer 200 and the restoring to the atmospheric pressure, the temperature of the wafer 200 may be decreased to a predetermined temperature in a short period of time due to the cooling effects of the purge gas such as $N_2$ gas.

(Boat Unloading and Wafer Discharging)

Next, the seal cap 219 is lowered by the boat elevator 115 and the lower end of the manifold 209 is opened, and at the same time, the processed wafer 200 is unloaded from the reaction tube 203 through the lower end of the manifold 209 while being supported by the boat 217 (boat unloading). Then, the processed wafer 200 is discharged from the boat 217 (wafer discharging).

(3) Effects of the Present Embodiment

The present embodiment has the following effects.

(a) According to the film-forming sequence of the present embodiment, in the process of forming the SiOC film (in step S1a), the BTCSM gas is supplied while the pyridine gas is supplied to the wafer 200. Thus, it is possible to form a film containing C having a high concentration, that is, an SiOC film having the high C concentration using a source gas containing a predetermined element (Si), C and a halogen element (Cl) and having a chemical bond of the predetermined element (Si) and C (an Si—C bond), specifically, a source gas containing C, Cl and at least two Si in one molecule and having an Si—C bond. Also, the C concentration in the SiOC film may be controlled accurately. Therefore, the SiOC film having high etching resistance may be obtained.

(b) Also, according to the film-forming sequence of the present embodiment, in the SiOC film modifying process, a process of removing the first impurity (the impurity such as moisture ($H_2O$) or Cl) from the SiOC film (the first thermal processing process) by subjecting the SiOC film to the thermal processing with a first temperature higher than the temperature of the wafer 200 in the process of forming the SiOC film and a process of removing the second impurity (the hydrocarbon-based impurity) different from the first impurity from the SiOC film by subjecting the SiOC film to the thermal processing with a second temperature not less than the first temperature are performed. Thus, even when the impurity such as moisture ($H_2O$) or Cl or the hydrocarbon-based impurity is mixed into the SiOC film formed at a temperature of 150° C. or less, the SiOC film may be modified by removing the impurity from the SiOC film. Therefore, the etching resistance of the SiOC film may be improved more than the SiOC film before the modification processing of the SiOC film is performed, and the dielectric constant of the SiOC film may be reduced. That is, the film quality of the SiOC film may be improved.

(c) Also, according to the film-forming sequence of the present embodiment, a porous film may be formed by performing the series of the SiOC film forming process and the SiOC film modifying process. That is, the SiOC film may be porous. At least the Si—C bond and the Si—O bond are present in the SiOC film formed in the SiOC film forming process. A binding distance between Si and C is greater than that between Si and O. Therefore, compared to the $SiO_2$ film, the SiOC film has a distance between atoms increased by introducing the Si—C bond, and film density becomes sparse. Also, when an Si—C—Si bond is present in the SiOC film, the film density becomes sparser. A fine pore, that is, a fine space may be generated in a part in which the film density becomes sparse. That is, the SiOC film formed in the SiOC film forming process is a porous film. Also, when the impurity such as moisture ($H_2O$) or Cl or the hydrocarbon-based impurity is desorbed from the SiOC film in the SiOC film modifying process, a fine pore, that is, a fine space, is generated in a part from which these impurities are removed. That is, the SiOC film modified in the SiOC film modifying process is a film more porous than the SiOC film in the deposited state. Also, it is possible to maintain the SiOC film to be porous by subjecting the SiOC film to the first thermal processing process and the second thermal processing process in the above-described process conditions. Also, when the above-described undesired reaction occurs, the shrinkage of the SiOC film is increased, and it is difficult to maintain the SiOC film to be porous. Therefore, in order to maintain the SiOC film to be porous, the first thermal processing process and the second thermal processing process are preferably performed under the above-described process conditions. As the SiOC film is the porous film, the dielectric constant of the SiOC film may be more reduced than that of the SiOC film in the deposited state before the SiOC film modifying process is performed. That is, the film quality of the SiOC film may be improved.

(d) Also, according to the film-forming sequence of the present embodiment, an SiOC film having a dielectric constant (a k value) smaller than the dielectric constant (the k value) of the $SiO_2$ film may be formed. That is, according to the film-forming sequence of the present embodiment, the porous SiOC film is formed by the SiOC film forming process, and the state is maintained by the SiOC film modifying process as well as the SiOC film being more porous. Also, the impurity such as moisture ($H_2O$) or Cl or the hydrocarbon-based impurity is removed from the SiOC film by the SiOC film modifying process. Since the impurity such as moisture ($H_2O$) has a permanent dipole moment, the impurity is a material in which a direction is changed according to an electric field and the dielectric constant is increased, and the removal of the impurity contributes to decreasing the dielectric constant. Thus, that is, the SiOC film having the dielectric constant lower than the dielectric constant of the $SiO_2$ film may be obtained by the porousness of the SiOC film and the removal of the material which increases the dielectric constant. According to the film-forming sequence of the present embodiment, the dielectric constant of the SiOC film may be reduced to 3.0 or less, specifically, down to 2.68.

Meanwhile, in a transistor or a resistive RAM (ReRAM) or a magnetic RAM (MRAM) developed as a next-generation memory, a thin film such as a silicon carbon nitride film (SiCN film) in which C is added to a silicon nitride film (an SiN film) serving as a thin film which satisfies low temperature film forming, a low WER (a high etching resistance), a low dielectric constant, etc. or a silicon oxycarbonitride film (an SiOCN film) in which O is added to the film may be used. Meanwhile, in order to further improve the etching resistance of the thin film and further decrease the dielectric constant, it is necessary to reduce the N concentration by increasing the C concentration or the O concentration in the film. However, for example, the above-described method in which the film forming is performed by alternately supplying various gases suppresses, for example, the impurity level, by the N concentration at a low temperature, and thus it is difficult to contain C having a high concentration in the film.

In the present embodiment, when forming the SiOC film, the process is performed, for example, at a temperature of 150° C. or less. Even at the low temperature, the C concentration in the thin film may be controlled to be accurately increased using a source gas containing silicon, carbon and Cl and having an Si—C bond.

(4) Modification of the Present Embodiment

Figure 5B:
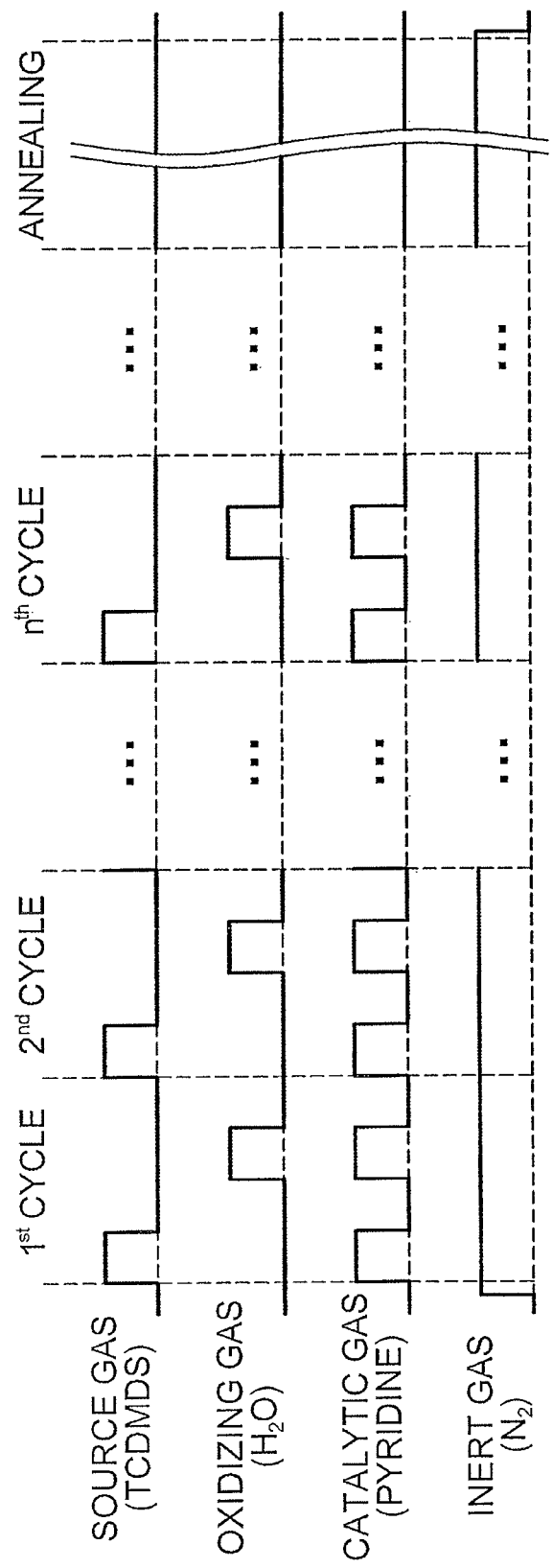

Next, a modification of the present embodiment will be described with reference to FIGS. 5B, 7A and 7B.

(Modification)

In a process of supplying a source gas while supplying the above-described catalytic gas, a C concentration in an SiOC layer and furthermore an SiOC film of formed by stacking the SiOC layer may be controlled by selecting a type of the supplied source gas.

That is, in the process of supplying the source gas while supplying the catalytic gas, the C concentration in the SiOC layer or the SiOC film may be controlled by selecting and supplying a specific source gas from a plurality of types of source gases having different molecular structures.

In order to select and supply the specific source gas from the plurality of types of source gases having different molecular structures, the specific source gas may be supplied by selecting a specific supply line from a plurality of supply lines for supplying the specific source gas from the plurality of types of source gases having molecular structures. As described above, in the example of the film-forming sequence according to the present embodiment, BTCSM gas is supplied as a specific source gas by selecting a BTCSM gas supply line from a BTCSM gas supply line and a TCDMDS gas supply line. Also, as illustrated in FIG. 5B, an example of the film-forming sequence according to the modification of the present embodiment, TCDMDS gas is supplied as a specific source gas by selecting the TCDMDS gas supply line from the BTCSM gas supply line and the TCDMDS gas supply line. Thus, an SiOC film having a C concentration different from the C concentration the SiOC film obtained in the above-described embodiment may be obtained using the TCDMDS gas instead of the BTCSM gas.

Here, a sequence of supplying the TCDMDS gas to the wafer 200 will be described later. In addition, since the supply sequence and the process conditions of $H_2O$ gas, pyridine gas, or the like are the same as in the above-described embodiment, the supply sequence and the process conditions are omitted.

The TCDMDS gas is supplied into the gas supply pipe 232d by opening the valve 243d. The TCDMDS gas is supplied into the process chamber 201 through the gas supply holes 250a with a flow rate thereof being adjusted by the MFC 241d, and is exhausted through the exhaust pipe 231. In this case, the TCDMDS gas is supplied to the wafer 200 (TCDMDS gas supplying). At the same time, an inert gas such as $N_2$ gas and the like is supplied into the gas supply pipe 232j by opening the valve 243j. The $N_2$ gas is supplied into the process chamber 201 with the TCDMDS gas with a flow rate thereof being adjusted by the MFC 241j, and is exhausted through the exhaust pipe 231.

As the pyridine gas is supplied to the wafer 200 with the TCDMDS gas, a bonding force of the O—H bond present on the surface of the wafer 200 is degraded, the decomposition of the TCDMDS gas is promoted, and the formation of the silicon-containing layer containing C and Cl by the chemical adsorption of TCDMDS molecules is promoted. Thus, the pyridine gas acts as a catalyst for the TCDMDS gas similarly to the above-described BTCSM gas.

Also, in this case, process conditions such as the inner pressure of the process chamber 201, the flow rates of the supplied gases such as the source gas, the catalytic gas, the $N_2$ gas and the like, supply time and the temperature of the wafer 200 may be the same process conditions and ranges as in the above-described embodiment. Also, similarly to the above-described embodiment, in order to prevent the gas from being introduced into the nozzle 249b or the buffer chamber 237, which are not used when the TCDMDS gas or the pyridine gas is supplied, $N_2$ gas may be supplied.

For example, as a factor which controls the C concentration in the SiOC film by the type of the selected source gas, a difference between the arrangement of C of a molecular structure of each of the source gas may be considered. That is, BTCSM gas or BTCSE gas serving as an alkylenehalosilane-based source gas containing an Si—C—Si bond or an Si—C—C—Si bond in one molecule has a molecular structure in which C is narrowly added to Si. Therefore, a state in which a large amount of Cl is combined with a bond of the remaining Si is maintained. For example, in both of the BTCSM gas and the BTCSE gas, three among four bonds of Si are combined with Cl. A number of Cl included in the molecule is considered to improve the reactivity of the BTCSM gas or the BTCSE gas. Therefore, the film-forming rate of the SiOC film is improved using the BTCSM gas or the BTCSE gas. Also, since the reactivity and film-forming rate of the BTCSM gas or the BTCSE gas are improved by contained Cl, a range of a process condition (a process window) of the film forming process using the BTCSM gas or the BTCSE gas may be widened. Thus, since the process condition in which a desired C concentration is obtained may be selected in the wide process window, as a result, it is easy to increase the C concentration in the SiOC film. Also, the controllability of the C concentration of in the SiOC film may also be improved. Also, a number of Cs included in the BTCSM gas is smaller than, for example, that of the TCDMDS gas, however this point does not adversely affect the improvement of the C concentration in the SiOC film. The inventors have confirmed that the case in which the BTCSM gas is used relatively easily improves the C concentration compared to case in which the TCDMDS gas is used.

Also, an alkylhalosilane-based source gas such as TCDMDS gas or DCTMDS gas in which an alkyl group such as a methyl group is combined with Si has a molecular structure in which a part of a chloro group of a chlorosilane-based source gas is replaced by a methyl group. Thus, as a number of Cls in the gas molecule is decreased, the reaction proceeds relatively slowly in the TCDMDS gas or the DCTMDS gas, and thus the further dense SiOC film may be easily and obtained. Therefore, for example, the high etching resistance of the SiOC film of which the C concentration is properly suppressed is maintained. Also, comparing the TCDMDS gas and the DCTMDS gas, the inventors have confirmed that the DCTMDS gas containing a methyl group, that is, the plurality of Cs in a molecule, advantageously acts to increase the amount of C to be added into the film.

As described above, in the process, an SiOC layer containing C having a higher concentration may be formed by selecting and supplying the BTCSM gas or the BTCSE gas. Also, an SiOC layer of which the C concentration is appropriately suppressed while maintaining the etching resistance may be formed by selecting and supplying the TCDMDS gas or the DCTMDS gas. That is, the C concentration in the SiOC layer, that is, in the SiOC film may be accurately controlled by selecting and supplying a specific source gas from a plurality of kinds of source gases.

Even in the process of supplying the oxidizing gas while supplying the catalytic gas, the type of the supplied catalytic gas may be appropriately selected according to the desired film composition. As described above, the catalytic gases having different molecular structures may have, for example, a different strength of the catalysis action. One factor in which control such as the film composition of the SiOC film is possible according to the type of the selected catalytic gas is considered to be the difference of strength of the catalysis action. For example, by selecting a catalytic gas having a large pKa value which is an indicator of the catalysis action, the oxidizing power of the oxidizing gas is improved and the Si—C bond is cut, and the level of decrease of the C concentration may be increased. Also, for example, by selecting a catalytic gas having a small pKa value, the oxidizing power of the oxidizing gas is reduced and the Si—C bond is maintained, and the level of increase of the C concentration may be reduced. Also, one of the other factors in which control such as the film composition of the SiOC film is possible is considered to be a factor in which a difference of vapor-pressures of various catalytic gases or various materials such as a generated salt affecting the catalysis reaction, a difference of the pKa values or the vapor-pressure and the like are mixed. For example, the C concentration in the SiOC layer, that is, in the SiOC film may be accurately controlled by selecting and supplying a specific catalytic gas from a plurality of kinds of catalytic gases having different molecular structures. In this case, the specific catalytic gas may be supplied by selecting a specific supply line from a plurality of supply lines which supply the plurality of kinds of catalytic gases having different molecular structures. As described above, in the example of the film-forming sequence of the present embodiment, the pyridine gas which is the specific catalytic gas is supplied by selecting the pyridine gas supply line from the pyridine gas supply line, the TEA gas supply line and the like.

Also, the catalytic gas supplied in the process of supplying the oxidizing gas while supplying the catalytic gas may be the same as or different from the catalytic gas supplied in the process of supplying the source gas while supplying the above-described catalytic gas.

Also, by selecting the type of the source gases or the catalytic gases to control the C concentration in the SiOC film, the silicon concentration and the oxygen concentration may be relatively varied. That is, the composition of the SiOC film may be entirely varied, and the type of the source gas may be selected to entirely control the composition of the SiOC film.

Also, while a cycle including the above-described steps S1$a$ and S2$a$ is performed multiple times, the type of the source gas or the catalytic gas may be changed. Also, while the cycle including the above-described steps S1$a$ and S2$a$ is performed multiple times, the supply amount of the above-described catalytic gas may be changed.

In the case in which the type of the source gas is changed, when the cycle including the above-described steps S1$a$ and S2$a$ is performed multiple times in the process of forming the SiOC film, the type of the source gas may be changed in the process of supplying the source gas while supplying the catalytic gas.

Therefore, the C concentration in the SiOC film may be changed in a direction of the thickness of the film. Also, the type of the source gas may be changed once or multiple times according to a desired film composition. Also, two types of the source gases may be used, and three or more types of the source gases may be used. The combination of the used source gases may be selected from source gases containing Si, C and a halogen element and having an Si—C bond. The source gases are used in an arbitrary order.

In the case in which the type of the catalytic gas is changed, when the cycle including the above-described steps S1$a$ and S2$a$ is performed multiple times in the process of forming the SiOC film, the type of the catalytic gas may be changed in the process of supplying the oxidizing gas while supplying the catalytic gas.

Therefore, the C concentration in the SiOC film may be changed in the direction of the thickness of the film. Also, the type of the catalytic gas may be changed once or multiple times according to a desired film composition. Also, two types of the catalytic gases may be used, and three or more types of the catalytic gases may be used. The catalytic gases are used in an arbitrary order.

Also, in the case in which the supply amount of the catalytic gas is changed, when the cycle including the above-described steps S1$a$ and S2$a$ is performed multiple times in the process of forming the SiOC film, the supply amount of the catalytic gas is changed in the process of supplying the oxidizing gas while supplying the catalytic gas.

Therefore, the C concentration in the SiOC film may be changed in the direction of the thickness of the film. Also, the catalytic gas may be supplied by changing from a small flow rate to a large flow rate, and by changing from a large flow rate to a small flow rate according to a desired film composition. Also, the supply amount of the catalytic gas may be changed once or multiple times according to a desired film composition. In this case, the catalytic gas may be supplied by gradually changing from the small flow rate to the large flow rate or from the large flow rate to the small flow rate or may be supplied by vertically changing in any combination.

As described above, when the C concentration, the Si concentration or the O concentration in the SiOC film is appropriately changed in the direction of the thickness of the film by changing the C concentration in the SiOC film in the direction of the thickness of the film, it is easy to obtain the SiOC film having a desired composition. Therefore, an SiOC film having a different etching resistance in the direction of the thickness of the film may be obtained.

As described above, the substrate processing apparatus according to the present embodiment and the modification includes a plurality of source gas supply lines to select and supply a specific source gas from the plurality of kinds of source gases having different molecular structures. Also, the substrate processing apparatus according to the present embodiment and the modification includes a plurality of catalytic gas supply lines to select and supply a specific catalytic gas from the plurality of kinds of catalytic gases having different molecular structures. Such a configuration facilitates the selection and supply of the specific source gas or the specific catalytic gas from the plurality of kinds of gases according to the desired film composition. Therefore, the SiOC film having various composition ratios and film qualities may be generally and repeatedly formed using single substrate processing apparatus. Also, it is possible to secure the degree of freedom of the device operation when a gas species is added or replaced.

Also, for the substrate processing apparatus according to the present embodiment and the modification, the process recipe (the program in which processing sequences or processing conditions are described) used when film forming the above-described various thin films may be prepared in advance for each type of the source gas or the catalytic gas, that is, for each type of gas. Also, for the substrate processing apparatus according to the present embodiment and the modification, the process recipe in which the supply amount or the flow rate of the catalytic gas is differently set may be prepared in advance. That is, for the substrate processing apparatus according to the present embodiment and the modification, the plurality of process recipes may be prepared for each process condition. Such process recipes select and supply the specific source gas or the specific catalytic gas from the plurality of kinds of gases according to the desired film composition, and facilitate the adjusting of the supply amount of the catalytic gas. An operator may perform the film forming processing by appropriately selecting a process recipe from the plurality of process recipes according to the desired film composition. Therefore, it is possible to generally and repeatedly form the SiOC film having various composition ratios and film qualities in a single substrate processing apparatus. Also, it is possible to decrease an operational load (such as a load for inputting processing sequences or processing conditions) of an operator, thereby preventing operation errors and quickly starting the substrate processing.

(Other Modifications)

In the above-described embodiment, the SiOC film forming process and the SiOC film modifying process have been performed in a state in which the wafer 200 is accommodated in the same process chamber 201. In the present modification, the SiOC film forming process and the SiOC film modifying process are performed in a state in which the wafer 200 is accommodated in a different process chamber.

Figure 7A:
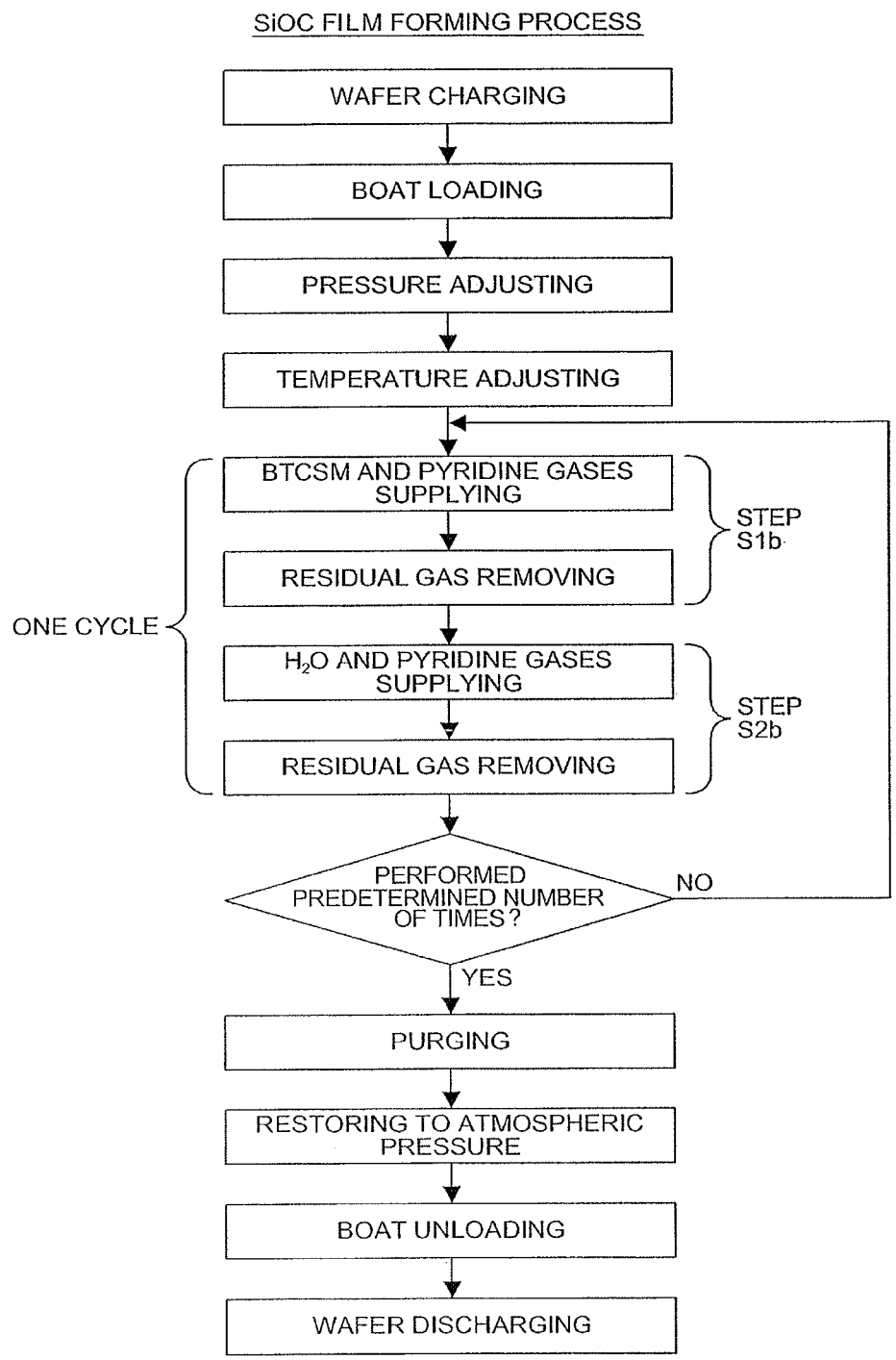
FIGS. 7A and 7B are flowcharts of another modification according to the first embodiment of the present invention, where
Figure 7B:
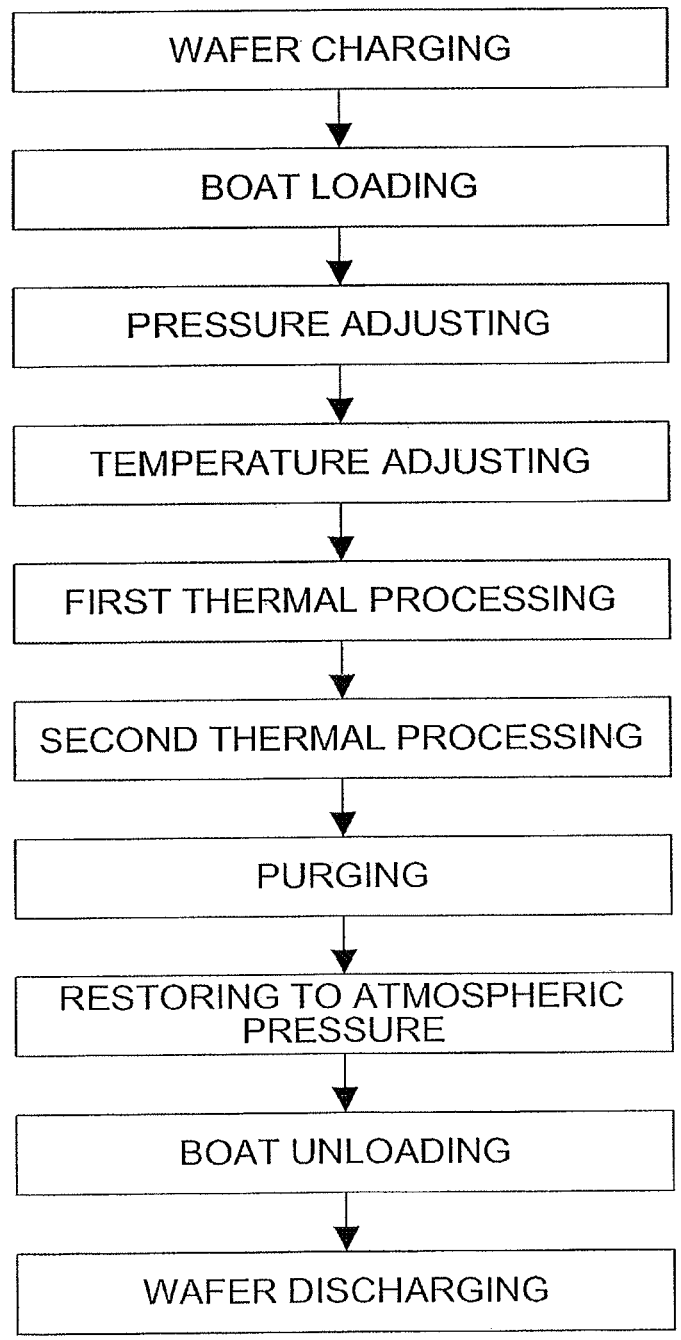

That is, as illustrated in FIGS. 7A and 7B, for example, the SiOC film forming process is performed in the process chamber 201 (hereinafter, referred to as a first process chamber) provided in the substrate processing apparatus (hereinafter, referred to as a first substrate processing unit) of the present embodiment similarly to the above-described embodiment. Operations of the respective units included in the first substrate processing unit are controlled by a first control unit. After a cycle including the same steps S1b and S2b as the above-described steps S1a and S2a is performed a predetermined number of times, a purging of the inside of the process chamber 201, restoring to atmospheric pressure, boat unloading, and wafer discharging are sequentially performed.

Next, a process of thermal processing the SiOC film formed on the wafer 200 extracted from the boat 217, that is, an SiOC film modifying process is performed in a different process chamber from the process chamber 201. As the different process chamber from the process chamber 201, a process chamber (hereinafter, referred to as a second process chamber) provided in a different substrate processing apparatus (hereinafter, referred to as a second substrate processing unit) from the apparatus in which the SiOC film forming process is performed, for example, a similar substrate processing apparatus to the above-described embodiment, may be used. Operations of the respective units included in the second substrate processing unit are controlled by a second control unit. Similarly to the SiOC film forming process of the above-described embodiment in the first substrate processing unit, wafer charging and boat loading are sequentially performed in the second substrate processing unit. Also, similarly to the SiOC film modifying process of the above-described embodiment, pressure adjusting and temperature adjusting are performed. Then, similarly to the above-described embodiment, first thermal processing, second thermal processing, purging, restoring to atmospheric pressure, boat unloading, and wafer discharging are sequentially performed.

In this case, the substrate processing system includes a first substrate processing unit for forming an SiOC film and a second substrate processing unit for thermally processing the SiOC film.

As described above, the SiOC film forming process and the SiOC film modifying process may be performed in the same the process chamber 201 (in-situ) and in a different process chamber (a first process chamber and a second process chamber) (ex-situ). When both processes are performed in-situ, the wafer 200 may be processed in batches in a vacuum state without exposure to the atmosphere. Therefore, it is possible to perform a more stable film forming process. When both processes are performed ex-situ, the temperature in each process chamber is set in advance, for example, to the process temperature or the approximate temperature of the process, and thus the time spent in the temperature adjustment may be reduced. Therefore, production efficiency may be further increased.

The process chamber in which the thermal processing is performed on the SiOC film may be a process chamber including a different apparatus from the substrate processing apparatus of the above-described embodiment, for example, an apparatus such as a dedicated annealing processing container (thermal processing furnace).

Also, the substrate processing system may be an apparatus (a stand-alone apparatus) in which the first substrate processing unit and the second substrate processing unit are separated as described above, and may be an apparatus (a cluster-type apparatus) in which the first substrate processing unit and the second substrate processing unit are mounted on the same platform. In the substrate processing system, for example, the thin film may be formed under the same process conditions as the process conditions in the sequence of FIGS. 4 and 5A.

The same effects as in the above-described embodiment may be obtained by the various modifications described above.

Second Embodiment

Next, the second embodiment of the present invention will be described.

(1) Thin Film Forming Process

In the above-described embodiment, in the process of supplying the oxidizing gas while supplying the catalytic gas, the gas containing oxygen (O) which is an oxidizing gas has been selected and supplied. Also, the gas containing nitrogen having a lone pair which is a catalytic gas and having about 5 to 11 pKa has been selected and supplied. According to the present embodiment, an amine-based catalytic gas such as $O_3$ gas which is an oxidizing gas and TEA gas which is a catalytic gas is used. In the present embodiment, similarly to the above-described embodiment, the substrate processing apparatus illustrated in FIGS. 1 and 2 is used. In the following description, operations of the respective units included in the substrate processing apparatus are controlled by the controller 121.

In the present embodiment, a process of forming a thin film containing silicon (Si), oxygen (O) and carbon (C) on the wafer 200 is performed by performing a cycle a predetermined number of times. The cycle includes a process of supplying a source gas containing silicon (Si), carbon (C) and a halogen element which is a predetermined element and having a chemical bond between the predetermined element and carbon (a Si—C bond) to the wafer 200 which is a substrate; a process of supplying an oxidizing gas to the wafer 200; and a process of supplying a catalytic gas to the wafer 200.

In this case, the process of supplying the source gas is performed without performing the process of supplying the catalytic gas, and the process of supplying the oxidizing gas is performed while performing the process of supplying the catalytic gas.

Also, in the present embodiment, a process of removing a first impurity from the thin film by subjecting the thin film to the thermal processing with a first temperature higher than the temperature of the wafer 200 in the process of forming the thin film; and a process of removing a second impurity different from the first impurity from the thin film after the thermal processing with the first temperature by subjecting the thin film to the thermal processing with a second temperature not less than the first temperature are further performed. The thermal processing is performed in oxygen-free atmosphere.

Also, in the present embodiment, each process is performed in non-plasma atmosphere.

Figure 8:
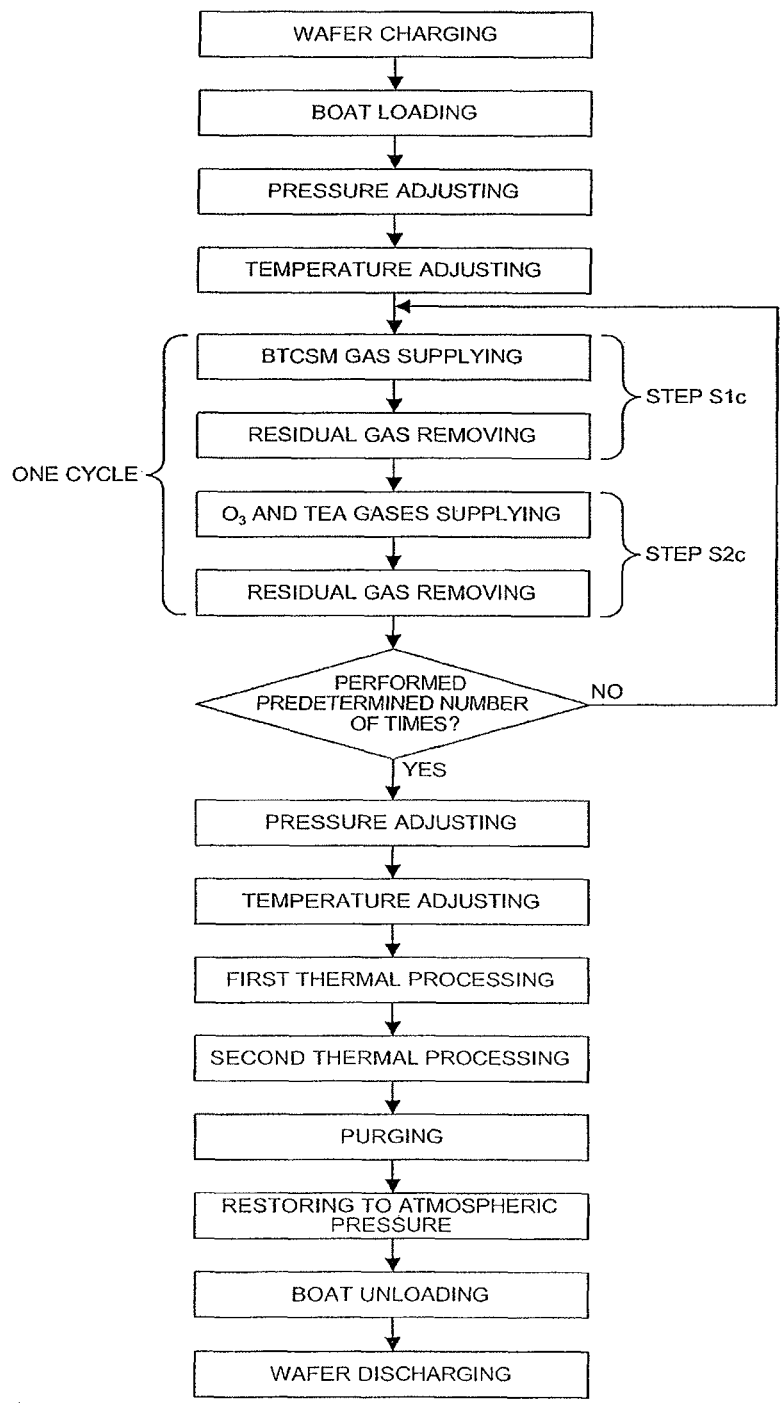
FIG. 8 is a flowchart illustrating a film-forming sequence according to a second embodiment of the present invention.
Figure 9A:
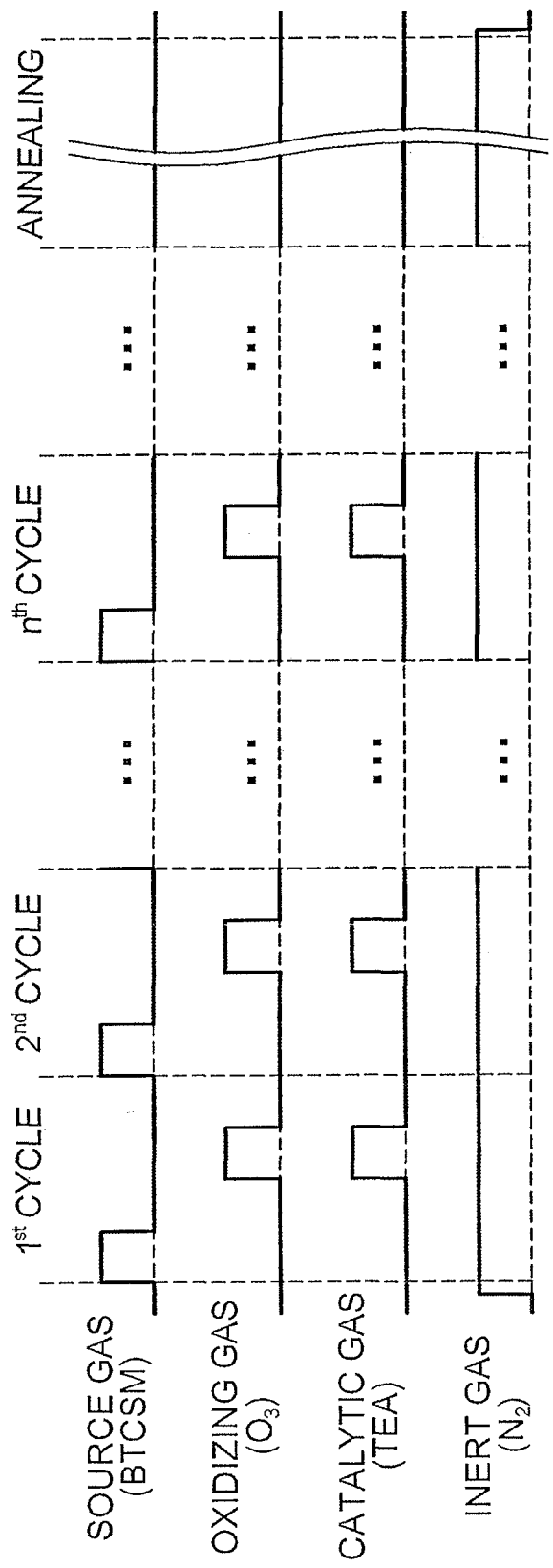
FIGS. 9A, 9B and 9C are diagrams illustrating gas supply timing in film-forming sequences according to the second embodiment of the present invention and modifications thereof, where

Hereinafter, a film-forming sequence of the present embodiment will be described in detail with reference to FIGS. 8 and 9A.

Here, an example of (a) a process of forming a silicon oxycarbide film (SiOC film) which is a thin film containing Si, O and C on the wafer 200 is performed by performing a cycle a predetermined number of times (n times). The cycle includes a process of supplying BTCSM gas which is a source gas to the wafer 200; a process of supplying $O_3$ gas which is an oxidizing gas to wafer 200; and a process of supplying TEA gas which is an amine-based catalytic gas to the wafer 200, (b) a process of removing a first impurity from the SiOC film by subjecting the SiOC film to the thermal processing with a first temperature higher than the temperature of the wafer 200 in the process of forming the SiOC film in the oxygen-free atmosphere generated by supplying the $N_2$ gas which is an oxygen-free gas to the wafer 200, and (c) a process of removing a second impurity different from the first impurity from the SiOC film after the thermal processing with the first temperature by subjecting the SiOC film to the thermal processing with a second temperature not less than the first temperature in the oxygen-free atmosphere generated by supplying the $N_2$ gas which is an oxygen-free gas to the wafer 200 will be described.

In this case, in the process of supplying the BTCSM gas, the BTCSM gas is supplied to the wafer 200 in a state in which the supply of the catalytic gas such as the TEA gas to the wafer 200 is stopped, and in the processes of supplying the catalytic gas such as the TEA gas and the $O_3$ gas, the $O_3$ gas is supplied to the wafer 200 while supplying the TEA gas which is an amine-based catalytic gas to the wafer 200.

As described in the example of the sequence of the present embodiment, by using the $O_3$ gas which is an oxidizing gas and the amine-based catalytic gas such as the TEA gas which is a catalytic gas, the oxidizing power of the $O_3$ gas may be significantly increased. Therefore, although the catalytic gas such as the TEA gas is not supplied in the process of supplying the source gas, sufficient reactivity may be obtained in the process of supplying the $O_3$ gas, and thus the SiOC film may be formed.

(SiOC Film Forming Process)

After wafer charging, boat loading, pressure adjusting and temperature adjusting are performed, the following two steps, S1c and S2c, are sequentially performed.

[Step S1c] (BTCSM Gas Supplying)

In the same sequence as in the above-described embodiment, the BTCSM gas is supplied to the wafer 200. In this case, for example, in a state in which the valve 243i is closed and the supply of the TEA gas is stopped, the BTCSM gas is supplied to the wafer 200. Also, in a state in which the valves 243c and 243i are closed and the supply of the amine-based catalytic gas including the TEA gas is stopped, that is, in a state in which the amine-based catalytic gas is not supplied, the BTCSM gas is supplied to the wafer 200. That is, when the BTCSM gas is supplied to the wafer 200, the catalytic gas including the amine-based catalytic gas is not supplied thereto.

Also, in order to prevent the BTCSM gas from being introduced into the buffer chamber 237 and the nozzles 249b and 249c, the valves 243k and 243l are opened and the $N_2$ gas is supplied into the gas supply pipes 232k and 232l. The $N_2$ gas is supplied into the process chamber 201 through the nozzles 249b and 249c and the buffer chamber 237, and is exhausted through the exhaust pipe 231.

At the same time, the APC valve 244 is appropriately adjusted such that the inner pressure of the process chamber 201 ranges from 1 Pa to 13,330 Pa, and preferably from 133 Pa to 2,666 Pa. The flow rate of the BTCSM gas controlled by the MFC 241a ranges from 1 sccm to 2,000 sccm. Each of the flow rates of the $N_2$ gas controlled by the MFCs 241j through 241l ranges from 100 sccm to 10,000 sccm. The time duration during which the BTCSM gas is supplied to the wafer 200, that is, a gas supply time duration (supplying time) ranges from 1 second to 100 seconds, and preferably from 5 seconds to 60 seconds.

At the same time, the temperature of the heater 207 is set such that the temperature of the wafer 200 is set to room temperature or more and 150° C. or less, preferably room temperature or more and 100° C. or less, and more preferably 50° C. or more and 100° C. or less. As described above, in the case in which the BTCSM gas is supplied and the catalytic gas is not supplied, when the temperature of the wafer 200 is less than 250° C., chemical adsorption of BTCSM on the wafer 200 is difficult, and thus a practical film-forming rate may not be obtained. According to the present embodiment, by using a combination of $O_3$ gas and TEA gas in step S2a as will be described later, even when the temperature of the wafer 200 is less than 250° C., it is possible to address the problem. On the assumption of step S2a, an amount of heat applied to the wafer 200 may be reduced by setting the temperature of the wafer 200 to 150° C. or less, or, 100° C. or less, and thus the thermal history of the wafer 200 may be satisfactorily controlled. A sufficient film-forming rate may be obtained at room temperature or more. Therefore, the temperature of the wafer 200 ranges from room temperature to 150° C., preferably from room temperature to 100° C., and more preferably from 50° C. to 100° C.

A silicon-containing layer that contains C and Cl and has a thickness of, for example, about less than one atomic layer to several atomic layers, is formed on the wafer 200 [a base film of the surface] as a first layer by supplying the BTCSM gas to the wafer 200 under the above-described conditions. As described above, for example, it is considered that the adsorption layer of BTCSM gas by physical adsorption with insufficient thermal decomposition, which is the silicon-containing layer containing C and Cl at a temperature of 150° C. or less, that is, the physical adsorption layer of BTCSM gas, is mainly formed.

Thus, when the silicon-containing layer containing C and Cl is formed by the adsorption layer of BTCSM molecules with insufficient thermal decomposition, the silicon-containing layer is difficult to fix on the wafer 200 and is difficult to be an SiOC layer having a strong bond due to the oxidation process to be performed later. That is, in the case in which the catalytic gas is not supplied when the BTCSM gas is supplied, the oxidation reaction of the silicon-containing layer containing C and Cl may have difficulty proceeding even when the catalytic gas is supplied in the oxidation process thereafter. Therefore, the film-forming rate may be degraded or may not be film-formed from the beginning.

Thus, as in the above-described embodiment, at such a low temperature, for example, the catalytic gas containing nitrogen having a lone pair such as ammonia ($NH_3$) gas or the TEA gas is supplied in both of the process of supplying the source gas and the process of supplying the oxidizing gas. When the source gas is supplied, the thermal decomposition reaction of the source gas may be promoted. That is, such a catalytic gas promotes the decomposition of the source gas by weakening the bonding force of the O—H bond present on the surface of the wafer, and promotes the formation of the silicon-containing layer containing C and Cl by chemical adsorption of the source gas molecules.

Meanwhile, according to the present embodiment, the catalytic gas is used only in step S2c. In this case, the oxidizing power of the oxidizing gas may be significantly increased by combining a predetermined amount of an oxidizing gas, that is, $O_3$ gas and a predetermined amount of a catalytic gas, that is, an amine-based catalytic gas such as TEA gas. When the catalytic gas such as TEA gas is not used as in step S1c, the oxidation reaction of the silicon-containing layer containing C and Cl is more reliably promoted even when the thermal decomposition of the BTCSM gas is insufficient, and thus the SiOC layer having a strong bond with molecules or atoms which are present adjacently or in a base may be formed.

Also, in at least the source gas supplying process, a reaction mechanism does not need to pass through a complex reaction system using the catalytic gas. When the catalytic gas is supplied while supplying the BTCSM gas, a particle source which is salt generated by a catalysis reaction may be avoided. Therefore, the film fo ing process is easy to establish. Also, for example, as the catalytic gas is not used in the BTCSM gas supplying process, the usage amount of the catalytic gas may be reduced and thus manufacturing costs may be reduced.

(Residual Gas Removing)

Then, in the same sequence as in the above-described embodiment, the supply of the BTCSM gas is stopped, and residual gas is removed from the process chamber 201.

[Step S2c] ($O_3$ and TEA Gases Supplying)

After step S1c is completed and the gas remaining in the process chamber 201 is removed, $O_3$ gas is supplied into the gas supply pipe 232g by opening the valve 243g. The $O_3$ gas is supplied into the buffer chamber 237 through the gas supply holes 250b and into the process chamber 201 through the plurality of gas supply holes 250d with a flow rate thereof being adjusted by the MFC 241g, and is exhausted through the exhaust pipe 231. In this case, the $O_3$ gas is supplied to the wafer 200 in non-plasma atmosphere ($O_3$ gas supplying). At the same time, $N_2$ gas which is an inert gas is supplied into the gas supply pipe 232k by opening the valve 243k. The $N_2$ gas is supplied into the process chamber 201 with $O_3$ gas with a flow rate thereof being adjusted by the MFC 241k, and is exhausted through the exhaust pipe 231.

Also, TEA gas is supplied into the gas supply pipe 232i by opening the valve 243i. The TEA gas is supplied into the process chamber 201 through the gas supply holes 250c with a flow rate thereof being adjusted by the MFC 241i, and is exhausted through the exhaust pipe 231. In this case, the TEA gas is supplied to the wafer 200 (TEA gas supplying). At the same time, an inert gas such as $N_2$ gas and the like is supplied into the gas supply pipe 232l by opening the valve 243l. The $N_2$ gas is supplied into the process chamber 201 with the TEA gas with a flow rate thereof being adjusted by the MFC 241l, and is exhausted through the exhaust pipe 231.

In this case, in order to prevent the $O_3$ gas and the TEA gas from being introduced into the nozzle 249a, the $N_2$ gas is supplied into the gas supply pipe 232j by opening the valve 243j. The $N_2$ gas is supplied into the process chamber 201 through the nozzle 249a, and is exhausted through the exhaust pipe 231.

At the same time, the APC valve 244 is appropriately adjusted such that the inner pressure of the process chamber 201 ranges from 1 Pa to 13,330 Pa, and preferably from 133 Pa to 2,666 Pa. The flow rate of the $O_3$ gas controlled by the MFC 241g ranges from 1,000 sccm to 10,000 sccm. Also, the flow rate of the TEA gas controlled by the MFC 241i is set such that a ratio of the flow rate (sccm) of the supplied $O_3$ gas and the flow rate (sccm) of the TEA gas ranges from 0.01 to 100, more preferably from 0.05 to 10. Each of the flow rates of the $N_2$ gas controlled by the MFCs 241j through 241l ranges from 100 sccm to 10,000 sccm. The time duration during which the $O_3$ gas and the TEA gas are supplied to the wafer 200, i.e., a gas supply time duration (supplying time) ranges from 1 second to 100 seconds, and preferably from 5 seconds to 60 seconds. The temperature of the heater 207 is set such that the temperature of the wafer 200 is set to within the same temperature range as when the BTCSM gas is supplied in the step S1c, i.e., room temperature or more and 150° C. or less, preferably room temperature or more and 100° C. or less, and more preferably 50° C. or more and 100° C. or less.

The $O_3$ gas supplied into the process chamber 201 is activated by heat, and is exhausted through the exhaust pipe 231. In this case, the $O_3$ gas activated by heat is supplied to the wafer 200. That is, the gas flowing into the process chamber 201 is the $O_3$ gas activated by heat, and the BTCSM gas is not supplied into the process chamber 201. Therefore, the $O_3$ gas does not cause a gas-phase reaction, is supplied to the wafer 200 in an activated state, and acts with at least a part of the first layer (a silicon-containing layer containing C and Cl) formed on the wafer 200 in the step S1c. Therefore, the first layer is thermally oxidized in non-plasma atmosphere, and is changed to a second layer containing Si, O and C, that is, an SiOC layer.

The TEA gas which is an amine-based catalytic gas promotes the decomposition of the $O_3$ gas to improve the oxidizing power of the $O_3$ gas, and promotes the reaction of the $O_3$ gas and the silicon-containing layer containing C and Cl. The inventors have found that the oxidizing power of the $O_3$ gas is improved over the range predicted from the conventional catalyst reaction by combining the $O_3$ gas and the TEA gas. As described above, when the catalytic gas is not supplied and the thermal decomposition of the BTCSM gas is insufficient while supplying the BTCSM gas, it is difficult to obtain sufficient reactivity even when the catalytic gas is supplied in the oxidizing gas supplying process thereafter. However, the inventors have found that the oxidation reaction of the $O_3$ gas and the silicon-containing layer containing C and Cl appropriately proceeds by supplying the $O_3$ gas and the TEA gas together even when the adsorption layer of BTCSM gas by the physical adsorption with insufficient thermal decomposition which is the silicon-containing layer containing C and Cl, that is, the physical adsorption layer of BTCSM gas is formed, specifically, for example, in step S1c. Thus, the inventors have ascertained that the oxidizing power of the $O_3$ gas is sufficiently improved by the action of the TEA gas, the oxidation process of the physical adsorption layer of BTCSM gas may be more reliably performed, and thus the SiOC layer having a strong bond with molecules or atoms which are present adjacently or in the base may be formed.

(Residual Gas Removing)

Then, the supply of the $O_3$ gas is stopped by closing the valve 243g. Also, the supply of the TEA gas is stopped by closing the valve 243i. In the order of the above-described embodiment, the residual gas is removed from the process chamber 201.

(Performing a Predetermined Number of Times)

When a cycle in which the above-described steps S1c and S2c are performed once or more, that is, are performed a predetermined number of times (n times), an SiOC film having a predetermined composition and a predetermined film thickness is formed on the wafer 200. The above-described cycle is preferably repeated multiple times. That is, the thickness of the SiOC layer formed when the cycle is performed once is set to be smaller than a desired film thickness, and the above-described cycle is preferably repeated multiple times to obtain the desired film thickness.

(SiOC Film Modifying Process)

According to the present embodiment, a large amount of the impurities such as moisture ($H_2O$) or Cl or the hydrocarbon-based impurities may be included in the SiOC film formed at a low temperature. Therefore, under the same sequence and process conditions as in the above-described embodiment, the impurities in the SiOC film are removed by performing pressure adjusting, temperature adjusting, first thermal processing, second thermal processing, purging and restoring to atmospheric pressure, and the SiOC film is modified. Thus, the SiOC film having a higher etching resistance and a lower dielectric constant than the SiOC film before the SiOC film modifying process is performed may be obtained.

Also, according to the present embodiment, the impurity such as moisture included in the SiOC film formed at a low temperature is derived from, for example, moisture introduced from the outside when the wafer 200 is loaded into the process chamber 201. The impurity such as Cl is derived from, for example, Cl in the BTCSM molecule. The hydrocarbon-based impurity is derived from, for example, C and H in the BTCSM molecule or C and H in the TEA molecule. That is, a part of TEA may be decomposed similarly to the pyridine, however most thereof is not decomposed and substantially acts as a catalyst. In this specification, as the TEA in the reaction system according to the present embodiment, a material substantially acting as a catalyst, in which some thereof is decomposed and most thereof is not decomposed, is called a catalyst.

Then, in the same sequence as in the above-described embodiment, boat unloading and wafer discharging are performed, and the film forming process of the present embodiment is completed.

(2) Effects of the Present Embodiment

According to the present embodiment, one or a plurality of effects to be described as well as the same effects as in the above-described first embodiment will be obtained.

(a) According to the film-forming sequence of the present embodiment, the BTCSM gas is supplied to the wafer 200 in a state in which the supply of the catalytic gas to the wafer 200 is stopped in step S1c. Thus, the film formation process may be simplified. Also, when the BTCSM gas is supplied, the salt generated when the catalytic gas is supplied is not generated, and thus the particles may be suppressed. Also, manufacturing costs may be reduced by decreasing the usage amount of the catalytic gas.

(b) Also, according to the film-forming sequence of the present embodiment, $O_3$ gas is supplied to the wafer 200 while supplying the TEA gas to the wafer 200 in step S2c. Thus, the oxidizing power of the $O_3$ gas may be sufficiently increased. That is, according to the film-forming sequence of the present embodiment, the oxidizing power of the $O_3$ gas may be improved over the range predicted from the conventional catalyst reaction by combining the $O_3$ gas and the amine-based catalytic gas. Therefore, even when the catalytic gas is not supplied while supplying the BTCSM gas in step S1c, sufficient reactivity of the silicon-containing layer containing C and Cl may be obtained. Therefore, while maintaining the sufficient film-forming rate, the silicon-containing layer containing C and Cl is oxidized, and the SiOC layer may be formed.

Also, the inventors have considered that the TEA gas serving as an amine-based catalytic gas which is combined with the $O_3$ gas is most excellent, next, the pyridine gas is preferable, and next the piperidine gas is preferable. As the gases are compared under predetermined conditions, the consideration is based on from that the temperature range in which the thin film such as the SiOC film may be formed is widened in the embodiment using the TEA gas.

Also, although the present embodiment provides the same effects as in the above-described embodiment, it is confirmed that the effects are more significant in the above-described embodiment than in the present embodiment. That is, it is found that the effects of the effect, in which the dielectric constant of the SiOC film is reduced, is more significant in the above-described embodiment using the $H_2O$ gas and the pyridine gas than the present embodiment using the $O_3$ gas and the TEA gas. It is considered that this results from a degree of the porousness of the SiOC film increasing more when the $H_2O$ gas serving as an oxidizing gas is used than when the $O_3$ gas serving as an oxidizing gas is used. That is, it is considered that when the $H_2O$ gas serving as an oxidizing gas is used, the SiOC film containing more moisture is formed than when the $O_3$ gas serving as an oxidizing gas is used, fine pores, that is, fine spaces are further generated by subjecting the SiOC film containing more moisture to the first thermal processing and the second thermal processing, and a more porous SiOC film is obtained.

(3) Modification of the Present Embodiment

Next, a modification of the present embodiment will be described with reference to FIGS. 9B and 9C.

In the present modification, an example in which a silicon oxide film (an $SiO_2$ film, hereinafter, referred to as an SiO film) which is a thin film different from the SiOC film is formed using a chlorosilane-based source gas or a aminosilane-based source gas different from the above-described gas as a source gas will be described.

Figure 9B:
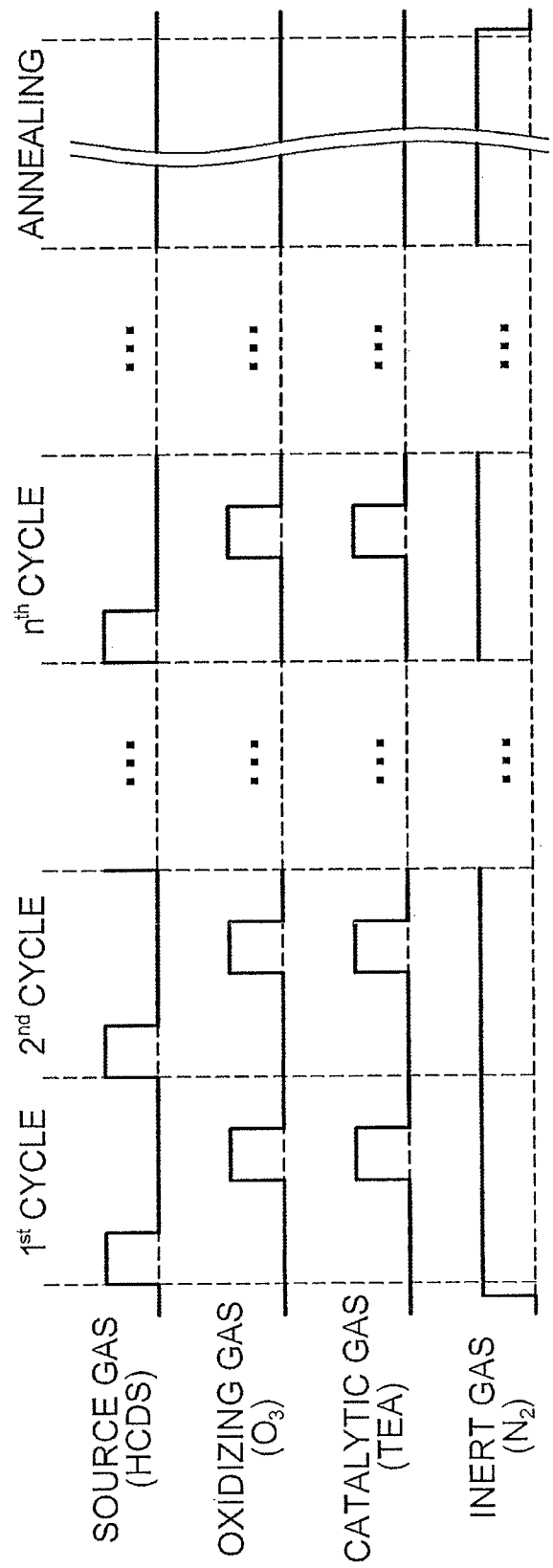

As illustrated in FIG. 9B, in a film-forming sequence of a first modification, (a) a process of forming an SiO film serving as a thin film on the wafer 200 is performed by performing a cycle a predetermined number of times, where the cycle includes a process of supplying HCDS gas serving as a source gas containing silicon (Si) serving as a predetermined element and a halogen element to the wafer 200; a process of supplying $O_3$ gas to the wafer 200; and a process of supplying TEA gas to the wafer 200, (b) a first impurity is removed from the SiO film by subjecting the SiO film to the thermal processing with a first temperature higher than the temperature of the wafer 200 in the process of forming the SiO film in the oxygen-free atmosphere generated by supplying $N_2$ gas serving as an oxygen-free gas to the wafer 200, and (c) a second impurity different from the first impurity is removed from the SiO film after the thermal processing with the first temperature by subjecting the SiO film to the thermal processing with a second temperature not less than the first temperature in the oxygen-free atmosphere generated by supplying $N_2$ gas serving as an oxygen-free gas to the wafer 200.

In this case, in the process of supplying the HCDS gas, the HCDS gas is supplied to the wafer 200 in a state in which the supply of the catalytic gas such as TEA gas is stopped, and in the process of supplying the $O_3$ gas, the $O_3$ gas is supplied to the wafer 200 while supplying the TEA gas to the wafer 200.

Hereinafter, a sequence of the supply of the HCDS gas to the wafer 200 will be described. Since the sequence and the process conditions of the supply of the $O_3$ gas, the TEA gas and the like are the same as in the above-described embodiment, description thereof is omitted.

The HCDS gas is supplied into the gas supply pipe 232e by opening the valve 243e. The HCDS gas is supplied into the process chamber 201 through the gas supply holes 250a with a flow rate thereof being adjusted by the MFC 241e, and is exhausted through the exhaust pipe 231. In this case, the HCDS gas is supplied to the wafer 200 (HCDS gas supplying). At the same time, an inert gas such as $N_2$ gas and the like is supplied into the gas supply pipe 232j by opening the valve 243j. The $N_2$ gas is supplied into the process chamber 201 with the HCDS gas with a flow rate thereof being adjusted by the MFC 241j, and is exhausted through the exhaust pipe 231.

Thus, a silicon-containing layer that contains Cl and has a thickness of about less than one atomic layer to several atomic layers is formed on the wafer 200 [a base film of the surface] as a first layer by supplying the HCDS gas to the wafer 200. The silicon-containing layer containing Cl may include an Si layer containing Cl, an adsorption layer of HCDS gas, and both thereof.

Here, the Si layer containing Cl collectively refers to a continuous layer that is constituted by Si and contains Cl, a discontinuous layer or an Si thin film containing Cl formed by overlapping thereof. Also, the continuous layer that is constituted by Si and contains Cl may also be referred to as an Si thin film containing Cl. Also, the Si included in the Si layer containing Cl includes Si whose bond with Cl is not completely broken and Si whose bond with Cl is completely broken.

Also, here, the adsorption layer of HCDS gas includes an adsorption layer in which molecules of HCDS gas are discontinuous as well as an adsorption layer in which the molecules of HCDS gas are continuous. That is, the adsorption layer of HCDS gas includes an adsorption layer that is formed of HCDS molecules and has a thickness of one molecular layer or less than one molecular layer. Also, $HCDS(Si_2Cl_6)$ molecules forming the adsorption layer of HCDS gas may have a chemical formula in which a bond between Si and Cl is partially broken as well as the chemical formula illustrated in FIG. 14E.

Here, the adsorption layer of HCDS gas by physical adsorption with insufficient thermal decomposition, which is the silicon-containing layer containing Cl, that is, the physical adsorption layer of HCDS gas may be mainly formed. Even in this case, in the process of supplying the $O_3$ gas is activated by heat by supplying the $O_3$ gas and the TEA gas to the wafer 200, the $O_3$ gas of which oxidizing power is improved by the TEA gas reacts with at least a part of the first layer (the silicon-containing layer containing Cl). Thus, the first layer is thermally oxidized in non-plasma atmosphere, and is changed to a second layer containing Si and O, that is, a silicon oxide layer (an SiOC layer).

Also, in this case, process conditions such as the inner pressure of the process chamber 201, the flow rates of the supplied gases such as the source gas, the $O_3$ gas, the TEA gas, the $N_2$ gas and the like, supply time and the temperature of the wafer 200 may be the same process conditions and ranges as in the above-described embodiment. Also, similarly to the above-described embodiment, in order to prevent the gas from being introduced into the nozzles 249a, 249b and 249c and the like which are not used when each gas is supplied, $N_2$ gas is appropriately supplied.

Figure 9C:
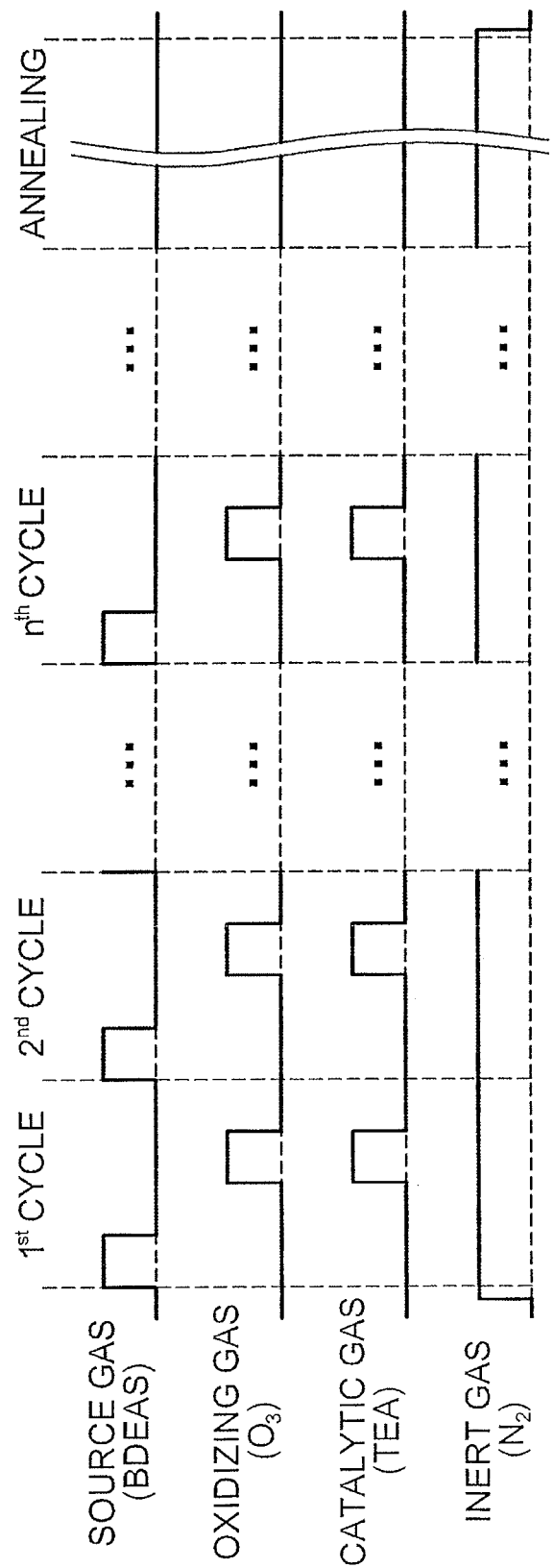

Also, as illustrated in FIG. 9C, the SiO film is formed on the wafer 200 using the BDEAS gas serving as the source gas containing silicon (Si) serving as a predetermined element, carbon (C) and nitrogen (N) and having a chemical bond of the predetermined element and nitrogen (an Si—N bond) in the film-forming sequence of the second modification, and the modifying process (the first thermal processing, the second thermal processing) is performed on the SiO film in an $N_2$ atmosphere. A supply sequence of the BDEAS gas to the wafer 200 will be described later.

As described above, the SiO film serving as a different thin film from the SiOC film may be formed using a different chlorosilane-based source gas such as HCDS gas or an aminosilane-based source gas such as BDEAS gas on the assumption that the oxidation process is performed by combining the amine-based catalytic gas such as the $O_3$ gas and the TEA gas.

Also, the BDEAS gas is easily adsorbed to the wafer 200 and is a gas having high decomposability or reactivity. Therefore, the BDEAS gas is used at a low temperature without using the catalytic gas alone, and the oxidizing gas such as $O_2$ gas excited in a plasma state may be used in the oxidation process thereafter. In the film-forming sequence of FIG. 9C, the same effects as the case in which the oxidation process is performed using the plasma may be obtained. It is supposed that the oxidizing power of the $O_3$ gas may be high similarly to the case in which the plasma is used by combining the $O_3$ gas and the amine-based catalytic gas.

An impurity such as moisture may be included in the SiO film formed at a low temperature. When HCDS gas is used as a source gas, an impurity such as Cl may be included in the SiO film. When BDEAS gas is used as a source gas, an impurity such as C, H, N and the like may be included in the SiO film. Under the same sequence and process conditions as in the above-described embodiment, by removing the impurity from the SiO film and modifying the SiO film by subjecting the SiO film to the first thermal processing and the second thermal processing, the SiO film having a higher etching resistance and a lower dielectric constant than the SiOC film before the SiOC film modifying process is performed may be obtained.

The same effects as in the above-described first embodiment may be obtained by the various modifications described above.

Third Embodiment

Next, a third embodiment of the present invention will be described.

(1) Stacked Film Forming Process

According to the above-described embodiment, the SiOC film is formed by performing a cycle including steps S1a and S2a or steps S1c and S2c a predetermined number of times. According to the present embodiment, with the above-described SiOC film forming process, a process of supplying a chlorosilane-based source gas different from the above-described gases while supplying a catalytic gas to the wafer 200 and a process of supplying an oxidizing gas while supplying the catalytic gas to the wafer 200 are performed the predetermined number of times. Thus, a stacked film of the SiOC film and an SiO film different from the SiOC film is formed.

Figure 10:
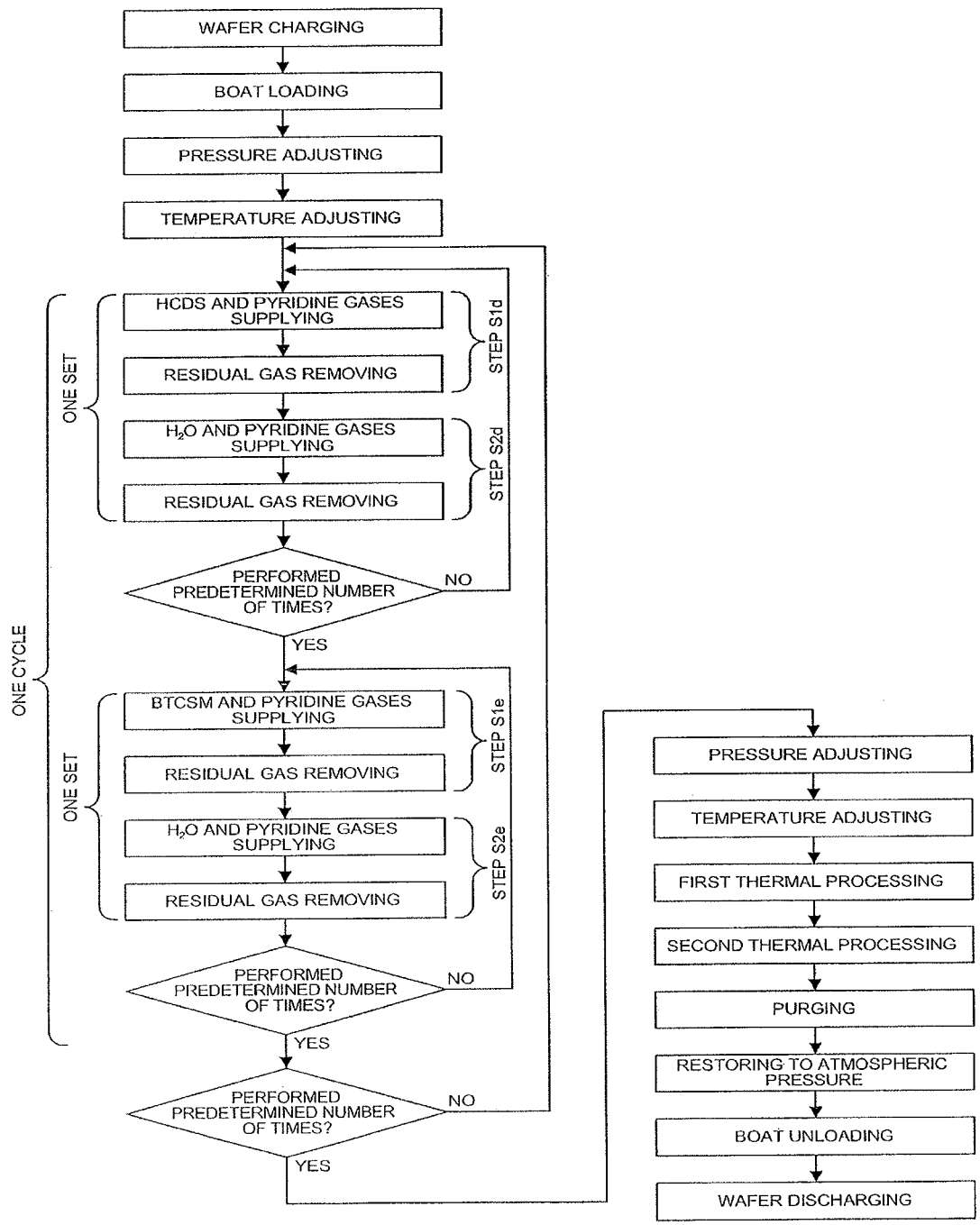
FIG. 10 is a flowchart illustrating a film-forming sequence according to a third embodiment of the present invention.

Hereinafter, a film-forming sequence of the present embodiment will be described with reference to FIGS. 10 and 11. In the present embodiment, the substrate processing apparatus illustrated in FIGS. 1 and 2 is also used as in the above-described embodiment. Also, in the following description, operations of the respective units included in the substrate processing apparatus are controlled by the controller 121.

In the film-forming sequence of the present embodiment, an example of (a) forming a stacked film of an SiO film and an SiOC film on the wafer 200 by performing a cycle a predetermined number of times, where the cycle includes (a-1) a process of forming an SiO film which is a first thin film containing Si and O is performed by performing a set a predetermined number of times, where the set includes a process of supplying HCDS gas which is a source gas containing silicon (Si) and a halogen element which is a predetermined element to the wafer 200 is performed in a state in which a process of supplying a pyridine gas which is a catalytic gas to the wafer 200 is performed (step S1d), and a process of supplying H$_2$O gas which is an oxidizing gas to the wafer 200 is performed in a state in which a process of supplying the pyridine gas which is a catalytic gas to the wafer 200 is performed (step S2d), and (a-2) a process of forming an SiOC film which is a second thin film containing Si, O and C is performed by performing a set a predetermined number of times, where the set includes a process of supplying BTCSM gas which is a source gas containing silicon (Si), carbon (C) and a halogen element which is a predetermined element and having a chemical bond between the predetermined element and carbon (Si—C bond) to the wafer 200 is performed in a state in which a process of supplying the pyridine gas which is a catalytic gas to the wafer 200 is performed (step S1e), and a process of supplying H$_2$O gas which is an oxidizing gas to the wafer 200 is performed in a state in which a process of supplying the pyridine gas which is a catalytic gas to the wafer 200 is performed (step S2e), (b) removing a first impurity from the stacked film by subjecting the stacked film to thermal processing with a first temperature higher than the temperature of the wafer 200 in the process of forming the stacked film in oxygen-free atmosphere generated by supplying N$_2$ gas which is an oxygen-free gas to the wafer 200, and (c) removing a second impurity different from the first impurity from the stacked film after the thermal processing with the first temperature by subjecting the stacked film to the thermal processing with a second temperature not less than the first temperature in the oxygen-free atmosphere generated by supplying N$_2$ gas serving as an oxygen-free gas to the wafer 200 will be described.

(SiO Film Forming Process)

After wafer charging, boat loading, pressure adjusting and temperature adjusting are performed, the following two steps, S1d and S2d are sequentially performed.

[Step S1d] (HCDS and Pyridine Gases Supplying)

In the same sequence as in the above-described modification of FIG. 9B, HCDS gas is supplied to the wafer 200 (HCDS gas supplying). Also, in the same sequence as in the above-described embodiment, a pyridine gas is supplied to the wafer 200 (pyridine gas supplying).

Thus, as the pyridine gas is supplied to the wafer 200 with the HCDS gas, bonding force of the O—H bond present on the surface of the wafer 200 is degraded, the decomposition of the HCDS gas is promoted, and the formation of the silicon-containing layer containing Cl (a first layer) by the chemical adsorption of HCDS molecules is promoted. Thus, the pyridine gas acts as a catalyst for the HCDS gas as the same as the above-described BTCSM gas.

Also, in this case, process conditions such as the inner pressure of the process chamber 201, the flow rates of the supplied gases such as the source gas, the catalytic gas, the N$_2$ gas and the like, supply time and the temperature of the wafer 200 may be the same process conditions and ranges as in the above-described embodiment. Also, similarly to the above-described embodiment, in order to prevent the gas from being introduced into the nozzle 249b and the like which are not used when the HCDS gas or the pyridine gas is supplied, N$_2$ gas may be supplied.

(Residual Gas Removing)

After the silicon-containing layer containing Cl which is the first layer is formed on the wafer 200, the supply of the HCDS gas and the pyridine gas is stopped in the same sequence as in the above-described embodiment, and residual gas is removed from the process chamber 201.

[Step S2d] (H$_2$O and Pyridine Gases Supplying)

After step S1d is completed and the gas remaining in the process chamber 201 is removed, H$_2$O gas and a pyridine gas are supplied to the wafer 200 in the same sequence as in the above-described embodiment. The H$_2$O gas supplied to the wafer 200 is activated by heat, the decomposition thereof is promoted by the pyridine gas, and reacts with at least a part of the first layer (the silicon-containing layer containing Cl) formed on the wafer 200 in step S1d. Thus, the first layer is thermally oxidized in non-plasma atmosphere, and is changed to a second layer containing Si and O, that is, a silicon oxide layer (an SiO layer).

Also, in this case, process conditions such as the inner pressure of the process chamber 201, the flow rates of the supplied gases such as the oxidizing gas, the catalytic gas, the N$_2$ gas and the like, supply time and the temperature of the wafer 200 may be the same process conditions and ranges as in the above-described embodiment. Also, when the H$_2$O gas or the pyridine gas is supplied similarly to the above-described embodiment, in order to prevent the gas from being introduced into the nozzle 249*a* and the like which are not used, $N_2$ gas may be supplied.

(Residual Gas Removing)

Then, in the same sequence as in the above-described embodiment, the supply of the $H_2O$ gas and the pyridine gas is stopped, and residual gas is removed from the process chamber 201.

(Performing a Predetermined Number of Times)

A SiO film having a predetermined composition and a predetermined film thickness may be formed on the wafer 200 by performing a set including the above-described steps S1*d* and S2*d* once or more (a predetermined number of times). Also, the above-described set is preferably repeated multiple times. That is, the thickness of the SiOC layer formed when the cycle is performed once is set to be smaller than a desired film thickness, and the above-described set is preferably repeated multiple times to obtain the desired film thickness.

(SiOC Film Forming Process)

In a process of forming an SiOC film, steps S1*e* and S2*e* are sequentially performed in the same sequence and process conditions as in steps S1*a* and S2*a* of the above-described embodiment. A SiOC film having a predetermined composition and a predetermined film thickness may be formed on the wafer 200 by performing a set including steps S1*e* and S2*e* once or more (a predetermined number of times).

(Performing a Predetermined Number of Times)

A stacked film of the SiO film and the SiOC film is formed on the wafer 200 by performing a cycle including the SiO film forming process in which a set including the above-described steps S1*d* and S2*d* is performed a predetermined number of times and the SiOC film forming process in which a set including steps S1*e* and S2*e* is performed a predetermined number of times once or more (a predetermined number of times). In this case, the SiO film forming process and the SiOC film forming process may be performed in an arbitrary order.

Figure 11A:
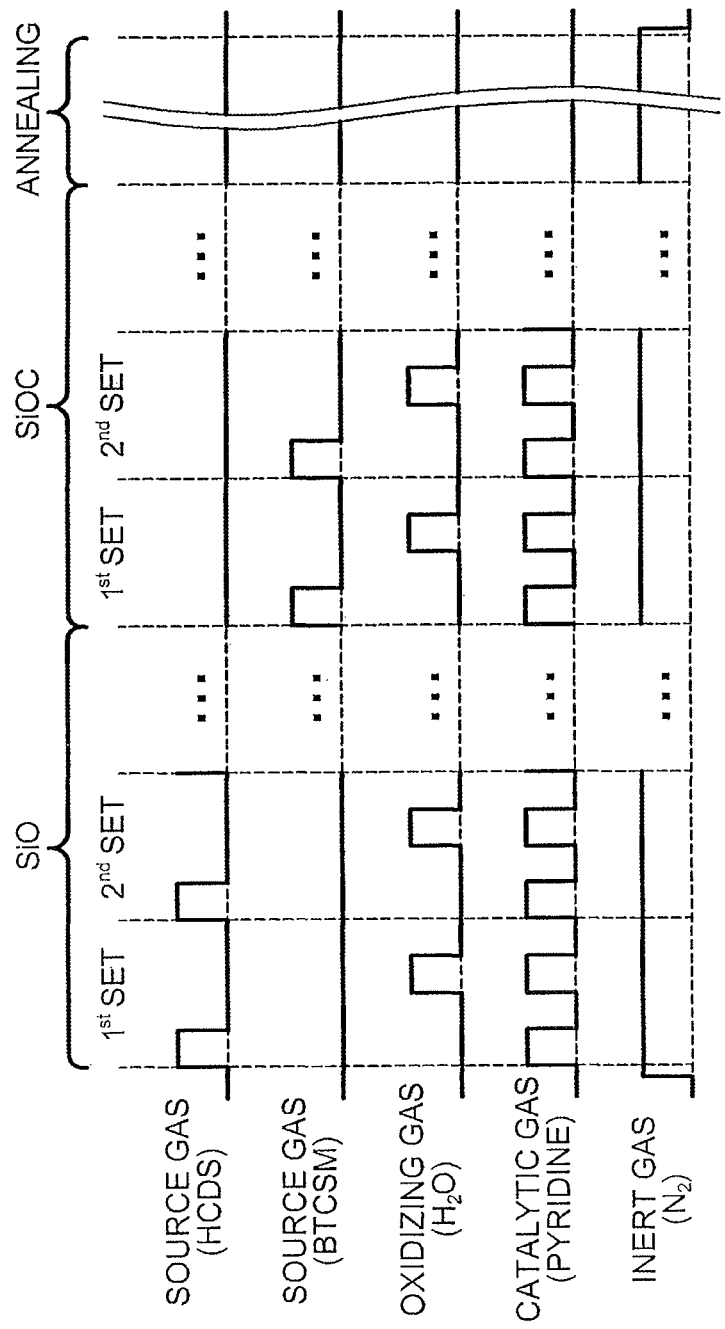
FIGS. 11A and 11B are diagrams illustrating gas supply timing in film-forming sequences according to the third embodiment of the present invention, where

As illustrated in FIG. 11A, a stacked film on which an SiO film and an SiOC film are stacked may be formed by performing a cycle including the SiO film forming process and the SiOC film forming process once.

Figure 11B:
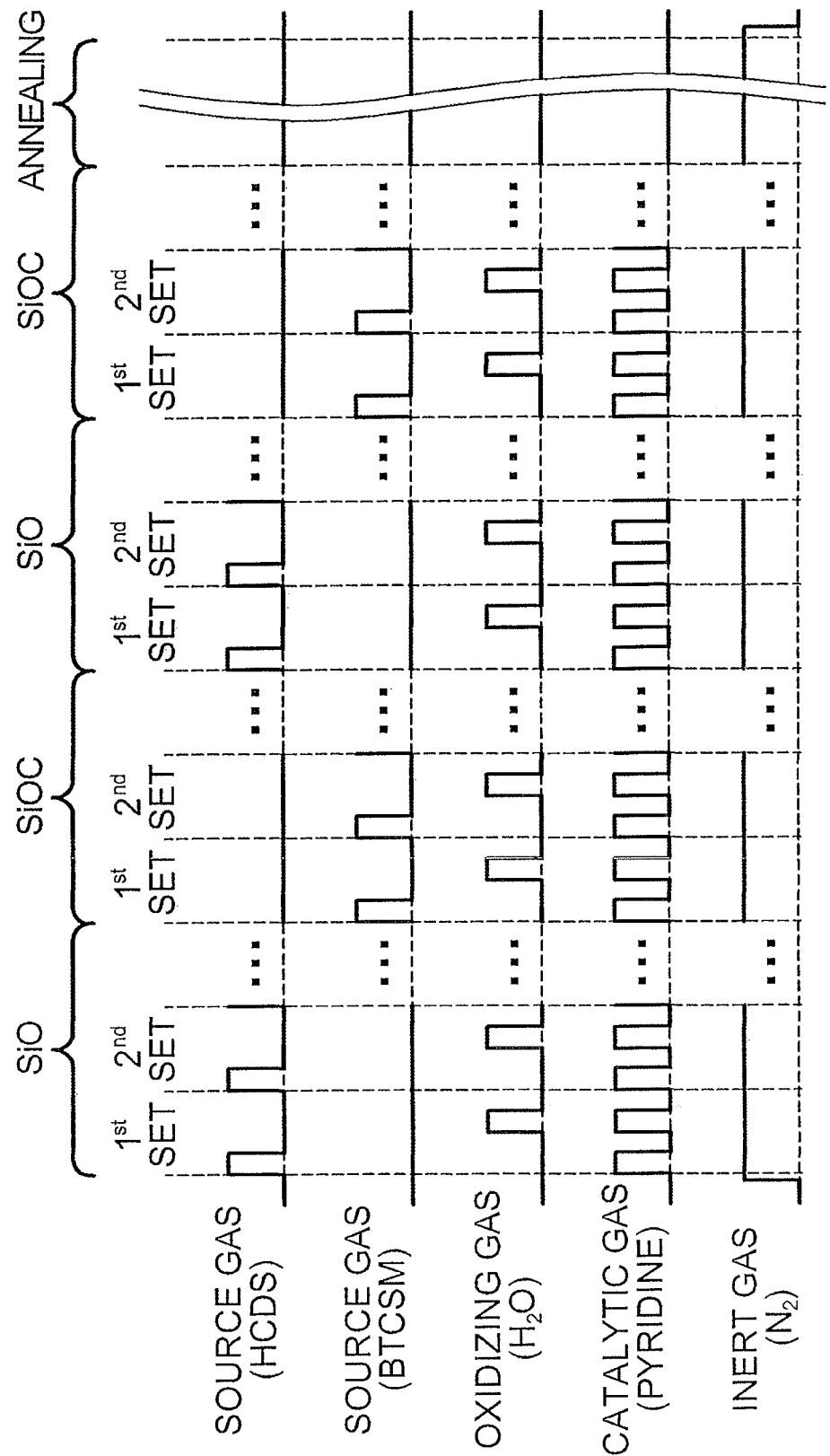

Also, as illustrated in FIG. 11B, a stacked film (a laminated film) on which a plurality of SiO films and a plurality of SiOC films are stacked may be formed by performing the cycle including the SiO film forming process and the SiOC film forming process multiple times. In FIG. 11B, an example in which the cycle including the SiO film forming process and the SiOC film forming process is performed twice is illustrated.

In any case, a set including steps S1*d* and S2*d* and a set including steps S1*e* and S2*e* may be included in the cycle the same number of times or a different number of times according to a desired film thickness ratio of the SiO film and the SiOC film. By alternately performing the sets the same number of times, the stacked film including the SiO film and the SiOC film of which the film thickness ratio is substantially the same may be formed. Also, by performing the sets a different number of times, the stacked film including the SiO film and the SiOC film of which the film thickness ratio is different may be formed.

(Stacked Film Modifying Process)

In the present embodiment, a large amount of the impurities such as moisture ($H_2O$) or Cl or the hydrocarbon-based impurities may be included in the stacked film of the SiO film and the SiOC film formed at a low temperature. Therefore, under the same sequence and process conditions as in the above-described embodiment, the impurities in the stacked film are removed by performing pressure adjusting, temperature adjusting, first thermal processing, second thermal processing, purging and restoring to atmospheric pressure, and the stacked film is modified. Thus, the stacked film having a higher etching resistance and a lower dielectric constant than the stacked film before the stacked film modifying process is performed is obtained.

Then, in the same sequence as in the above-described embodiment, the film forming processing of the present embodiment is completed by performing the boat unloading and the wafer discharging.

The same effects as in the above-described embodiment may be obtained by the present embodiment.

(2) Modification of the Present Embodiment

Figure 12:
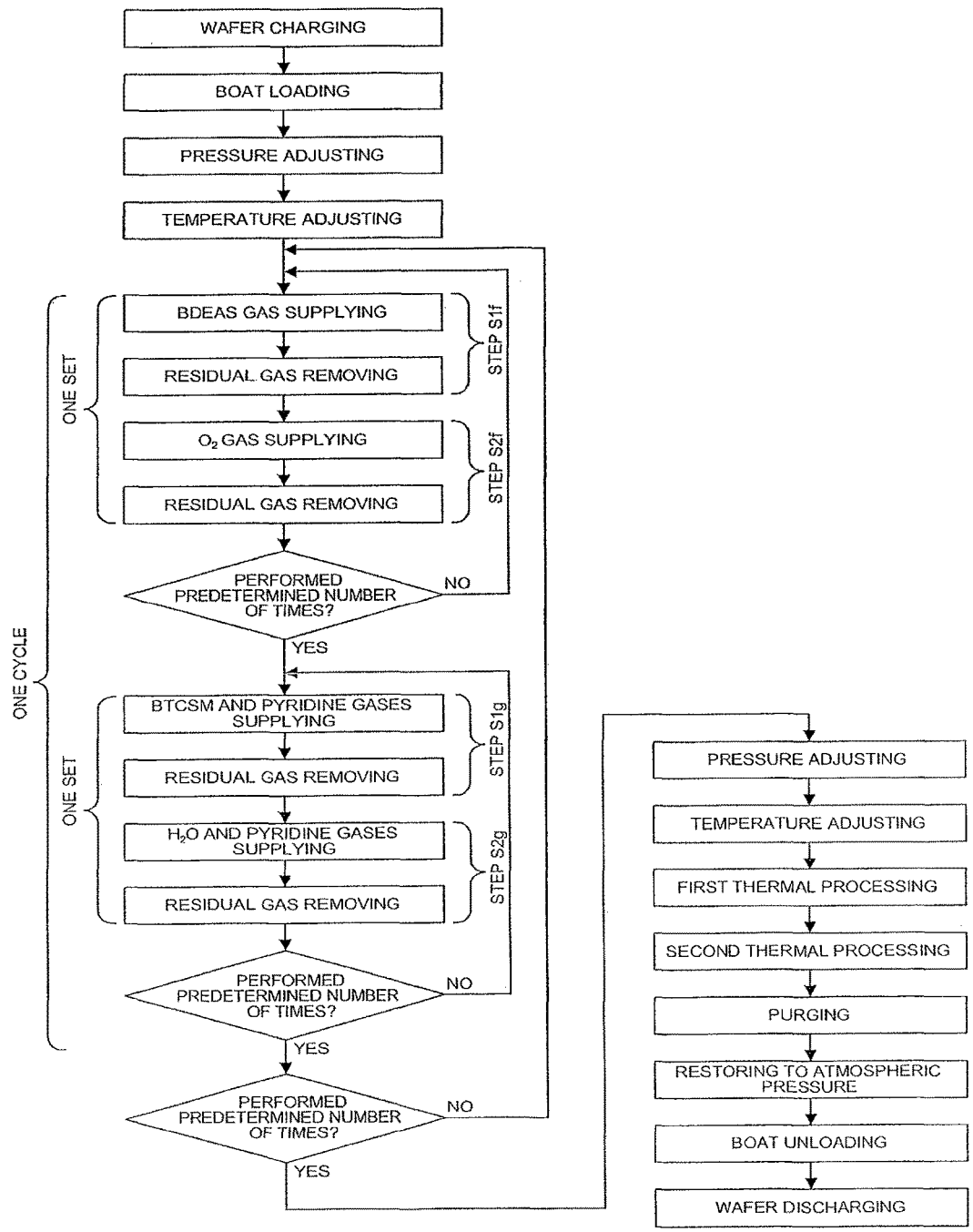
FIG. 12 is a flowchart illustrating a film-forming sequence according to a modification of the third embodiment of the present invention.

According to the present embodiment, the SiO film is formed using the HCDS gas and the $H_2O$ gas with the catalytic gas, and the stacked film of the SiO film of the SiOC film is formed. Hereinafter, a modification of the present embodiment in which the SiO film is formed using a different source gas and an oxidizing gas excited in a different plasma state without the catalytic gas, and the stacked film of the SiO film and the SiOC film is formed will be described with reference to FIGS. 12 and 13.

In the film-forming sequence of the present modification, an example of (a) forming a stacked film of an SiO film and an SiOC film on the wafer 200 by performing a cycle a predetermined number of times, where the cycle includes (a-1) a process of forming an SiO film which is a first thin film containing Si and O is performed by performing a set a predetermined number of times, where the set includes a process of supplying BDEAS gas serving as a source gas containing silicon (Si) serving as a predetermined element, carbon (C) and nitrogen (N) and having a chemical bond of the predetermined element and nitrogen (an Si—N bond) to the wafer 200 is performed in a state in which a process of supplying a pyridine gas which is a catalytic gas to the wafer 200 is performed (step S1*f*) and a process of supplying $O_2$ gas which is an oxidizing gas excited in a plasma state to the wafer 200 (step S2*f*); and (a-2) a process of forming an SiOC film which is a second thin film containing Si, O and C is performed by performing a set a predetermined number of times, where the set includes a process of supplying BTCSM gas which is a source gas containing silicon (Si), carbon (C) and a halogen element which is a predetermined element and having a chemical bond between the predetermined element and carbon (an Si—C bond) to the wafer 200 is performed in a state in which a process of supplying the pyridine gas which is a catalytic gas to the wafer 200 is performed (step S1*g*) and a process of supplying $H_2O$ gas which is an oxidizing gas to the wafer 200 is performed in a state in which a process of supplying the pyridine gas which is a catalytic gas to the wafer 200 is performed (step S2*g*), (b) removing a first impurity from the stacked film by subjecting the stacked film to thermal processing with a first temperature higher than the temperature of the wafer 200 in the process of forming the stacked film in oxygen-free atmosphere generated by supplying $N_2$ gas which is an oxygen-free gas to the wafer 200, and (c) removing a second impurity different from the first impurity from the stacked film after the thermal processing with the first temperature by subjecting the stacked film to the thermal processing with a second temperature not less than the first temperature in the oxygen-free atmosphere generated by supplying $N_2$ gas serving as an oxygen-free gas to the wafer 200 will be described.

(SiO Film Forming Process)

After wafer charging, boat loading, pressure adjusting and temperature adjusting are performed, the following two steps, S1f and S2f are sequentially performed.

[Step S1f] (BDEAS Gas Supplying)

BDEAS gas is supplied into the gas supply pipe 232f by opening the valve 243f. The BDEAS gas is supplied into the process chamber 201 through the gas supply holes 250a with a flow rate thereof being adjusted by the MFC 241f, and is exhausted through the exhaust pipe 231. In this case, the BDEAS gas is supplied to the wafer 200 (BDEAS gas supplying). At the same time, an inert gas such as $N_2$ gas and the like is supplied into the gas supply pipe 232j by opening the valve 243j. The $N_2$ gas is supplied into the process chamber 201 with the BDEAS gas with a flow rate thereof being adjusted by the MFC 241j, and is exhausted through the exhaust pipe 231.

Also, in order to prevent the BDEAS gas from being introduced into the buffer chamber 237 and the nozzles 249b and 249c, the $N_2$ gas is supplied into the gas supply pipes 232k and 232l by opening the valves 243k and 243l. The $N_2$ gas is supplied into the process chamber 201 through the gas supply pipes 232k and 232l, the nozzles 249b and 249c and the buffer chamber 237, and is exhausted through the exhaust pipe 231.

A silicon-containing layer that contains N and C and has a thickness of, for example, about less than one atomic layer to several atomic layers, is formed on the wafer 200 [a base film of the surface] as a first layer by supplying the BDEAS gas to the wafer 200 under the above-described conditions. The silicon-containing layer containing N and C may include one or both of an Si layer containing N and C and an adsorption layer of BDEAS gas Here, the Si layer containing N and C collectively refers to a continuous layer that is constituted by Si and contains N and C, a discontinuous layer or an Si thin film containing N and C formed by overlapping thereof. Also, the continuous layer that is constituted by Si and contains C and N may also be referred to as an Si thin film containing C and N. Also, the Si included in the Si layer containing N and C includes Si whose bond with N is not completely broken and Si whose bond with N is completely broken.

Here, the adsorption layer of BDEAS gas includes an adsorption layer in which gas molecules of BDEAS gas are discontinuous as well as an adsorption layer in which the gas molecules of BDEAS gas are continuous. That is, the adsorption layer of BDEAS gas includes an adsorption layer that is formed of the BDEAS molecules and has a thickness of one molecular layer or less than one molecular layer. Also, the BDEAS ($Si[N(C_2H_5)_2]_2H_2$) molecules constituting the adsorption layer of BDEAS gas may have molecules in which bonds between Si and N, Si and H and N and C are partially broken as well as the chemical formula illustrated in FIG. 14F. That is, the adsorption layer of BDEAS gas includes a chemical adsorption layer of BDEAS molecules or a physical adsorption layer of BDEAS molecules.

The BDEAS gas is easily adsorbed to the wafer 200 and is a gas having high decomposability or reactivity. Therefore, for example, the silicon-containing layer containing N and C may be formed on the wafer 200 by performing the reaction without using the catalytic gas such as the pyridine gas even at a relatively low temperature of 150° C. or less.

Also, in this case, process conditions such as the inner pressure of the process chamber 201, the flow rates of the supplied gases such as the source gas, the $N_2$ gas and the like, supply time and the temperature of the wafer 200 may be the same process conditions and ranges as in the above-described embodiment.

(Residual Gas Removing)

After the silicon-containing layer containing N and C which is the first layer is formed on the wafer 200, the supply of the BDEAS gas is stopped by closing the valve 243f. Also, in the same sequence as in the above-described embodiment, residual gas is removed from the process chamber 201.

[Step S2f] ($O_2$ Gas Supplying)

After step S1d is completed and the gas remaining in the process chamber 201 is removed, $O_2$ gas is supplied into the gas supply pipe 232h by opening the valve 243h. The $O_2$ gas is supplied into the buffer chamber 237 through the gas supply holes 250b with a flow rate thereof being adjusted by the MFC 241h. In this case, by applying radio frequency (RF) power between the first rod-shaped electrode 269 and the second rod-shaped electrode 270 from the high frequency power source 273 through the matching unit 272, the $O_2$ gas supplied into the buffer chamber 237 is supplied into the process chamber 201 through the plurality of gas supply holes 250d as an active species by being excited by plasma, and is exhausted through the exhaust pipe 231. In this case, the $O_2$ gas excited in a plasma state is supplied to the wafer 200 ($O_2$ gas supplying). At the same time, $N_2$ gas serving as an inert gas is supplied into the gas supply pipe 232k by opening the valve 243k. The $N_2$ gas is supplied into the process chamber 201 with the $O_2$ gas with a flow rate thereof being adjusted by the MFC 241k, and is exhausted through the exhaust pipe 231.

Also, in this case, in order to prevent the $O_2$ gas from being introduced into the nozzles 249a and 249c, the $N_2$ gas is supplied into the gas supply pipes 232j and 232l by opening the valve 243j and 243l. The $N_2$ gas is supplied into the process chamber 201 through the nozzles 249a and 249c, and is exhausted through the exhaust pipe 231.

Thus, it is possible to activate the $O_2$ gas without using the catalytic gas such as the pyridine gas even at the temperature in the process chamber 201, for example, at a relatively low temperature of 150° C. or less.

In this case, the gas flowing through the process chamber 201 is the $O_2$ gas excited in a plasma state, and includes an active species such as an oxygen radical (O*). Also, the BDEAS gas is not supplied into the process chamber 201. Therefore, the $O_2$ gas is supplied to the wafer 200 without causing a gas phase reaction and in an activated state, and the oxidation process is performed on the silicon-containing layer containing N and C formed on the wafer 200 in step S1f by the active species. Since an energy of the active species is higher than the binding energy of an Si—N bond and an Si—H bond included in the silicon-containing layer containing N and C, the Si—N bond and the Si—H bond included in the silicon-containing layer are separated by giving the energy of the active species to the silicon-containing layer containing N and C. N and H separated from the binding of Si, and C combined with N are removed from the silicon-containing layer containing N and C, and are exhausted as $N_2$, $H_2$, $CO_2$ and the like. Also, the bond of Si remaining by separating of the binding of N and H is combined to O included in the active species to form an Si—O bond. Thus, the silicon-containing layer containing N and C serving as the first layer is changed to a second layer containing Si and O, that is, an SiO layer.

Also, in this case, process conditions such as the inner pressure of the process chamber 201, the flow rates of the oxidizing gas and the $N_2$ gas, supply time and the temperature of the wafer 200 may be the same process conditions and ranges as in the above-described embodiment. The RF power applied between the first rod-shaped electrode 269 and the second rod-shaped electrode 270 from the high frequency power source 273 preferably ranges, for example, from 50 W to 1,000 W.

(Residual Gas Removing)

After the SiO layer which is a second layer is formed on the wafer 200, the supply of the $O_2$ gas is stopped by closing the valve 243h. Also, in the same sequence as in the above-described embodiment, the residual gas is removed from the process chamber 201.

(Performing a Predetermined Number of Times)

A SiO film having a predetermined composition and a predetermined film thickness may be formed on the wafer 200 by performing a set including the above-described steps S1f and S2f once or more (a predetermined number of times). Also, the above-described set is preferably repeated multiple times. That is, the thickness of the SiO layer formed when the cycle is performed once is set to be smaller than a desired film thickness, and the above-described set is preferably repeated multiple times to obtain the desired film thickness.

(SiOC Film Forming Process and Performing a Predetermined Number of Times)

The SiOC film forming process and the performing of each process a predetermined number of times may be performed in the same sequence and process conditions as in the above-described embodiment. That is, a stacked film of the SiO film and the SiOC film is formed on the wafer 200 by performing the SiOC film forming process in which a cycle including the SiO film forming process in which a set including steps S1f and S2f is performed a predetermined number of times and a set including steps S1g and S2g similarly to steps S1a and S2a of the above-described embodiment is performed a predetermined number of times once or more (a predetermined number of times).

Figure 13A:
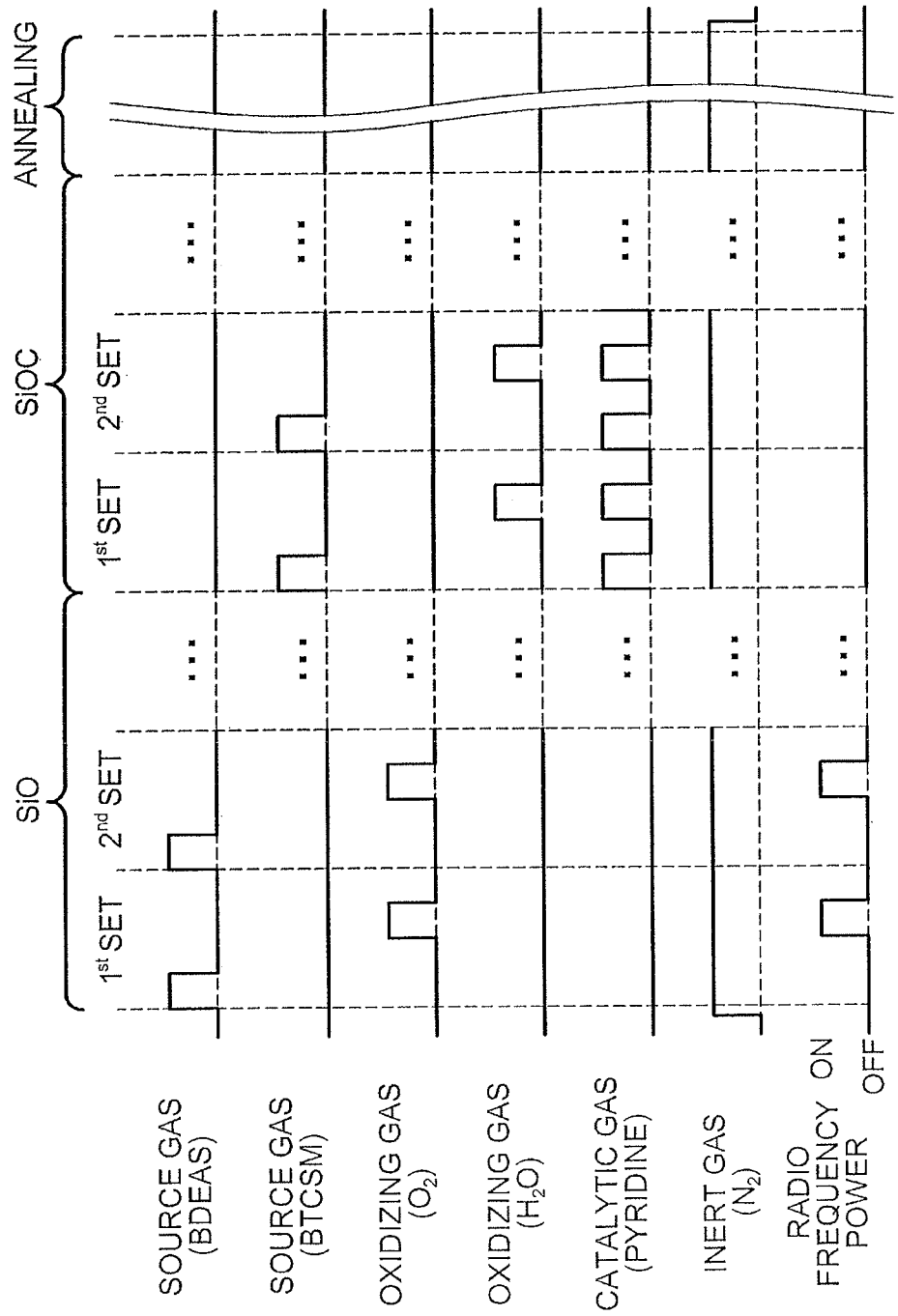
FIGS. 13A and 13B are diagrams illustrating gas supply timing and RF power timing in film-forming sequences according to the modification of the third embodiment of the present invention, where

As illustrated in FIG. 13A, a stacked film on which one SiO film and one SiOC film are stacked may be formed by performing the cycle including the SiO film forming process and the SiOC film forming process once.

Figure 13B:
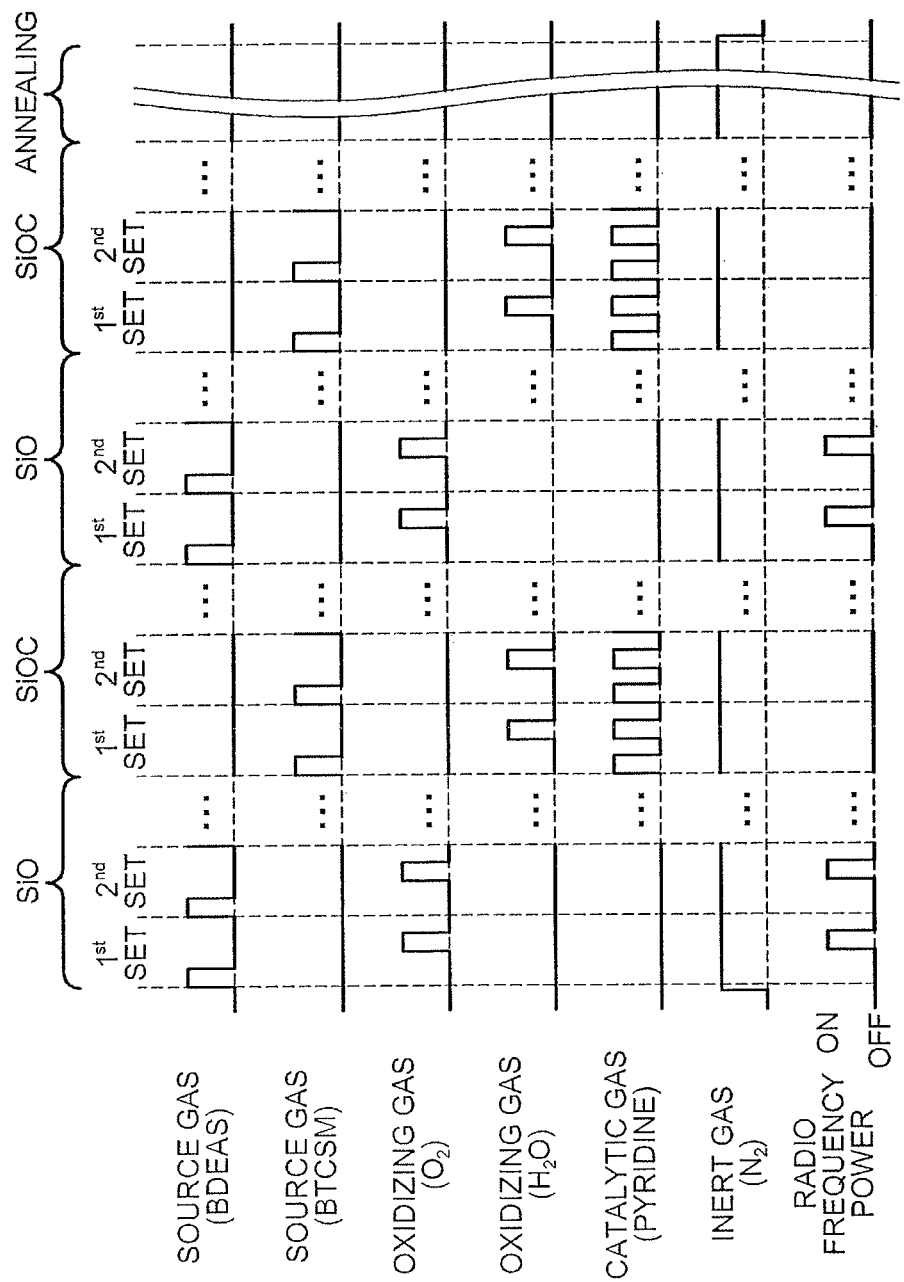

Also, as illustrated in FIG. 13B, a stacked film (a laminated film) on which a plurality of SiO films and a plurality of SiOC films are stacked may be formed by performing the cycle including the SiO film forming process and the SiOC film forming process multiple times. FIG. 13B illustrates an example in which the cycle including the SiO film forming process and the SiOC film forming process is performed twice.

In the present modification, a beginning sequence, a number of sets and the like of the set including step S1f, step S2f, step S1g and step S2g may be arbitrarily determined according to a desired film thickness ratio of the SiO film and the SiOC film.

(Stacked Film Modifying Process)

According to the present modification, a large amount of the impurities such as moisture ($H_2O$) or Cl or the hydrocarbon-based impurities may be included in the stacked film of the SiO film and the SiOC film formed at a low temperature. Therefore, under the same sequence and process conditions as in the above-described embodiment, the impurities in the stacked film are removed by performing pressure adjusting, temperature adjusting, first thermal processing, second thermal processing, purging and restoring to atmospheric pressure, and the stacked film is modified. Thus, the stacked film having a higher etching resistance and a lower dielectric constant than the stacked film before the stacked film modifying process is performed is obtained.

Then, in the same sequence as in the above-described embodiment, the film forming processing of the present embodiment is completed by performing boat unloading and wafer discharging.

As described above, the same effects as in the above-described embodiment may be obtained by the present modification.

Other Embodiments

While the embodiments of the present invention have been specifically described above, the present invention is not limited to the above-described embodiments, but may be variously modified without departing from the scope of the invention.

For example, in the above-described embodiment, although all the inert gas, the purge gas and the oxygen-free gas are supplied through the same supply system, all or at least one of the inert gas supply system, the purge gas supply system and the oxygen-free gas supply system may be installed as a separate supply system. However, when the oxygen-free atmosphere is generated in the process chamber 201 by only the exhaust system, there is no need to install the oxygen-free gas supply system.

Also, according to the above-described embodiment, when the catalytic gas is used with the source gas, the example in which the silicon-containing layer is changed to the SiOC layer or the SiO layer using the oxidizing gas such as $H_2O$ gas with the catalytic gas in step S2a, step S2b, step S2d, step S2e and step S2g is described. However, when the catalytic gas is used with the source gas, the silicon-containing layer may be changed to the SiOC layer or the SiO layer using the oxidizing gas such as $O_2$ gas excited by plasma. In this case, the process conditions may be, for example, the same as those in the above-described embodiment or the process conditions of the modification.

Also, according to the above-described embodiment, the silicon-based thin film (the Si-based thin film) such as the SiOC film, the SiO film or the like is formed using the oxidizing gas such as $H_2O$ gas, but the present invention is not limited thereto. For example, an Si-based thin film such as an SiCN film may be formed by nitriding the silicon-containing layer containing C and Cl using a nitriding gas containing nitrogen (N) instead of the oxidizing gas. Alternatively, an Si-based thin film such as an SiON film or an SiOCN film may be formed by appropriately combining the oxidizing gas or the nitriding gas. The nitriding gas may include, for example, ammonia ($NH_3$) gas, diazene ($N_2H_2$) gas, hydrazine ($N_2H_4$) gas, $N_3H_8$ gas and a gas containing a compound thereof. In this case, the process conditions may be, for example, the same as the process conditions of the above-described embodiment.

Also, according to the above-described embodiment, as the source gas used for forming the SiOC film or the SiO film, a chlorosilane-based source gas is used, however, in addition to the chlorosilane-based source gas, a halosilane-based source gas, for example, a fluorosilane-based source gas, a bromosilane-based source gas and the like may be used. Here, the fluorosilane-based source gas is a silane-based source gas containing a fluoride group which is a halogen group and is a source gas containing at least silicon (Si) and fluorine (F). Also, the bromosilane-based source gas is a silane-based source gas containing a bromo group which is a halogen group and is a source gas containing at least silicon (Si) and bromine (Br). In this case, the process conditions may be, for example, the same as the process conditions of the above-described embodiment.

With the miniaturization of transistors, requirements such as low temperature film forming, a low dielectric constant, a low WER and the like with respect to a thin film such as an oxide film constituting a sidewall spacer (SWS) used as a peripheral structure of a gate electrode are being increased. Also, in a manufacturing process of a memory device such as a ReRAM or an MRAM developed as a next-generation memory, a thin film which surrounds the memory device is used as a protective film such as an etching stopper. A thin film formed in the process should be formed, for example, at a low temperature of 350° C. or less in the ReRAM, and 250° C. or less in the MRAM. Preferably, with respect to such a requirement, the present invention may be applied to the formation of a thin film such as a silicon-based thin film (an SiOC film, an SiOCN film and an SiCN film) using a source gas containing silicon, carbon and a halogen element and having an Si—C bond, an oxidizing gas and the like.

As the silicon-based thin film formed by the technique of the above-described embodiments and the modifications is used as an SWS, it is possible to provide a device forming technique having a low leakage current and excellent workability.

Also, as the silicon-based thin film formed by the technique of the above-described embodiments and the modifications is used as an etching stopper, it is possible to provide a device forming technique having excellent workability.

According to the above-described embodiments and the modifications, the silicon-based thin film having an ideal stoichiometric ratio may be formed without using plasma at a low temperature when the catalytic gas is used. Also, since the silicon-based thin film is formed without using the plasma, it may be applied to a process that concerns plasma damage such as an SADP film of DPT and the like.

Also, according to the above-described embodiment, the silicon-based thin film (an SiO film, an SiOC film, an SiCN film, an SiON film and an SiOCN film) containing Si which is a semiconductor element is formed, but the present invention is not limited thereto. For example, the present invention may be applied to the case in which a metal-based thin film containing a metal element such as titanium (Ti), zirconium (Zr), hafnium (Hf), tantalum (Ta), aluminum (Al) and molybdenum (Mo) is formed.

Preferably, the present invention may be applied to the case in which a metal oxide film such as a titanium oxide film (a TiO film), a zirconium oxide film (a ZrO film), a hafnium oxide film (a HfO film), a tantalum oxide film (a TaO film), an aluminum oxide film (an AlO film) and a molybdenum oxide film (a MoO film) is formed.

Also, preferably, the present invention may be applied to the case in which a metal oxycarbide film such as a titanium oxycarbide film (a TiOC film), a zirconium oxycarbide film (a ZrOC film), a hafnium oxycarbide film (a HfOC film), a tantalum oxycarbide film (a TaOC film), an aluminum oxycarbide film (an AlOC film) and a molybdenum oxycarbide film (a MoOC film) is formed.

Preferably, the present invention may be applied to the case in which a metal carbonitride film such as a titanium carbonitride film (a TiCN film), a zirconium carbonitride film (a ZrCN film), a hafnium carbonitride film (a HfCN film), a tantalum carbonitride film (a TaCN film), an aluminum carbonitride film (an AlCN film) and a molybdenum carbonitride film (a MoCN film) is formed.

Preferably, the present invention may be applied to the case in which a metal oxynitride film such as a titanium oxynitride film (a TiON film), a zirconium oxynitride film (a ZrON film), a hafnium oxynitride film (a HfON film), a tantalum oxynitride film (a TaON film), an aluminum oxynitride film (an AlON film) and a molybdenum oxynitride film (a MoON film) is formed.

Preferably, the present invention may be applied to the case in which a metal oxycarbonitride film such as a titanium oxycarbonitride film (a TiOCN film), a zirconium oxycarbonitride film (a ZrOCN film), a hafnium oxycarbonitride film (a HfOCN film), a tantalum oxycarbonitride film (a TaOCN film), an aluminum oxycarbonitride film (an AlOCN film) and a molybdenum oxycarbonitride film (a MoOCN film) is formed.

In this case, a film may be formed by the same sequence as in the above-described embodiment using a source gas containing a metal element instead of a source gas containing silicon serving as a source gas used in the above-described embodiment.

For example, in the case in which a metal-based thin film containing Ti (a TiO film, a TiOC film, a TiCN film, a TiON film and a TiOCN film) is formed, a source gas containing Ti, C and the halogen element and having a Ti—C bond or a source gas containing Ti and the halogen element may be used as a source gas containing Ti. A source gas containing Ti and a chloro group such as titanium tetrachloride ($TiCl_4$), or a source gas containing Ti and a fluoride group such as titanium tetrafluoride ($TiF_4$) may be used as a source gas containing Ti and a halogen element. The same gas as in the above-described embodiment may be used as an oxidizing gas, a nitriding gas, an amine-based catalytic gas or an oxygen-free gas. In this case, the process conditions may be the same as the process conditions of the above-described embodiment.

Also, for example, in the case in which a metal-based thin film containing Zr (a ZrO film, a ZrOC film, a ZrCN film, a ZrON film and a ZrOCN film) is formed, a source gas containing Zr, C and a halogen element and having a Zr—C bond or a source gas containing Zr and the halogen element may be used as a source gas containing Zr. A source gas containing Zr and a chloro group such as zirconium tetrachloride ($ZrCl_4$) or a source gas containing Zr and a fluoride group such as zirconium tetrafluoride ($ZrF_4$) may be used as a source gas containing Zr and a halogen element. The same gas as in the above-described embodiment may be used as an oxidizing gas, a nitriding gas, an amine-based catalytic gas or an oxygen-free gas. In this case, the process conditions may be the same as the process conditions of the above-described embodiment.

Also, for example, in the case in which a metal-based thin film containing Hf (a HfO film, a HfOC film, a HfCN film, a HfON film and a HfOCN film) is formed, a source gas containing Hf, C and a halogen element and having a Hf—C bond or a source gas containing Hf and a halogen element may be used as a source gas containing Hf. A source gas containing Hf and a chloro group such as hafnium tetrachloride ($HfCl_4$) or a source gas containing Hf and a fluoride group such as hafnium tetrafluoride ($HfF_4$) may be used as a source gas containing Hf and a halogen element. The same gas as in the above-described embodiment may be used as an oxidizing gas, a nitriding gas, an amine-based catalytic gas or an oxygen-free gas. In this case, the process conditions may be the same as the process conditions of the above-described embodiment.

Also, for example, in the case in which a metal-based thin film containing Ta (a TaO film, a TaOC film, a TaCN film, a TaON film and a TaOCN film) is formed, a source gas containing Ta, C and a halogen element and having a Ta—C bond or a source gas containing Ta and a halogen element may be used as a source gas containing Ta. A source gas containing Ta and a chloro group such as tantalum pentachloride ($TaCl_5$) or a source gas containing Ta and a fluoride group such as tantalum pentafluoride ($TaF_5$) may be used as a source gas containing Ta and a halogen element. The same gas as in the above-described embodiment may be used as an oxidizing gas, a nitriding gas, an amine-based catalytic gas or an oxygen-free gas. In this case, the process conditions may be the same as the process conditions of the above-described embodiment.

Also, for example, the case in which a metal-based thin film containing Al (an AlO film, an AlOC film, an AlCN film, an AlON film and an AlOCN film) is formed, a source gas containing Al, C and a halogen element and having an Al—C bond or a source gas containing Al and a halogen element may be used as a source gas containing Al. A source gas containing Al and a chloro group such as aluminum trichloride ($AlCl_3$) or a source gas containing Al and a fluoride group such as aluminum trifluoride ($AlF_3$) may be used as a source gas containing Al and a halogen element. The same gas as in the above-described embodiment may be used as an oxidizing gas, a nitriding gas, an amine-based catalytic gas or an oxygen-free gas. In this case, the process conditions may be the same as the process conditions of the above-described embodiment.

Also, for example, in the case in which a metal-based thin film containing Mo (a MoO film a MoOC film, a MoON film and a MoOCN film) is formed, a source gas containing Mo, C and a halogen element and having a Mo—C bond or a source gas containing Mo and a halogen element may be used as a source gas containing Mo. A source gas containing Mo and a chloro group such as molybdenum pentachloride ($MoCl_5$) or a source gas containing Mo and a fluoride group such as molybdenum pentafluoride ($MoF_5$) may be used as a source gas containing Mo and a halogen element. The same gas as in the above-described embodiment may be used as an oxidizing gas, a nitriding gas, an amine-based catalytic gas or an oxygen-free gas. In this case, the process conditions may be the same as the process conditions of the above-described embodiment.

That is, and preferably, the present invention may be applied to the case of forming a thin film containing a semiconductor element or a predetermined element such as a metal element.

Also, the process recipe (a program in which processing sequences or processing conditions are described) used in the formation of various thin films may preferably be separately prepared (a plurality of recipes) according to content of substrate processing (a film type, a composition ratio, film quality, a film thickness, and the like of a thin film to be formed). Then, when the substrate processing starts, an appropriate process recipe is preferably selected among the plurality of process recipes according to content of the substrate processing. Specifically, the plurality of process recipes separately prepared according to content of the substrate processing are preferably stored (installed) in advance in the memory device 121c provided in the substrate processing apparatus through telecommunication line or the non-transitory computer-readable recording medium [the external memory device 123] recording the process recipe. Then, when the substrate processing starts, the CPU 121a provided in the substrate processing apparatus preferably appropriately selects an appropriate process recipe according to content of the substrate processing from among the plurality of process recipes stored in the memory device 121c. In such a configuration, it is possible to generally and repeatedly form the thin film having various film types, composition ratios, film qualities, and film thicknesses using a single substrate processing apparatus. Also, it is possible to decrease an operation load (such as a load for inputting processing sequences or processing conditions) of an operator, thereby preventing operation errors and quickly starting the substrate processing.

In addition to creating a new process recipe, the above-described process recipe may be used by, for example, changing an existing process recipe that is previously installed in the substrate processing apparatus. When the process recipe is changed, the changed process recipe may be installed in the substrate processing apparatus through the telecommunication line or the non-transitory computer-readable recording medium recording the process recipe. Also, by manipulating the I/O device 122 provided in the substrate processing apparatus, the existing process recipe that is previously installed in the substrate processing apparatus may be directly changed.

Also, in the film-forming sequence of the above-described embodiment, the formation of the SiOC film, the SiO film, the stacked film and the like is performed at room temperature, and however, in this case, there is no need to heat the inside of the process chamber 201 by the heater 207, and the heater may not be installed in the substrate processing apparatus. Thus, a heating system of the substrate processing apparatus may be simplified, and thus the substrate processing apparatus may be provided to have a more inexpensive and simple structure. In this case, the modifying processes of the SiOC film, the SiO film and the stacked film are performed in a different process chamber from the process chamber in which the forming processes of the SiOC film, the SiO film and the stacked film are performed ex-situ.

Also, according to the above-described embodiment, the thin film is formed using the batch-type substrate processing apparatus that processes the plurality of substrates at once. However, the present invention is not limited to the above-described embodiment, but may be applied thereto when the thin film is formed using a single substrate processing apparatus that processes one or several substrates at once. Also, according to the above-described embodiment, the thin film is formed using the substrate processing apparatus including a hot wall-type processing furnace. However, the present invention is not limited to the above-described embodiment, but may be applied when the thin film is formed using a substrate processing apparatus including a cold wall-type processing furnace. In this case, the process conditions may be the same as the process conditions of the above-described embodiment.

Also, each embodiment and each modification described above may be appropriately combined and used. Also, in this case, the process conditions may be the same as the process conditions of the above-described embodiment.

EMBODIMENTS

First Embodiment

According to the embodiment of the present invention, the SiOC film is formed on the wafer by the film-forming sequence according to the above-described embodiment illustrated in FIGS. 7A and 7B using the substrate processing apparatus of the above-described embodiment, and various characteristics of the SiOC film are evaluated by performing the modifying process on the SiOC film. As the modifying process of the SiOC film, the second thermal processing is performed only without performing the first thermal processing. In this case, BTCSM gas is used as a source gas, H₂O gas is used as an oxidizing gas, a pyridine gas is used as a catalytic gas, and N₂ gas is used as a thermal processing gas when performing the modifying process of the SiOC film. The process conditions are the same as the process conditions in the above-described embodiment.

Figure 16A:
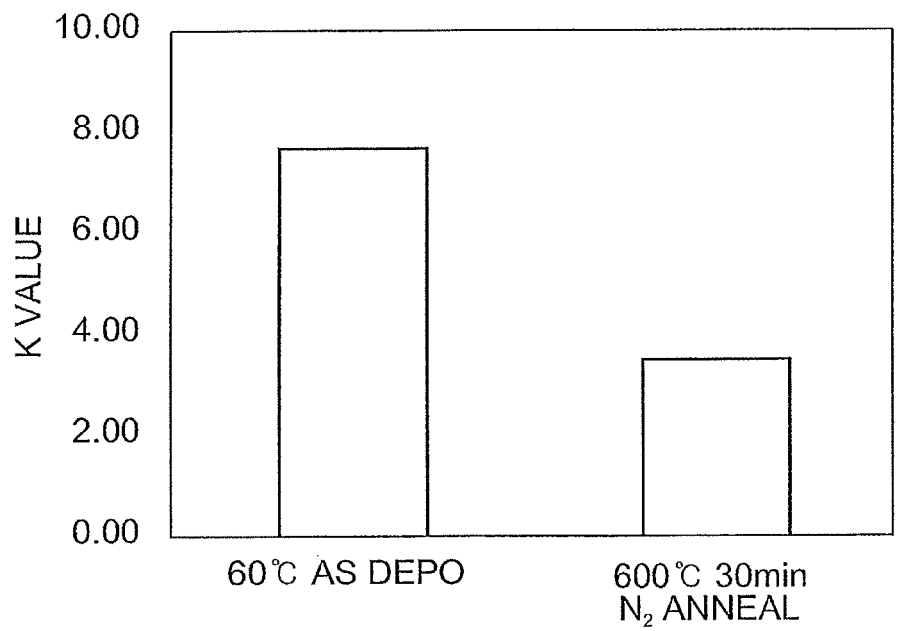
FIGS. 16A through 16C are graphs according to embodiments of the present invention, where
Figure 16B:
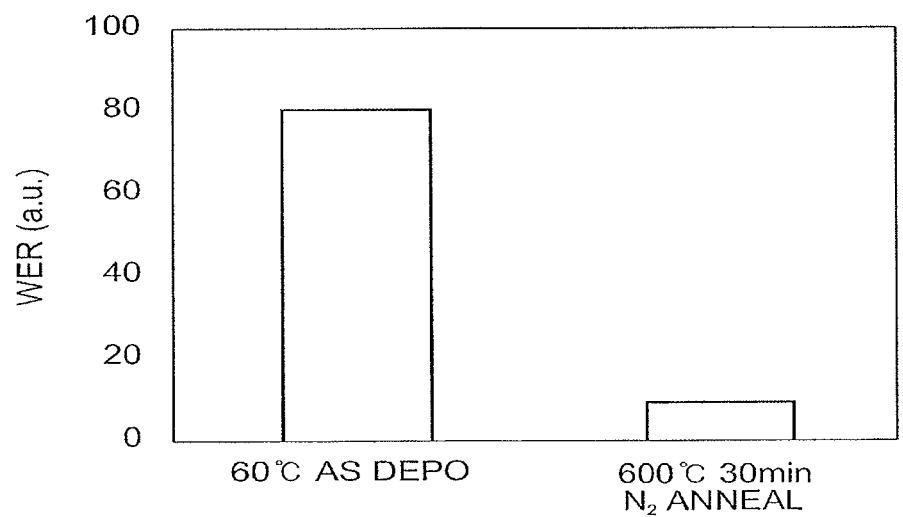
Figure 16C:
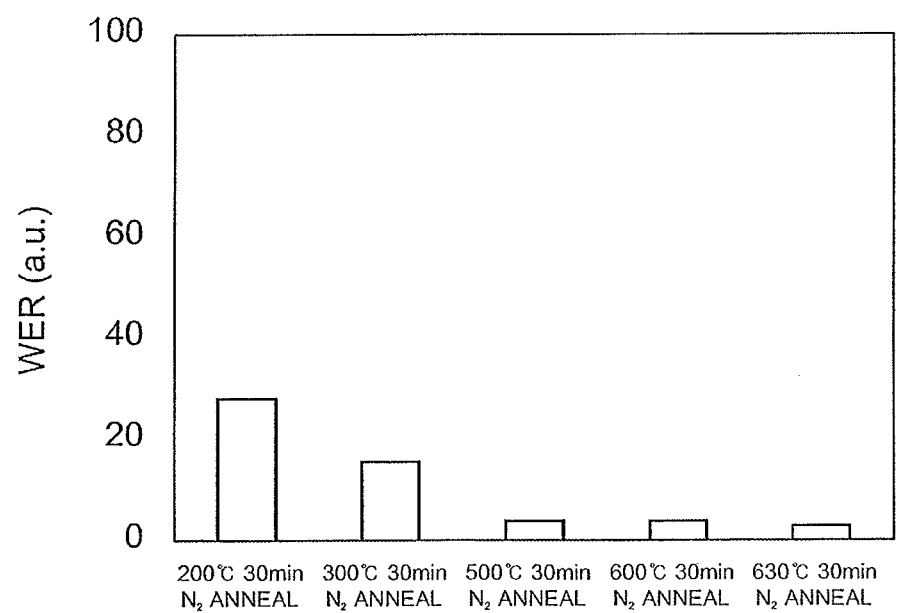

FIGS. 16A through 16C are graphs illustrating evaluation results of the present embodiment, where FIG. 16A is a graph illustrating a relative dielectric constant of a SiOC film before and after thermal processing, FIG. 16B is a graph illustrating a wet etching rate (WER) of the SiOC film before and after thermal processing, and FIG. 16C is a graph illustrating temperature dependence of the thermal processing of the WER of the SiOC film.

A horizontal axis of the graph in FIG. 16A represents a processing state of the SiOC film, and illustrates an example of the SiOC film without thermal processing in which the temperature of the wafer is set to 60° C. (60° C., as depo), and an example of the SiOC film with thermal processing for 30 minutes in which the temperature of the wafer is set to 600° C. in an N₂ gas atmosphere in which the temperature of the wafer is set to 60° C. (600° C., 30 min, N₂ and anneal) in order from left. Also, a vertical axis of the graph represents a relative dielectric constant of the SiOC film (the k value). The relative dielectric constant of the SiOC film is a ratio (∈r=∈/∈0) of a dielectric constant of ∈ of the SiOC film with respect to a dielectric constant of ∈0 of vacuum.

As illustrated in FIG. 16A, the relative dielectric constant of the SiOC film before the thermal processing according to the present embodiment is 7.76. Also, according to the evaluation of the inventors, the relative dielectric constant of the SiOC film at a relatively high temperature is about 4.5. The relative dielectric constant of the SiOC film before the thermal processing according to the present embodiment is greater than 4.5. Since the relative dielectric constant of the SiOC film after the thermal processing according to the present embodiment is 3.58, a relative dielectric constant significantly smaller than the above-described relative dielectric constant of the SiOC film formed at the relatively high temperature (about 4.5) and a relative dielectric constant of a normal thermal oxide film (about 3.9) may be obtained. It is considered that a material which increases the dielectric constant such as the impurity such as moisture (H₂O) or Cl included in the SiOC film is removed from the SiOC film by subjecting the SiOC film to the thermal processing with a low temperature and the SiOC film is porous are the main factors of the above.

A horizontal axis of the graph in FIG. 16B represents "60° C., as depo" and "600° C., 30 min, N₂ and anneal" in order from left similar to FIG. 16A. Also, a vertical axis of the graph represents a WER [a.u.] by solution containing 1% concentration of hydrogen fluoride (a 1% HF aqueous solution) in the SiOC film. Here, the WER is an etching depth per unit hour.

It may be confirmed that the SiOC film before the thermal processing illustrated in FIG. 16B has relatively good etching resistance from the WER thereof. The inventors have confirmed that the WER of the SiOC film is lower than the WER of the SiO film formed at a low temperature in another evaluation. Also, as illustrated in FIG. 16B, it may be seen that the WER of the SiOC film after the thermal processing is ⅛ or less the WER of the SiOC film before the thermal processing. It may be seen that the higher etching resistance, in which the SiOC film of which the WER is lower than that of the normal thermal oxide film and is higher than that of the SiOC film after the thermal processing, is obtained. Thus, it may be seen that the etching resistance is further improved by reducing the impurities in the SiOC film by the thermal processing of the SiOC film.

A horizontal axis of the graph in FIG. 16C illustrates temperatures in which the temperature of the wafer is 60° C. and the thermal processing is performed on the SiOC film in an N₂ atmosphere for 30 minutes, and represents 200° C., 300° C., 500° C., 600° C. and 630° C. in order from left. Also, similar to FIG. 16B, a vertical axis of the graph represents a WER [a.u.] by solution containing 1% concentration of hydrogen fluoride (a 1% HF aqueous solution) in the SiOC film.

As illustrated in FIG. 16C, when the thermal processing temperature is 200° C., it may be confirmed that predetermined effects by the modifying process are obtained from the WER thereof. Also, as illustrated in FIG. 16C, when the thermal processing temperature is 300° C., it may be seen that the WER is about half thereof and better results are obtained compared to the case in which the thermal processing temperature is 200° C. Also, when the thermal processing temperature is 500° C., it may be seen that the WER is significantly reduced and comparable results are obtained compared to the case in which the thermal processing temperature is higher than 500° C., that is, 600° C. and 630° C. It may be seen that all of the WERs when the thermal processing temperatures are 500° C., 600° C. and 630° C. are about one-tenth or less of the WER when the thermal processing temperatures is 200° C. Thus, when the thermal processing temperature is at least 500° C., it may be seen that more remarkable effects that improve the etching resistance are obtained. Also, a degree of the reduction of the WER is decreased at the thermal processing temperature of 500° C. or more, and the WER is further decreased at a temperature of 630° C. The WER at a temperature of 630° C. is about 70% of the WER at a temperature of 500° C. Therefore, it may be predicted that the higher etching resistance is obtained by increasing the temperature to 630° C. or more. Thus, it may be seen that an effect of reducing the WER of the SiOC film is further improved by increasing the thermal processing temperature.

Second Embodiment

According to the embodiment of the present invention, the SiOC film is formed on the wafer using the substrate processing apparatus of the above-described embodiment by the film-forming sequence according to the above-described embodiment illustrated in FIGS. 7A and 7B, and the SiOC film modifying processing is performed. A sample (a first sample) in which both of the first thermal processing and the second thermal processing are performed and a sample (a second sample) in which the first thermal processing is not performed and the second thermal processing is performed are prepared by the SiOC film modifying process. Then, various characteristics of the SiOC film of each sample are evaluated. BTCSM gas is used as a source gas, H₂O gas is used as an oxidizing gas, a pyridine gas is used as a catalytic gas, and N₂ gas is used as a thermal processing gas during the SiOC film modifying process. When the SiOC film of the first sample is formed, the temperature of the wafer (a first temperature) in the first thermal processing is set to 450° C., and the temperature of the wafer (a second temperature) in the second thermal processing is set to 600° C. When the SiOC film of the second sample is formed, the temperature of the wafer (the second temperature) in the second thermal processing is set to 600° C. The other process conditions may be the same as the process conditions of the above-described embodiment.

FIG. 18 is a diagram illustrating evaluation results of the present embodiment, and is a summary table of various characteristics of an SiOC film of a first sample and an SiOC film of a second sample [WER, shrinkage and relative dielectric constant (k value)].

As illustrated in FIG. 18, as the WER of the SiOC film of the first sample is 1/17 or less of the WER of the SiOC film of the second sample, it may be seen that the WER of the SiOC film of the first sample is significantly lower than the WER of the SiOC film of the second sample. Also, it may be seen that the WER of the SiOC film of the second sample is relatively low and the SiOC film of the second sample has relatively good etching resistance. That is, it may be seen that the WER of the SiOC film of the first sample is lower than the WER of the SiOC film of the second sample and the SiOC film of the first sample has the higher etching resistance than that of the SiOC film of the second sample. It is considered that while the impurity such as moisture ($H_2O$) or Cl included in the SiOC film is removed from the SiOC film by the second thermal processing in the case of the SiOC film of the second sample, the hydrocarbon-based impurity as well as the impurity such as moisture ($H_2O$) or Cl included in the SiOC film are sufficiently removed from the SiOC film by sequentially subjecting the SiOC film to the first thermal processing and the second thermal processing in the case of the SiOC film of the first sample.

Also, as illustrated in FIG. 18, it may be seen that the shrinkage of the SiOC film of the first sample is about 9/10 of the shrinkage of the SiOC film of the second sample, and the shrinkage of the SiOC film of the first sample is smaller than the shrinkage of the SiOC film of the second sample. Also, the shrinkage represents a ratio of the SiOC film after the modifying process with respect to the SiOC film before the modifying process, that is, a ratio of the SiOC film shrunk by the modifying process. That is, it may be seen that the SiOC film of the first sample is less shrunk than the SiOC film of the second sample by the modifying process. In other words, it may be seen that the SiOC film of the second sample is more shrunk than the SiOC film of the first sample by the modifying process.

It is considered that since the oxidation of the SiOC film by desorbing moisture from the SiOC film or Cl may be suppressed by sequentially subjecting the SiOC film of the first sample to the first thermal processing and the second thermal processing, that is, by subjecting the SiOC film to thermal processing having different temperatures in two steps, the shrinkage of the SiOC film of the first sample is small. Also, it is considered that since the SiOC film is oxidized by moisture desorbed from the SiOC film or Cl by subjecting the SiOC film of the second sample to the second thermal processing, that is, by subjecting the SiOC film to thermal processing at a relatively high temperature in one step and the SiOC film is easily shrunk, the shrinkage of the SiOC film of the second sample is large.

Also, as illustrated in FIG. 18, since the relative dielectric constant of the SiOC film of the first sample is 2.68, and the relative dielectric constant of the SiOC film of the second sample is 3.58, it may be seen that the relative dielectric constant of the SiOC film of the first sample is smaller than the relative dielectric constant of the SiOC film of the second sample. Also, it may be seen that the relative dielectric constant of the SiOC film of the second sample (3.58) is significantly lower than the relative dielectric constant of the normal thermal oxide film (about 3.9), and the relative dielectric constant of the SiOC film of the first sample (2.68) is lower than the relative dielectric constant of the SiOC film of the second sample.

It is considered that the main factors in the relative dielectric constant of the SiOC film of the second sample being significantly lower than the relative dielectric constant of the normal thermal oxide film are that a material which increases the dielectric constant such as the impurity such as moisture ($H_2O$) or Cl included in the SiOC film is removed from the SiOC film by subjecting the SiOC film to the second thermal processing and that the SiOC film is porous. It is considered that the main factors in the relative dielectric constant of the SiOC film of the first sample significantly lower than the relative dielectric constant of the normal thermal oxide film and the relative dielectric constant of the SiOC film of the second sample are that a material which increases the dielectric constant such as the hydrocarbon-based impurity as well as the impurity such as moisture ($H_2O$) or Cl included in the SiOC film is removed from the SiOC film by sequentially subjecting the SiOC film to the first thermal processing and the second thermal processing, that is, by sequentially subjecting the SiOC film to the thermal processing by changing the temperature and that the SiOC film is porous.

INDUSTRIAL APPLICABILITY

The method of manufacturing the semiconductor device, the substrate processing apparatus, the substrate processing system and the non-transitory computer-readable recording medium according to the present invention may be used in the field of manufacturing semiconductor devices.

What is claimed is:
1. A method of manufacturing a semiconductor device, comprising:
   (a) forming a thin film containing a predetermined element, oxygen and carbon on a substrate by performing a cycle a predetermined number of times, the cycle including: (a-1) supplying to the substrate a source gas containing the predetermined element, carbon and a halogen element, the source gas having a chemical bond between the predetermined element and carbon; (a-2) supplying an oxidizing gas to the substrate; and (a-3) supplying a catalytic gas free of oxygen to the substrate;
   (b) removing a first impurity containing $H_2O$ and chlorine from the thin film formed in (a) by thermally processing the thin film at a first temperature higher than a temperature of the substrate in (a); and
   (c) removing a second impurity different from the first impurity and containing a hydrocarbon compound from the thin film formed in (a) by thermally processing the thin film at a second temperature equal to or higher than the first temperature after performing (b).

2. The method of claim 1, wherein the first temperature is a temperature whereat the thin film is not oxidized by the first impurity when the first impurity is removed from the thin film in (b).

3. The method of claim 2, wherein the first temperature is a temperature whereat the first impurity does not react with other impurities contained in the thin film and different from the first impurity when the first impurity is removed from the thin film in (b).

4. The method of claim 2, wherein the first temperature is a temperature whereat the first impurity does not react with the second impurity contained in the thin film when the first impurity is removed from the thin film in (b).

5. The method of claim 2, wherein the first temperature ranges from 300° C. to 450° C.

6. The method of claim 5, wherein the second temperature ranges from 300° C. to 900° C.

7. The method of claim 6, wherein the temperature of the substrate in (a) ranges from room temperature to 150° C.

8. The method of claim 1, wherein the predetermined element includes silicon, and the source gas has at least one selected from a group consisting of Si—C bond, Si—C—Si bond and Si—C—C—Si bond.

9. The method of claim 1, wherein the source gas includes at least one selected from a group consisting of bis(trichlorosilyl)methane [$(SiCl_3)_2CH_2$] gas, 1,2-bis(trichlorosilyl)ethane [$(SiCl_3)_2C_2H_4$] gas, 1,1,2,2-tetrachloro-1,2-dimethyldisilane [$(CH_3)_2Si_2Cl_4$] gas and 1,2-dichloro-1,1,2,2-tetramethyldisilane [$(CH_3)_4Si_2Cl_2$] gas.

10. The method of claim 1, wherein the catalytic gas includes at least one selected from a group consisting of triethylamine [$(C_2H_5)_3N$] gas, diethylamine [$(C_2H_5)_2NH$] gas, monoethylamine ($C_2H_5NH_2$) gas, trimethylamine [$(CH_3)_3N$] gas, monomethylamine [$(CH_3)NH_2$] gas, pyridine ($C_5H_5N$) gas, aminopyridine ($C_5H_6N_2$) gas, picoline ($C_6H_7N$) gas, lutidine ($C_7H_9N$) gas, piperazine ($C_4H_{10}N_2$) gas and piperidine ($C_5H_{11}N$) gas.

11. The method of claim 1, wherein the oxidizing gas includes at least one selected from a group consisting of water vapor ($H_2O$ gas), ozone ($O_3$) gas, hydrogen peroxide ($H_2O_2$) gas, a mixture gas of hydrogen ($H_2$) gas and oxygen ($O_2$) gas, and a mixture gas of hydrogen ($H_2$) gas and ozone ($O_3$) gas.

12. The method of claim 1, wherein (b) and (c) are performed in oxygen-free atmosphere by supplying an oxygen-free gas to the substrate.

13. A non-transitory computer-readable recording medium storing a program that causes a computer to perform a process, the process comprising:
(a) forming a thin film containing a predetermined element, oxygen and carbon on a substrate by performing a cycle a predetermined number of times, the cycle including: (a-1) supplying to the substrate a source gas containing the predetermined element, carbon and a halogen element, the source gas having a chemical bond between the predetermined element and carbon; (a-2) supplying an oxidizing gas to the substrate; and (a-3) supplying a catalytic gas free of oxygen to the substrate;
(b) removing a first impurity containing $H_2O$ and chlorine from the thin film formed in (a) by thermally processing the thin film at a first temperature higher than a temperature of the substrate in (a); and
(c) removing a second impurity different from the first impurity and containing a hydrocarbon compound from the thin film formed in (a) by thermally processing the thin film at a second temperature equal to or higher than the first temperature after performing (b).

* * * * *